(12) United States Patent
Isobe et al.

(10) Patent No.: US 7,652,286 B2
(45) Date of Patent: Jan. 26, 2010

(54) SEMICONDUCTOR DEVICE AND SEMICONDUCTOR DEVICE PRODUCING SYSTEM

(75) Inventors: Atsuo Isobe, Atsugi (JP); Koji Dairiki, Atsugi (JP); Hiroshi Shibata, Higashine (JP); Chiho Kokubo, Atsugi (JP); Tatsuya Arao, Atsugi (JP); Masahiko Hayakawa, Atsugi (JP); Hidekazu Miyairi, Atsugi (JP); Akihisa Shimomura, Atsugi (JP); Koichiro Tanaka, Atsugi (JP); Shunpei Yamazaki, Setagaya (JP); Mai Akiba, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 30 days.

(21) Appl. No.: 11/529,392

(22) Filed: Sep. 29, 2006

(65) Prior Publication Data

US 2007/0034877 A1 Feb. 15, 2007

Related U.S. Application Data

(62) Division of application No. 10/330,024, filed on Dec. 27, 2002, now Pat. No. 7,115,903.

(30) Foreign Application Priority Data

Dec. 28, 2001 (JP) .............................. 2001-399038
Dec. 28, 2001 (JP) .............................. 2001-401518

(51) Int. Cl.
*H01L 29/76* (2006.01)

(52) U.S. Cl. .................... 257/59; 257/72; 257/E29.295
(58) Field of Classification Search .................. 257/59, 257/66, 72, E21.134, E21.415, E29.295
See application file for complete search history.

(56) References Cited

U.S. PATENT DOCUMENTS 4,330,363 A 5/1982 Biegesen et al.

(Continued)

FOREIGN PATENT DOCUMENTS

EP 1 049 144 11/2000

(Continued)

OTHER PUBLICATIONS

M.W. Geis et al., *Crystallographic Orientation of Silicon on an Amorphous Substrate Using an Artificial Surface-Relief Grating and Laser Crystallization*, Appl. Phys. Lett. 35(1), Jul. 1, 1979, pp. 71-74.

(Continued)

*Primary Examiner*—Thomas L Dickey
*Assistant Examiner*—Fazli Erdem
(74) *Attorney, Agent, or Firm*—Eric J. Robinson; Robinson Intellectual Property Law Office, P.C.

(57) ABSTRACT

An insulating film having depressions and projections are formed on a substrate. A semiconductor film is formed on the insulating film. Thus, for crystallization by using laser light, a part where stress concentrates is selectively formed in the semiconductor film. More specifically, stripe or rectangular depressions and projections are provided in the semiconductor film. Then, continuous-wave laser light is irradiated along the stripe depressions and projections formed in the semiconductor film or in a direction of a major axis or minor axis of the rectangle.

23 Claims, 47 Drawing Sheets

U.S. PATENT DOCUMENTS

| | | |
|---|---|---|
| 4,448,632 A | 5/1984 | Akasaka |
| 4,710,604 A | 12/1987 | Shirasu et al. |
| 5,097,297 A | 3/1992 | Nakazawa |
| 5,145,808 A | 9/1992 | Sameshima et al. |
| 5,163,220 A | 11/1992 | Zeto et al. |
| 5,578,897 A | 11/1996 | Nomura et al. |
| 5,589,406 A | 12/1996 | Kato et al. |
| 5,594,296 A | 1/1997 | Mitsutake et al. |
| 5,636,042 A | 6/1997 | Nakamura et al. |
| 5,643,826 A | 7/1997 | Ohtani et al. |
| 5,659,329 A | 8/1997 | Yamanobe et al. |
| 5,759,879 A | 6/1998 | Iwasaki |
| 5,776,803 A | 7/1998 | Young |
| 5,847,780 A | 12/1998 | Kim et al. |
| 5,851,862 A | 12/1998 | Ohtani et al. |
| 5,854,803 A | 12/1998 | Yamazaki et al. |
| 5,858,823 A | 1/1999 | Yamazaki et al. |
| 5,932,893 A | 8/1999 | Miyanaga et al. |
| 5,953,597 A | 9/1999 | Kusumoto et al. |
| 5,965,915 A | 10/1999 | Yamazaki et al. |
| 5,970,368 A | 10/1999 | Sasaki et al. |
| 5,981,974 A | 11/1999 | Makita |
| 5,986,306 A | 11/1999 | Nakajima et al. |
| 5,994,174 A | 11/1999 | Carey et al. |
| 6,133,583 A | 10/2000 | Ohtani et al. |
| 6,162,667 A | 12/2000 | Funai et al. |
| 6,184,559 B1 | 2/2001 | Hayakawa et al. |
| 6,210,996 B1 | 4/2001 | Yamazaki et al. |
| 6,283,813 B1 | 9/2001 | Kaneko et al. |
| 6,288,414 B1 | 9/2001 | Ahn |
| 6,291,320 B1 | 9/2001 | Yamazaki et al. |
| 6,307,214 B1 | 10/2001 | Ohtani et al. |
| 6,337,259 B1 | 1/2002 | Ueda et al. |
| 6,355,940 B1 | 3/2002 | Koga et al. |
| 6,365,933 B1 | 4/2002 | Yamazaki et al. |
| 6,372,562 B1 | 4/2002 | Matsumoto |
| 6,387,779 B1 | 5/2002 | Yi et al. |
| 6,388,386 B1 | 5/2002 | Kunii et al. |
| 6,410,368 B1 * | 6/2002 | Kawasaki et al. ........... 438/145 |
| 6,424,331 B1 | 7/2002 | Ozawa |
| 6,429,100 B2 | 8/2002 | Yoneda |
| 6,455,360 B1 | 9/2002 | Miyasaka |
| 6,472,684 B1 | 10/2002 | Yamazaki et al. |
| 6,475,840 B1 | 11/2002 | Miyanaga et al. |
| 6,482,721 B1 | 11/2002 | Lee |
| 6,528,397 B1 | 3/2003 | Taketomi et al. |
| 6,555,875 B2 | 4/2003 | Kawasaki et al. |
| 6,566,179 B2 | 5/2003 | Murley et al. |
| 6,583,440 B2 | 6/2003 | Yasukawa |
| 6,600,197 B1 | 7/2003 | Nakajima et al. |
| 6,602,744 B1 | 8/2003 | Ino et al. |
| 6,602,758 B2 | 8/2003 | Kizilyalli et al. |
| 6,632,696 B2 | 10/2003 | Kimura et al. |
| 6,632,711 B2 | 10/2003 | Sugano et al. |
| 6,653,212 B1 | 11/2003 | Yamanaka et al. |
| 6,667,188 B2 | 12/2003 | Tanabe |
| 6,674,136 B1 | 1/2004 | Ohtani |
| 6,693,257 B1 | 2/2004 | Tanaka |
| 6,693,258 B2 | 2/2004 | Sugano et al. |
| 6,700,133 B1 | 3/2004 | Ohtani et al. |
| 6,727,122 B2 | 4/2004 | Seo et al. |
| 6,759,628 B1 | 7/2004 | Ino et al. |
| 6,780,687 B2 | 8/2004 | Nakajima et al. |
| 6,812,491 B2 | 11/2004 | Kato et al. |
| 6,841,434 B2 | 1/2005 | Miyairi et al. |
| 6,841,797 B2 | 1/2005 | Isobe et al. |
| 6,847,050 B2 | 1/2005 | Yamazaki et al. |
| 6,861,614 B1 | 3/2005 | Tanabe et al. |
| 6,862,008 B2 | 3/2005 | Yamazaki et al. |
| 6,875,998 B2 | 4/2005 | Kato et al. |
| 6,884,668 B2 | 4/2005 | Yamazaki et al. |
| 6,906,343 B2 | 6/2005 | Yamazaki |
| 6,933,527 B2 | 8/2005 | Isobe et al. |
| 7,336,685 B2 | 2/2008 | Tanaka |
| 2001/0000243 A1 | 4/2001 | Sugano et al. |
| 2001/0000627 A1 | 5/2001 | Hayakawa et al. |
| 2001/0015441 A1 | 8/2001 | Kawasaki et al. |
| 2001/0035526 A1 | 11/2001 | Yamazaki et al. |
| 2002/0004292 A1 | 1/2002 | Yamazaki et al. |
| 2002/0008801 A1 | 1/2002 | Fukada et al. |
| 2002/0048864 A1 | 4/2002 | Yamazaki et al. |
| 2002/0075208 A1 | 6/2002 | Bae et al. |
| 2002/0096680 A1 | 7/2002 | Sugano et al. |
| 2002/0098628 A1 | 7/2002 | Hamada et al. |
| 2002/0119609 A1 | 8/2002 | Hatano et al. |
| 2002/0121665 A1 | 9/2002 | Kawasaki et al. |
| 2002/0134981 A1 | 9/2002 | Nakamura et al. |
| 2003/0001800 A1 | 1/2003 | Nakajima et al. |
| 2003/0080436 A1 | 5/2003 | Ishikawa |
| 2003/0128200 A1 | 7/2003 | Yumoto |
| 2003/0141505 A1 | 7/2003 | Isobe et al. |
| 2003/0141521 A1 | 7/2003 | Isobe et al. |
| 2003/0181043 A1 | 9/2003 | Tanada et al. |
| 2003/0183854 A1 | 10/2003 | Kato et al. |
| 2003/0183875 A1 | 10/2003 | Isobe et al. |
| 2003/0186490 A1 | 10/2003 | Kato et al. |
| 2003/0209710 A1 | 11/2003 | Yamazaki et al. |
| 2003/0218169 A1 | 11/2003 | Isobe et al. |
| 2003/0218170 A1 | 11/2003 | Yamazaki et al. |
| 2003/0218171 A1 | 11/2003 | Isobe et al. |
| 2003/0218177 A1 | 11/2003 | Yamazaki |
| 2003/0219935 A1 | 11/2003 | Miyairi et al. |
| 2003/0230749 A1 | 12/2003 | Isobe et al. |
| 2003/0230750 A1 | 12/2003 | Koyama et al. |
| 2004/0016958 A1 | 1/2004 | Kato et al. |
| 2004/0016967 A1 | 1/2004 | Yamazaki et al. |
| 2004/0026696 A1 | 2/2004 | Yamazaki et al. |
| 2004/0063258 A1 | 4/2004 | Kasahara et al. |
| 2005/0020096 A1 | 1/2005 | Miyairi et al. |
| 2005/0029518 A1 | 2/2005 | Kato et al. |
| 2005/0029519 A1 | 2/2005 | Yamazaki et al. |
| 2005/0098784 A1 | 5/2005 | Isobe et al. |
| 2005/0161742 A1 | 7/2005 | Isobe et al. |

FOREIGN PATENT DOCUMENTS

| | | |
|---|---|---|
| EP | 1 067 593 | 1/2001 |
| JP | 58-151042 | 9/1983 |
| JP | 62-104117 | 5/1987 |
| JP | 63-031108 | 2/1988 |
| JP | 02-143417 | 6/1990 |
| JP | 06-097102 | 4/1994 |
| JP | 06-349735 | 12/1994 |
| JP | 07-130652 | 5/1995 |
| JP | 08-070129 | 3/1996 |
| JP | 08-078329 | 3/1996 |
| JP | 08-195357 | 7/1996 |
| JP | 10-012891 | 1/1998 |
| JP | 10-135468 | 5/1998 |
| JP | 10-135469 | 5/1998 |
| JP | 11-084418 | 3/1999 |
| JP | 11-177102 | 7/1999 |
| JP | 11-354442 | 12/1999 |
| JP | 2000-68520 | 3/2000 |
| JP | 2000-277450 | 10/2000 |
| JP | 2000-349296 | 12/2000 |
| JP | 2001-011085 | 1/2001 |
| JP | 2001-144027 | 5/2001 |
| JP | 2001-156018 | 6/2001 |
| JP | 2001-196599 | 7/2001 |
| JP | 2002-014337 | 1/2002 |
| JP | 2002-313811 | 10/2002 |
| JP | 2002-324808 | 11/2002 |
| KR | 2000-0018585 A | 4/2000 |

| | | |
|---|---|---|
| KR | 2000-0053428 A | 8/2000 |
| WO | WO-00/63856 A | 10/2000 |
| WO | WO 00-63956 | 10/2000 |

OTHER PUBLICATIONS

M.A. Baldo et al., *Very High-Efficiency Green Organic Light-Emitting Devices Based on Electroophosphorescence*, Applied Physics Letters, vol. 75, No. 1, Jul. 5, 1999, pp. 4-6.

T. Tsutsui et al., *High Quantum Efficiency in Organic Light-Emitting Devices With Iridium-Complex as a Triplet Emissive Center*, Japanese Journal of Applied Physics, vol. 38, Part 2, No. 12B, Dec. 15, 1999, pp. L1502-L1504.

M.A. Baldo et al., *Highly Efficient Phosphorescent Emission From Organic Electroluminescent Devices*, Letters to Nature, vol. 395, Sep. 10, 1998, pp. 151-154.

T. Tsutsui et al., *Electroluminescence in Organic Thin Films*, Photochemical Processes in Organized Molecular Systems, Sep. 22, 1990, pp. 437-450.

M. Kishino et al., *Physics of VLSI Device*, Maruzen Co., Ltd., 1995, pp. 144-146.

European Search Report dated Mar. 8, 2005 for EP Application No. 02028650.6.

Hara et al., "Ultra-High Performance Poly-Si TFTs on a Glass by a Stable Scanning CW Laser Lateral Crystallization," AM-LCD '01, pp. 227-230.

Geis et al., "Crystalline Silicon on Insulators by Graphoepitaxy," IEEE 1979, pp. 210-212.

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Lam et al., "Characteristics of MOSFETS Fabricated in Laser-Recrystallized Polysilicon Islands with a Retaining Wall Structure on an Insulating Substrate," IEEE Electron Device Letters, vol. EDL-1, No. 10, Oct. 10, 1980 pp. 206-208.

Smith et al., "Oriented Crystal Growth on Amorphous Substrates Using Artificial Surface-Relief Gratings," Appl. Phys. Lett. 32(6) Mar. 15, 1978, pp. 349-350.

Biegelsen et al., "Laser-induced Crystallization of Silicon Islands on Amorphous Substrates: Multilayer Structure," Appl. Phys. Lett. 38(3), Feb. 1, 1981, pp. 150-152.

European Search Report dated May 20, 2005 for EP Application No. 02028650.6.

\* cited by examiner

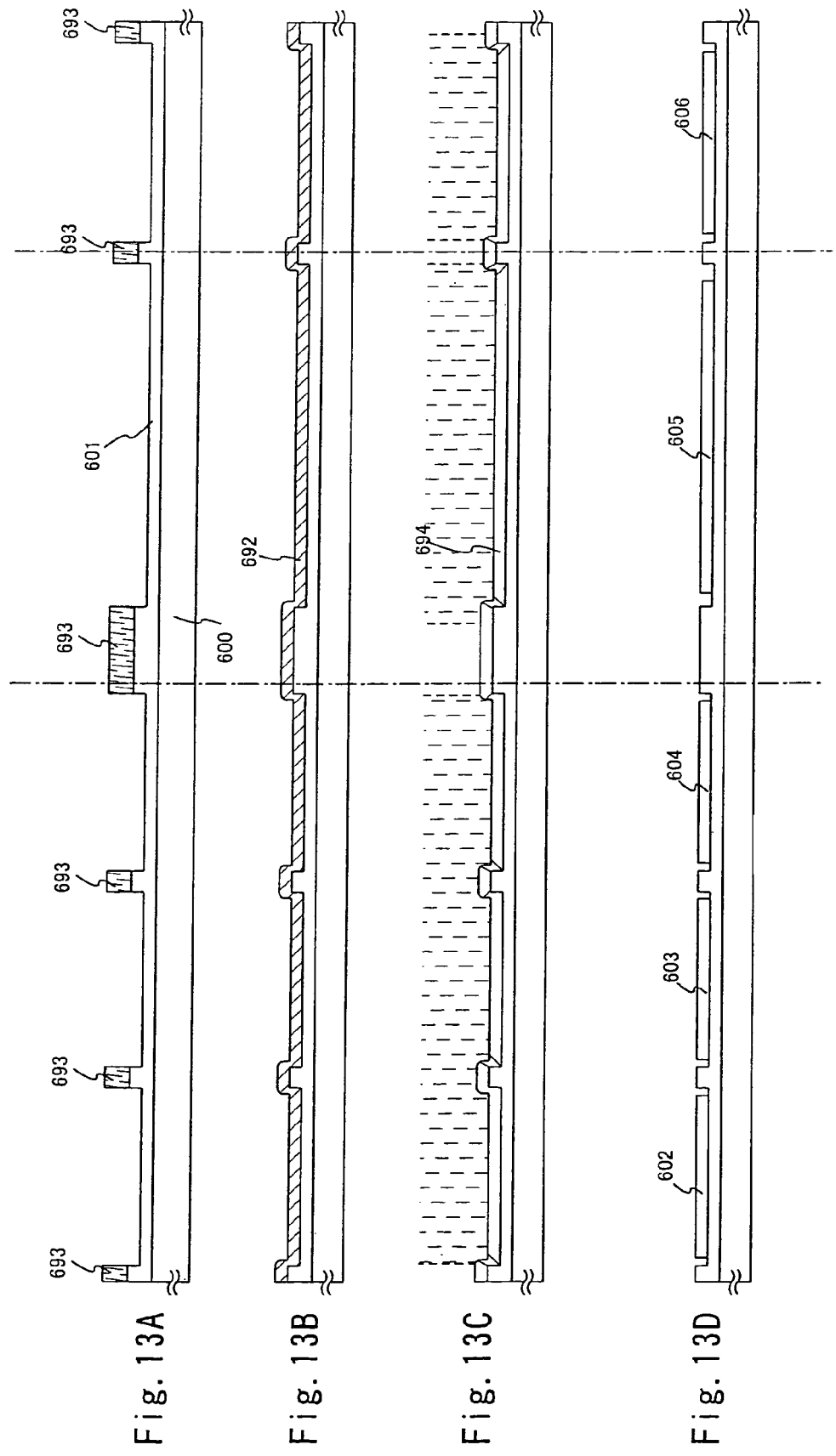

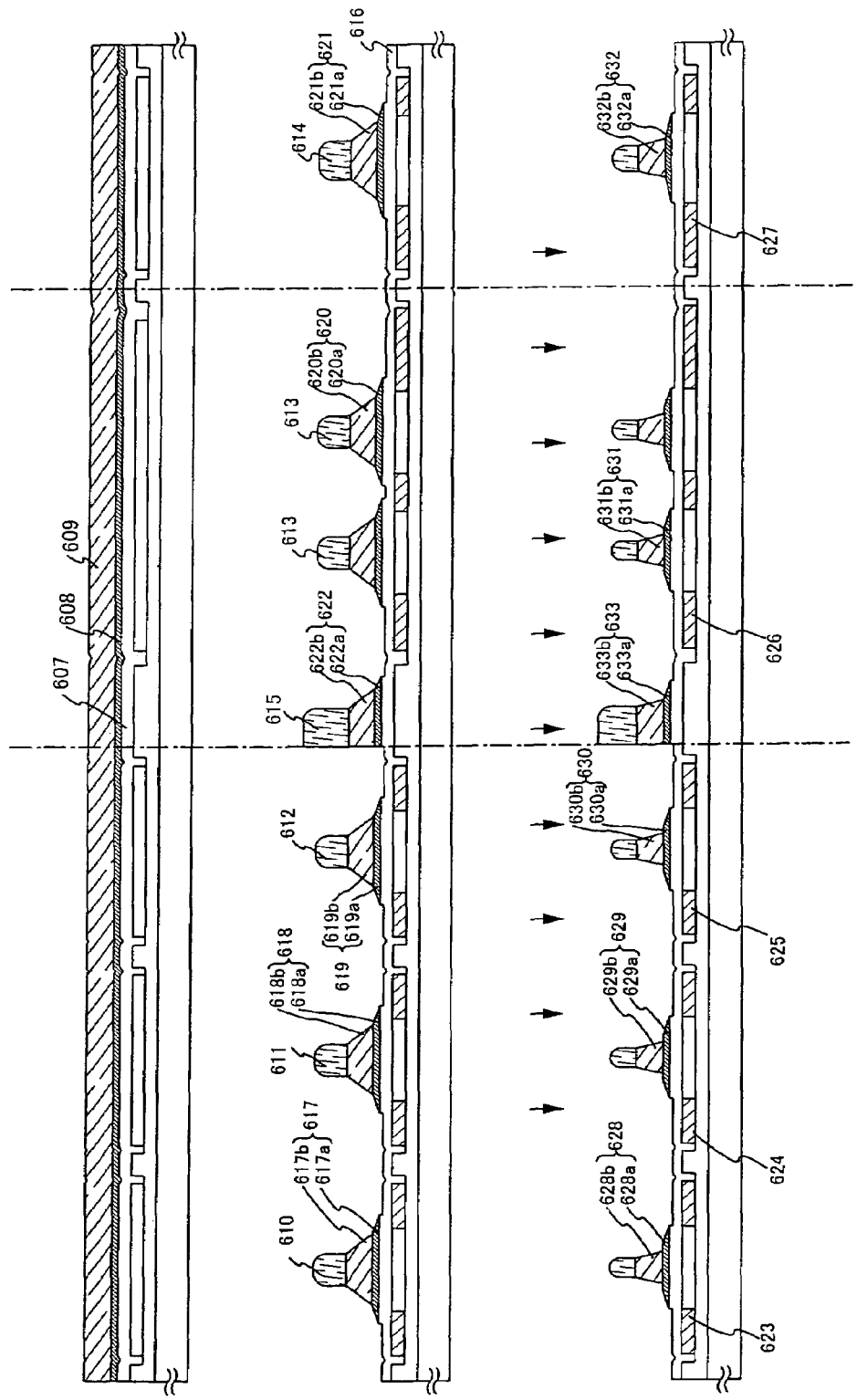

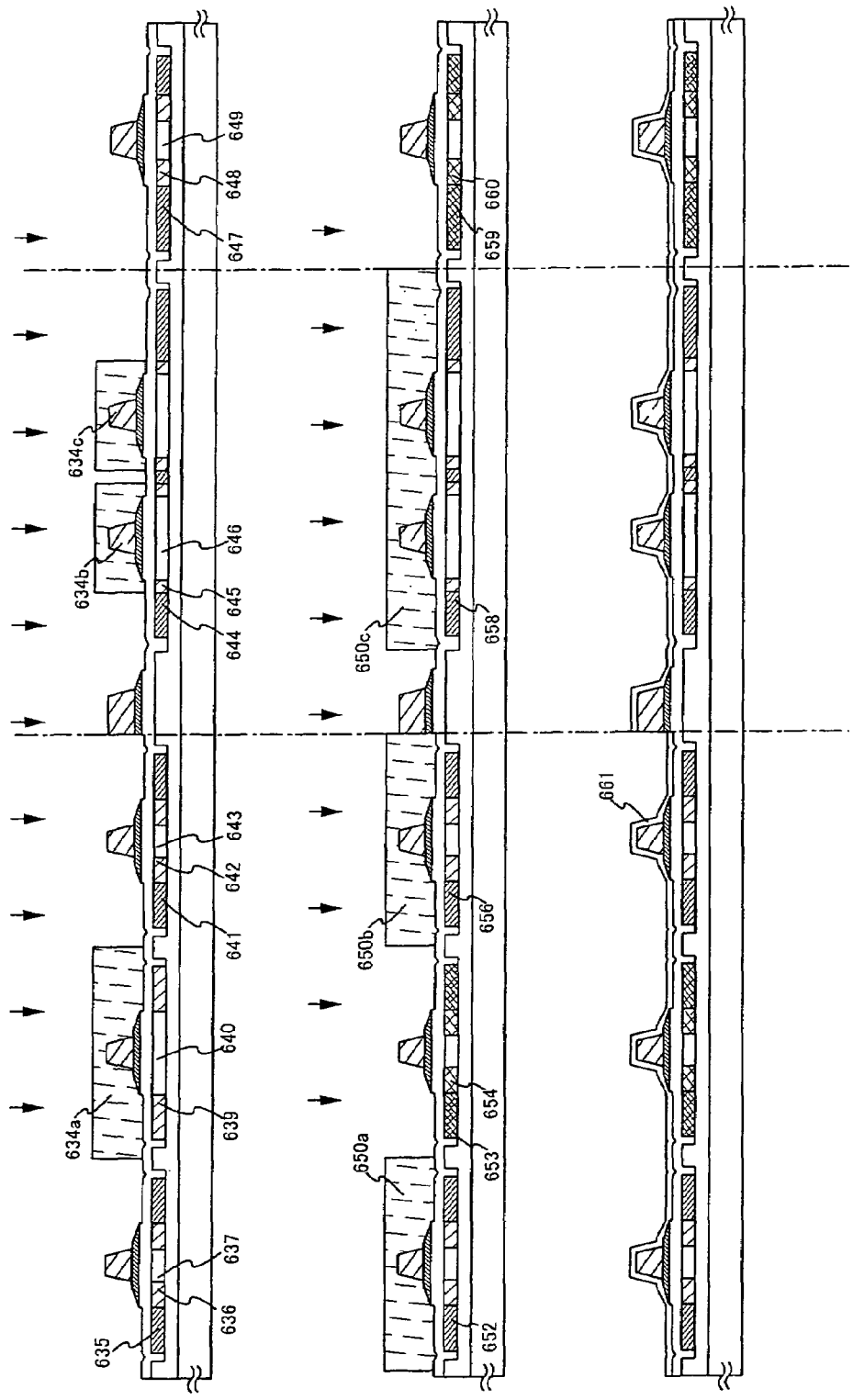

FIG. 30A
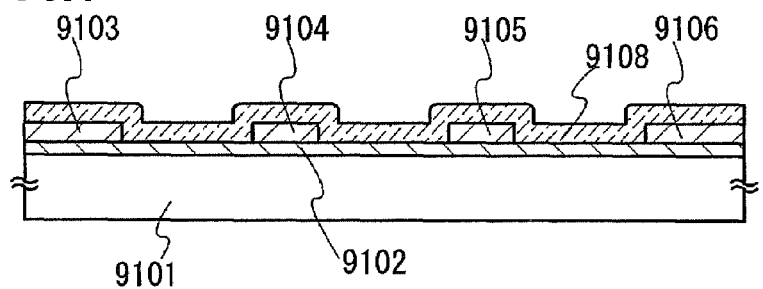
FIG. 30B
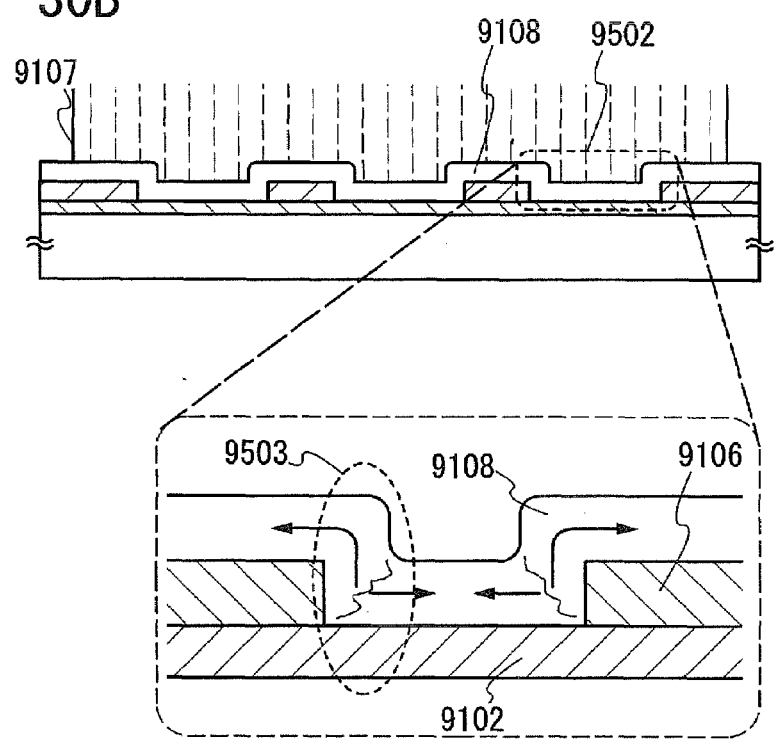
FIG. 30C

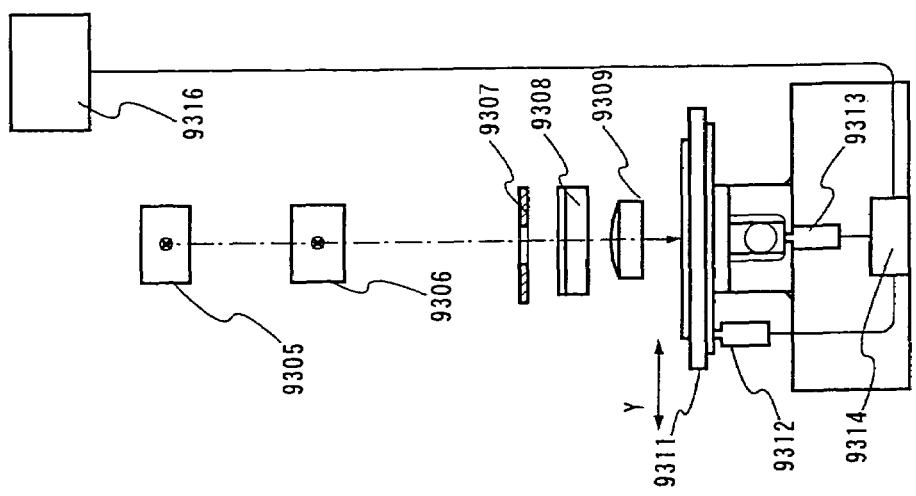
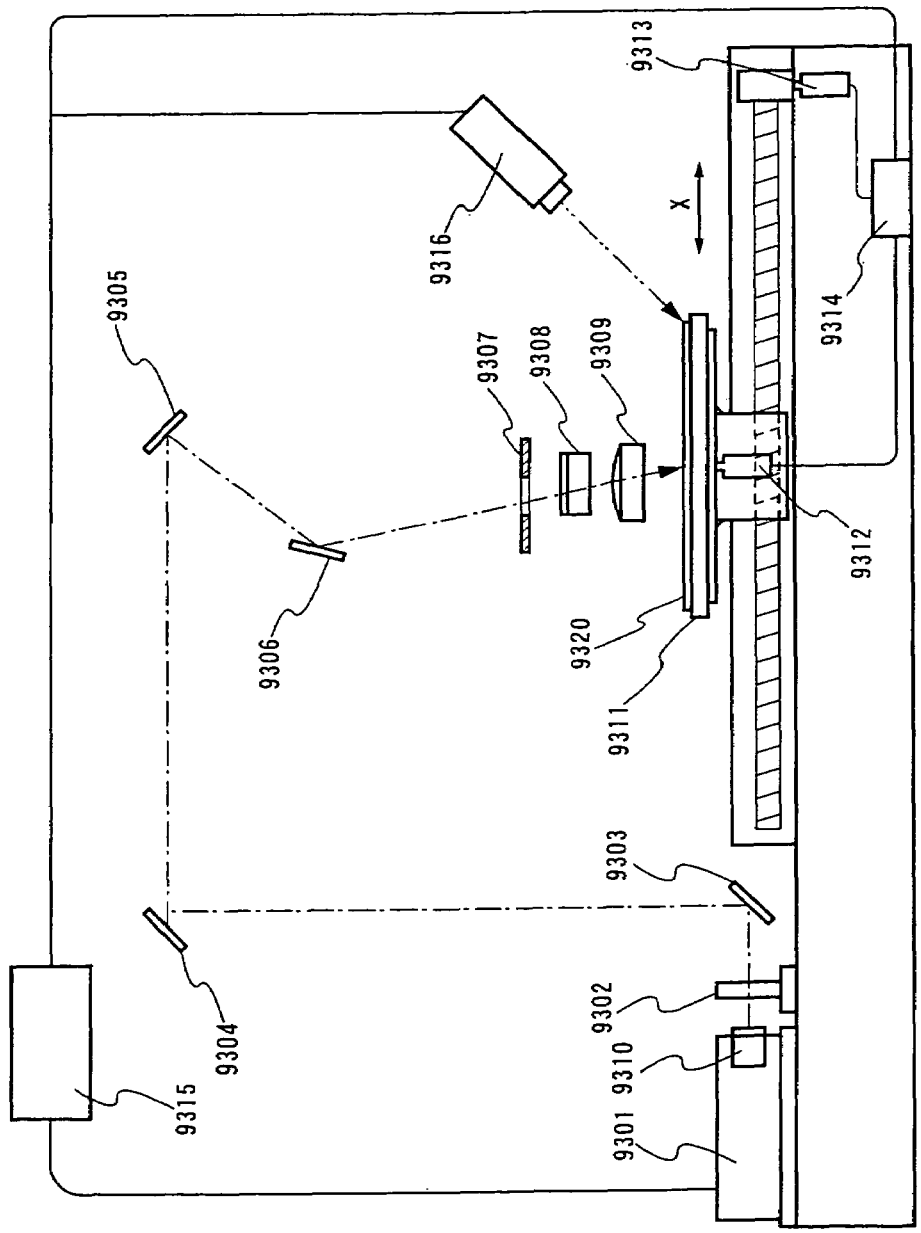
Fig. 31B Side View
Fig. 31A Front View

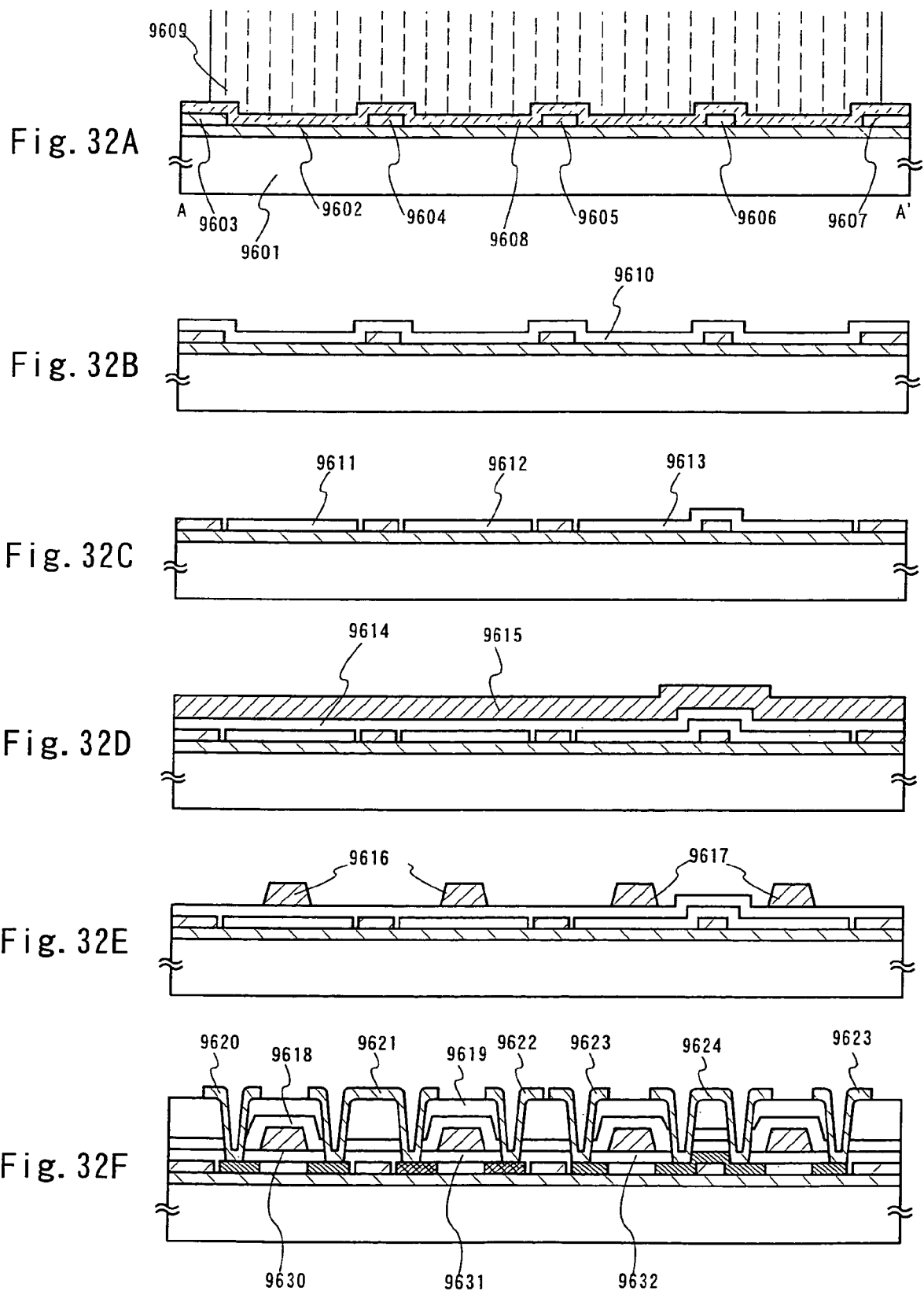

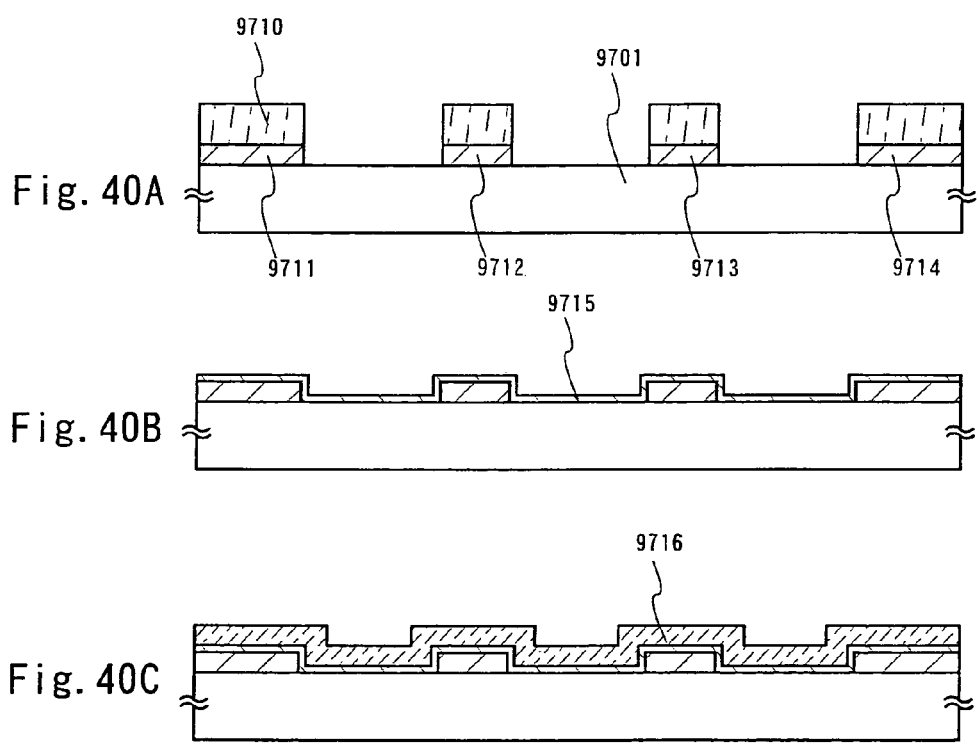

SEMICONDUCTOR DEVICE AND SEMICONDUCTOR DEVICE PRODUCING SYSTEM

BACKGROUND OF THE INVENTION

1. Field of the Invention

The present invention relates to a semiconductor device including a semiconductor film having a crystal structure and particularly to a semiconductor device including a crystalline semiconductor film raised on an insulating surface and a field-effect transistor such as a thin film transistor and/or a bipolar transistor especially. In addition, the present invention relates to a semiconductor device producing system for crystallizing a semiconductor film by using laser light and for activating a semiconductor film after ion implantation.

2. Description of the Related Art

A technology has been known for crystallizing an amorphous semiconductor film over a substrate of, for example, glass through laser processing. The laser processing may be a technology for re-crystallizing a damaged layer or an amorphous layer on a semiconductor substrate or a semiconductor film, a technology for crystallizing an amorphous semiconductor film on an insulating surface, or a technology for improving the crystallinity of a semiconductor film having a crystal structure (crystalline semiconductor film). A laser oscillating device used for the laser processing generally uses gaseous laser such as excimer laser or solid laser such as YAG laser.

Laser beam is used because an area absorbing energy from irradiated laser beam can be. heated selectively in comparison with heat processing using radiant heating or conductive heating. For example, laser processing using excimer laser oscillating device for oscillating ultra violet light having a wave length equal to or less than 400 nm heats a semiconductor film selectively and locally. Then, crystallization and/or activation processing can be performed on the semiconductor film by hardly damaging the glass substrate thermally.

JP Laid-Open 62-104117 (page 92) discloses laser processing in which an amorphous semiconductor film is crystallized without melting the semiconductor film completely by adopting rapid scanning using laser of (beam spot diameter×5000)/second or more. U.S. Pat. No. 4,330,363 (FIG. 4) discloses laser processing in which an extended laser beam is irradiated to an island-shaped semiconductor area to form a single crystalline area essentially. Alternatively, JP Laid-Open 8-195357 (Pages 3 to 4 and FIGS. 1 to 5) discloses a method in which a beam to be irradiated is processed linearly by an optical system such as a laser processing apparatus.

Furthermore, for example, JP Laid-Open 2001-144027 (Page 4) discloses a crystallization technology using a solid laser oscillating device with, for example, Nd: $YVO_4$ laser. According to the technology, a second harmonic of a laser beam projected from the solid laser oscillating device is used such that a crystalline film having a larger crystal grain size than the conventional size can be obtained to be applied for a thin. film transistor (called "TFT" hereinafter).

The application to a thin film transistor (called "TFT" hereinafter) in the crystallization technology using the solid laser oscillating device is reported in A. Hara, F. Takeuchi, M. Takei, K. Yoshino, K. Suga and N. Sasaki, "Ultra-high Performance Poly-Si TFT on a Glass by a Stable Scanning CW Laser Lateral Crystallization", AMLCD'01 Tech. Dig., 2001, pp. 227-230. According to the result described in the document, a second harmonic wave of a diode-excited solid continuous wave laser ($YVO_4$) is used to crystallize an amorphous silicon film to be used for producing a TFT.

Conventionally, improvement in TFT characteristics may have required improvement in crystallinity of the active layer (which is a semiconductor film including regions and/or a semiconductor film having source or drain regions, here).

Forming a single crystalline semiconductor on an insulating surface has been attempted for a long time. A technology called Graphoepitaxy was designed as a more active attempt. According to Graphoepitaxy, grade changes are formed on a surface of a quartz substrate. Then, an amorphous film or a polycrystalline semiconductor film is formed thereon. By heating it by using a laser beam or a heater, an epitaxial growing layer is formed by having the grade change on the quartz substrate as a core. The technology is disclosed in J. Vac. Sci. Technol., "Grapho-epitaxy of silicon on fused silica using surface micropatterns and laser crystallization", 16(6), 1979, pp. 1640-1643, for example.

In addition, M. W. Geis, et al., "CRYSTALLINE SILICON ON INSULATORS BY GRAPHOEPITAXY" Technical Digest of International Electron Devices Meeting, 1979, pp. 210 discloses a semiconductor film crystallization technology called graphoepitaxy. The technology attempts epi-raising of a semiconductor film by inducing grade changes on a surface of an artificial amorphous substrate. In the graphoepitaxy disclosed in the document, grade changes are provided on a surface of an insulating film, and processing including heating or irradiating laser light is performed on a semiconductor film on the insulating film. Thus, crystal of the semiconductor film is epitaxially raised.

However, in order to form a semiconductor film having good crystallinity with fewer defects and/or crystal grain boundaries and with uniform alignment, a semiconductor is conventionally and mainly heated to a higher temperature to be melted and then is crystallized. This is known as a band melting method.

According to the publicly-known graphoepitaxy technology, grade changes in a primary layer is used. Thus, crystal grows along the grade changes. As a result, the grade changes remain on the surface of the formed single crystalline semiconductor film disadvantageously. Furthermore, a single crystalline semiconductor film cannot be formed by using the graphoepitaxy on a large glass substrate having smaller distortion points.

In all of the cases, a crystalline semiconductor film having fewer defects cannot be formed due to the volume shrinkage of the semiconductor, thermal stresses against the base, grating mismatch and so on caused by crystallization. Furthermore, distortions are accumulated. Thus, an area causing defects cannot be positionally controlled so as to position in the other area than element forming areas. Accordingly, without bonded SOI (silicon on insulator), a crystalline semiconductor film on an insulating surface cannot obtain the same quality as that of a MOS transistor provided on a single crystalline semiconductor.

SUMMARY OF THE INVENTION

The present invention was made in view of these problems. It is an object of the present invention to provide a semiconductor device including a fast semiconductor element having a higher current driving ability for forming a uniform crystalline semiconductor film, and, preferably, a single crystalline semiconductor film on a glass substrate having fewer distortion points.

Recently, technologies each for forming a TFT over a substrate have been evolved significantly. The technologies have been applied to the active matrix type semiconductor display device. Especially, a TFT using a polycrystalline semiconductor film has higher field effect mobility than that of a TFT having a conventional amorphous semiconductor film. Therefore, rapid operations are possible. Thus, pixel control, which has been performed by a drive circuit provided outside of a conventional substrate, can be performed by a drive circuit over a substrate on which pixels are also provided.

By the way, a glass substrate is preferred for a semiconductor device to a single crystalline silicon because of the costs. A glass substrate has low heat resistance and may be deformed by heat easily. Therefore, when a polysilicon TFT is formed on a glass substrate, laser-annealing may be used for crystallizing the semiconductor film. Thus, heat-deformation of the glass substrate can be avoided very effectively.

In comparison with an annealing method used for radiant-heating or conductive heating, laser annealing can reduce a processing time significantly. In addition, a semiconductor or a semiconductor film is heated selectively and locally, which can hardly damage the substrate thermally.

The "laser-annealing" herein refers to a technology for re-crystallizing a damaged layer on a semiconductor substrate or on a semiconductor film or a technology for crystallizing a semiconductor film over a substrate. In addition, the "laser-annealing" herein includes a technology to be applied for planarizing or improving the quality of the surface of a semiconductor substrate or a semiconductor film. A laser oscillating device to be applied may be a gaseous laser oscillating device such as excimer laser, a solid laser oscillating device such as YAG laser. These apparatus can heat a surface layer of a semiconductor for a very short period of time as much as several tens nano to several tens micro by irradiating laser light thereon such that the surface layer can be crystallized.

Lasers may be divided into two including those of a pulse type and of a continuous wave type. The pulse type of laser outputs higher energy. Therefore, the mass production characteristic can be improved by using a laser beam of several $cm^2$ in size or more. Especially, the form of the laser beam may be processed by using an optical system so as to obtain a linear shape of 10 cm long or more. Then, the laser light can be irradiated to a substrate efficiently. As a result, the mass production characteristic can be further improved. Accordingly, using the pulse type of laser for the semiconductor film crystallization is becoming a main stream.

However recently, when the continuous wave type of laser is used for crystallizing a semiconductor film, crystal formed within a semiconductor film is found larger in grain size than those obtained by using the pulse type of laser. The larger the crystal grain size is within a semiconductor film, the higher the mobility of a TFT formed by using the semiconductor film is. Therefore, the serial oscillating type of laser starts to gather attentions gradually.

A crystalline semiconductor film produced by using laser annealing, including those of the pulse type and the continuous wave type, are formed by gathering multiple crystal grains in general. The positions and sizes of the crystal grains are random. Therefore, a crystalline semiconductor film is difficult to form by specifying the positions and sizes of the crystal grains. As a result, an active layer formed by patterning the crystalline semiconductor into an island shape may have interfaces (grain boundaries) between crystal grains.

Unlike the inside of the crystal grain, the grain boundary has numberless centers of recombination and/or capture due to an amorphous structure or defective crystal. When a carrier is trapped by the center of capture, the potential at the grain boundary increases, which is a barrier against the carrier. Therefore, the current transportation characteristic of the carrier is reduced. Accordingly, when a grain boundary exists in a channel-forming region especially, the characteristics of the TFT may be affected significantly. The mobility of the TFT is significantly decreased. ON-current is reduced, and OFF current is increased because current flows at the grain boundary. The characteristics of multiple TFT produced for obtaining the same characteristics may vary depending on the presence of the grain boundary in the active layer.

When laser light is irradiated to a semiconductor film, the obtained crystal grains have random positions and sizes. The reasons are as follows: A certain period of time is required until a solid phase core is created in a liquid semiconductor film, which has been melted completely by the irradiation of the laser light. With a lapse of time, numberless crystal cores are caused in the completely-melted area. Then, crystal grows from the crystal cores. The crystal cores are caused at random positions. Therefore, the crystal cores range nonuniformly. The crystal finishes growing when the crystal grains touch each other. Therefore, the crystal grains in random size are caused at random positions.

Ideally, the channel-forming region affecting the characteristics of the TFT significantly is removed such that a single crystal grain can be formed. Forming an amorphous silicon film having no grain boundaries has been almost impossible by using laser annealing. Even today, a TFT cannot be obtained which has, as an active layer, a crystalline silicon film crystallized by using laser annealing and has the same characteristics as those of a MOS transistor produced on a single crystalline silicon substrate.

The present invention was made in view of these problems. It is another object of the present invention to provide a system of producing a semiconductor device by using a laser crystallizing method, which can prevent grain boundaries from forming in a channel-forming region of a TFT and which can prevent a significant increase in mobility, a decrease in ON-current, and/or an increase in OFF-current of a TFT due to the grain boundaries.

In order to solve these problems, according to the present invention, multiple insulating films are stacked. Alternatively, on a primary insulating film having rectangular or strip grade changes formed by chemically engraving a pattern on an insulating film, an amorphous semiconductor film or a crystalline semiconductor film is formed. Then, a laser beam is irradiated thereto for crystallization. Then, at least the crystalline semiconductor film in depression bottom portions of the primary insulating film is left. Then, a TFT is formed such that a channel forming region can be provided in the crystalline semiconductor film. The channel forming region extends longitudinally in the depression bottom portion of the rectangular or a strip grade change.

The primary insulating film having the grade changes is formed by using silicon nitride, silicon oxide, silicon nitride oxide or silicon oxide nitride. The grade change may be formed by etching the film or may be formed by stacking multiple films. In the present invention, the silicon nitride oxide contains oxygen of not less than 20 atomic % to not more than 30 atomic % in density, nitrogen of not less than 20 atomic % to not more than 30 atomic % in density and hydrogen of not less than 10 atomic % to not more than 20 atomic % in density. The silicon oxide nitride contains oxygen of not less than 55 atomic % to not more than 65 atomic % in density, nitrogen of not less than 1 atomic % to not more than 20 atomic % in density and hydrogen of not less than 0.1 atomic % to not more than 10 atomic % in density.

The rectangular or strip grade change is formed by forming a first insulating film containing silicon oxide or silicon oxide nitride all over a substrate and forming a second insulating film containing silicon nitride or silicon nitride oxide in a rectangular or strip pattern. Alternatively, a second insulating film, which is silicon oxide nitride film, is formed all over a first insulating film formed by using a rectangular or strip pattern of silicon nitride, silicon oxide, silicon nitride oxide or silicon oxide nitride.

Originally, a silicon nitride film has large stress. Therefore, when a crystalline semiconductor film is formed thereon, distortion is undesirably formed due to the stress effect. A silicon oxide film has smaller internal stress. Therefore, the crystalline semiconductor film and an interface can be kept in better contact. As a result, the interface level density can be reduced. Silicon oxide nitride has a characteristic combining an impurity blocking characteristic of silicon nitride with characteristics of silicon oxide. Thus, the internal stress can be controlled to be smaller. Therefore, silicon oxide nitride film is suitable for the primary insulating film.

The grade changes are formed in accordance with an alignment of TFTs over a substrate surface and does not have to be in a regular and cyclical pattern. According to the present invention, each of the grade changes in a primary insulating film acts effectively by locally concentrating stress from volume shrinkage caused by crystallization such that stress distortion cannot occur on an active layer, especially, a channel-forming region of a semiconductor element.

In a process for crystallizing an amorphous semiconductor film, volume shrinkage occurs due to realignment of atoms and/or separation of contained hydrogen. The percentage depends on conditions for producing the amorphous semiconductor film but may be regarded as about 0.1% to 1%. As a result, tensile stress occurs in the crystalline semiconductor film. The size may be about $1 \times 10^{10}$ dyn/cm$^2$. This is significant in an amorphous silicon film containing hydrogen, for example. Therefore, when a crystalline semiconductor film is re-crystallized, the same phenomenon may occur. The stress due to the crystallization concentrates on the grade change and may be stored as internal stress. Alternatively, the stress can cause a crack.

The part storing the distortion may be applied partially. Channel forming regions are provided in crystalline semiconductor films in depression bottom surfaces on a primary insulating film having multiple rectangular or strip grade changes, respectively. Each of the channel-forming regions may extend in a longitudinal direction of the strip grade change and may connect to the crystalline semiconductor film. A source region or a drain region may be formed in the continuously-formed crystalline semiconductor film. With this form, a multi-channel TFT is formed having multiple channel-forming regions in one TFT.

Alternatively, multiple rectangular semiconductor regions placed in parallel are connected in series. A crystalline semiconductor film is integrally formed by using a pair of semiconductor regions connected at the both ends. In the multiple rectangular semiconductor regions, channel forming regions are formed with electrodes crossing through an insulating film. Crystal extends in the channel length direction.

For crystallization using grade changes formed on the primary insulating film, laser beams to be gathered linearly are irradiated by using a continuous wave type laser oscillating device. The laser beams desirably have an energy density distribution in which the strength distribution is uniform in the longitudinal direction. The distribution in the transverse direction may be arbitrary and, for example, may have Gaussian distribution. The laser processing is performed by scanning in a direction crossing the longitudinal direction of the continuous wave laser beams to be gathered linearly. Here, if the laser beams have a uniform strength direction in the longitudinal direction. Crystal growth extending in parallel with the scanning direction can be achieved. In other words, when the energy density distribution is not uniform in the longitudinal direction, a temperature gradient may occur. Then, crystal is formed having crystal grain boundaries extend by depending thereon.

The light source of the continuous wave laser beam is a rectangular beam solid laser oscillating device. Typically, a slab laser oscillating device may be applied.

In view of the light absorbing coefficient, the semiconductor film is heated by the irradiation of laser beams substantially selectively. The semiconductor melted by the irradiation of laser beams is crystallized at when it is set. Different heat capacities occur due to the grade changes in the primary insulating film. A side end portion where the first insulating film and the second insulating film overlap cools off the fastest. Crystal can be raised from the side end portion.

Crystal in the rectangular semiconductor region having channel forming regions extends in a direction parallel to the channel length direction. The crystal orientation is uniform.

In other words, the region for forming the channel forming region of the TFT may be formed on the projection top portion of the primary insulating film. Thus, good crystal can be used selectively. Alternatively, the region where distortion concentrates most in the grade change portion may be removed from the channel forming region.

In this construction, multiple rectangular semiconductor regions are placed in parallel between a pair of source and drain regions. As a result, one transistor can be formed. Therefore, the distribution of characteristics between elements can be suppressed. By using good-quality crystal only, the field effect mobility can be improved.

The "amorphous semiconductor film" herein refers to not only one having a complete amorphous structure in the narrow sense but also the semiconductor film containing fine crystal particles, a so-called microcrystal semiconductor film or a semiconductor film having a crystal structure locally. Typically, an amorphous silicon film is applied. Additionally, a silicon germanium film or an amorphous silicon carbide may be applied.

The inventors found that the direction of stress caused in a semiconductor film closely related to a position and orientation of grain boundary when the semiconductor film was crystallized by the irradiation of laser light. FIG. 1A shows a section image of TEM in a direction perpendicular to the scanning direction of laser light. In this case, continuous oscillating laser light is irradiated to an amorphous semiconductor film of 200 mm in thickness at a scanning speed of 5 cm/sec. In FIG. 1A, widths of crystal grain boundaries 10*a*, 10*b* and 10*c* in the direction perpendicular to the scanning direction are random.

FIG. 1B schematically shows the section image of TEM shown in FIG. 1A. As shown in FIG. 1B, a semiconductor film 102 has projections between the grain boundary 10*a* and the grain boundary 10*b* and between the grain boundary 10*b* and the grain boundary 10*c*. The inventors considered that, as indicated by arrows, stress was imposed in a direction parallel to the substrate from near the grain boundary to the center of the crystal grain.

Thus, the inventors estimated that the position at which a grain boundary was formed could be determined selectively by intentionally forming in the semiconductor film a part on which stress was extensively imposed. Thus, according to the present invention, an insulating film having depressions and projections is formed on a substrate. Then, a semiconductor film is formed on the insulating film. Thus, a part on which stress is extensively imposed during the crystallization by laser light is selectively formed in the semiconductor film. More specifically, stripe (or strip) or rectangular depressions and projections are provided in the semiconductor film. Continuous wave laser light is irradiated along the stripe depressions and projections formed in the semiconductor film or in the major axis or minor axis of the rectangle. In this case, the continuous wave laser light is the most preferably used. However, pulse laser light may be used. A section of the depression in a direction perpendicular to the scanning direction of laser light may be rectangle, triangle or trapezoid.

During the crystallization by the laser light irradiation, stress concentrates near the edges of the depressions or near the edges of projections in the semiconductor film. As a result, a grain boundary is formed. Smaller stress occurs near the center of the projection or near the center of the depression in the semiconductor than near the edges of the depression or near the edges of projection. Thus, grain boundaries may be more hardly formed. Even when a grain boundary is formed, the crystal grain is large. Therefore, good crystallinity can be obtained.

According to the present invention, after the crystallization by laser light, the part near the edges of the depression or near the edges of the projection in the semiconductor film is removed by patterning. Then, a part having good crystallinity near the center of the depression may be used actively as an active layer of the TFT. As a result, grain boundaries may be prevented from forming in the channel forming region of the TFT. Thus, a significant increase in mobility, a decrease in ON-current, and/or an increase in OFF-current of the TFT due to grain boundaries may be prevented. The area to be removed by patterning near the edges of the depression may be determined by the designer.

Generally, the energy density near the edge of a laser beam of laser light is lower than the energy density near the center. Therefore, the crystallinity of the semiconductor film may be lower Therefore, when scanning laser light, the part to be a channel forming region of the TFT later, more preferably, the depression of the semiconductor film and the edge of the trace must be prevented from overlapping with each other.

Accordingly, in a producing system of the present invention, data (pattern information) of a form of an insulating film or a semiconductor film viewed from above the substrate, which is obtained while designing, is stored in a storage device. A scanning path of laser light is determined based on the pattern information and a width in a direction perpendicular to the scanning direction of the laser beam of laser light. Thus, at least a part to be a channel forming region of the TFT may not overlap with the edge of the trace of the laser light. The substrate may be positioned with reference to a marker. Then, laser light is irradiated to a semiconductor film on the substrate by following the determined scanning path.

With this construction, laser light may be scanned to at least a required part without irradiating laser light to the entire substrate. Therefore, a time for irradiating laser light to unnecessary parts can be saved. As a result, a time for laser light irradiation can be reduced. The speed for processing the substrate can be improved. Damaging the substrate due to the irradiation of laser light to unnecessary parts can be prevented.

The marker may be formed by etching the substrate with laser light directly. Alternatively, when an insulating film having depressions and projections is formed, the marker may be formed at a part of the insulating film at the same time. A form of the actually formed insulating film or semiconductor film may be read by using an imaging element such as a CCD and may be stored in a first storage unit as data. Pattern information of the insulating film or semiconductor film obtained while designing may be stored in a second storage unit. Then, by comparing the data stored in the first storage unit and the pattern information stored in the second storage unit, the substrate may be positioned.

When a form of a semiconductor film is read, the semiconductor film itself has a certain amount of thickness. Therefore, the form of the semiconductor film does not always match with a mask of the insulating film. Thus, the comparison with pattern information should be performed in consideration of the thickness of the semiconductor film. A CCD may not be always used for identifying the form. For example, laser light emitted from a laser diode may be irradiated to the insulating film or semiconductor film. Then reflected light may be monitored to identify the form.

By forming a marker at a part of the insulating film and/or by using a form of the insulating film as a marker, one mask for the marker can be eliminated. Furthermore, a marker can be formed at a more precise position in comparison with a case where a marker is formed on the substrate by laser light. Therefore, the precision of the positioning can be improved.

The energy densities of a laser beam of laser light is not completely uniform in general, and the height depends on the position within the laser beam. In the present invention, laser light with a uniform energy density must be irradiated to at least a part to be a channel forming region and, more preferably, to an entire flat surface of the depression. Therefore, in the present invention, a laser beam to be used is required to have an energy density distribution in which, by laser light scanning, an area having a uniform energy density overlaps with at least a part to be a channel forming region, and, more preferably, with an entire flat surface of the depression. In order to satisfy the energy density requirement, the laser beam is desirably rectangular or linear.

Additionally, a part with a lower energy density in a laser beam can be blocked by a slit. By using the slit, laser light with a more uniform energy density can be irradiated to the entire flat surface of the depression. Therefore, uniform crystallization can be achieved. The slit can be used to change a width of a laser beam partially based on pattern information of the insulating film or semiconductor film. Thus, constraints on the layout of channel forming regions and furthermore an active layer of the TFT can be reduced. The "width of a laser beam" refers to a length of a laser beam in a direction perpendicular to a scanning direction.

One laser beam obtained by combining laser light oscillated from multiple laser oscillating devices may be used for laser crystallization. With the construction, a part having a lower energy density in each laser light can be compensated.

After a semiconductor film is formed, the semiconductor film may be crystallized by irradiating light thereto so as to prevent the semiconductor film from exposing to the air (that is, in an atmosphere of specified gas such as rare gas, nitrogen and oxygen or in a reduced-pressure atmosphere). With the construction, a contamination material at a molecule level in a clean room such as boron contained within a filter for improving cleanness of the air, for example, is prevented from intruding into the semiconductor film during the crystallization by laser light.

In a semiconductor film crystallization technology called graphoepitaxy disclosed in the document, J. Vac. Sci. Technol., "Grapho-epitaxy of silicon on fused silica using surface micropatterns and laser crystallization", 16 (6), 1979, pp 1640-1643, or in the document, M. W. Geis, et al., "CRYSTALLINE SILICON ON INSULATORS BY GRAPHOEPITAXY" Technical Digest of International Electron Devices Meeting, 1979, pp. 210, epitaxial growth requires a temperature of at least about 700° C. When epitaxial growth is attempted on a glass substrate, grain boundaries are formed in a semiconductor film near edges of depressions in an insulating film. According to the present invention, a mask for an island is laid out. Then, in order to improve crystallinity at a part to be the island, a form of the depression of the insulating film and positions of the edges are designed in accordance with the layout of the island. More specifically, the form, size and so on of the depression are determined such that the edges of the depression and the island cannot overlap with each other. Then, an insulating film designed in accordance with the island layout is used, and a semiconductor film is formed in which grain boundaries are intentionally formed near the edges. Then, parts of the semiconductor film, which has many grain boundaries near the edges, are removed by patterning. Then, a part having better crystallinity is used as an island. Accordingly, the technology disclosed in the present invention agrees with the conventional graphoepitaxy in that a semiconductor is formed on an insulating film having grade changes and the semiconductor film is crystallized by using the grade changes. However, the conventional graphoepitaxy does not include a concept that positions of grain boundaries are controlled by using grade change to reduce the number of grain boundaries within an island. Therefore, the present invention is completely different from the conventional graphoepitaxy.

As described above, according to the present invention, by following a pattern in a primary insulating film having grade changes, a crystalline semiconductor film is left on the top of the projection. Then, the left crystalline semiconductor film is used as an active layer of a TFT. Thus, good crystal can be used selectively. In other words, distortion areas concentrating on the grade changes can be removed from a channel forming region.

In crystallization by irradiating a continuous wave laser beam to an amorphous semiconductor film, distortion and/or stress resulting from the crystallization can be concentrated on grade changes provided in the primary insulating film. Therefore, the distortion and/or stress are prevented from imposing on the crystalline semiconductor to be an active layer. Then, a TFT can be formed in which channel forming regions are provided in the crystalline semiconductor film free from the distortion and/or stress. As a result, current driving ability can be improved fast, and the reliability of elements can be improved.

Furthermore, variations in characteristic of the TFT, more specifically, S-values, mobility and threshold values of the TFT, can be suppressed.

According to the present invention, after crystallization with laser light, parts near the edges of depressions or near the edges of projections in the semiconductor film are removed by patterning. Then, parts having good crystallinity near the centers of the depressions may be used actively as an active layer of the TFT. Thus, a significant decrease in mobility, a decrease in ON-current and/or an increase in OFF current of the TFT due to the grain boundaries can be prevented. The ranges to be patterned and to be removed near the edges of the depressions may be determined by the designer appropriately.

Laser light is not scanned and irradiated on the semiconductor film entirely. However, laser light may be scanned for crystallizing at least a minimum required part. With the construction, a time for irradiating laser light to a part to be removed by patterning after the semiconductor film is crystallized can be saved. As a result, the processing time taken for one substrate can be reduced significantly.

Multiple laser light beams are overlapped to compensate each other for the parts with lower energy densities. Thus, crystallinity of the semiconductor film can be improved efficiently by overlapping multiple laser light beams rather than using the laser light beams separately.

Rather than forming depressions and projections in the insulating film, depressions and projections may be provided in the substrate itself by etching. Thus, a semiconductor film to be formed on the substrate can have depressions and projections. As a result, parts causing stress concentration may be formed intentionally.

BRIEF DESCRIPTION OF THE DRAWINGS

FIGS. 13A to 13D show a method of producing a semiconductor device according to the present invention;

FIGS. 14A to 14C show a method of producing a semiconductor device according to the present invention;

FIGS. 15A to 15C show a method of producing a semiconductor device according to the present invention;

FIGS. 30A to 30C are vertical section diagrams for explaining details of crystallization according to the present invention;

FIGS. 31A and 31B are arrangement diagrams showing a form of laser irradiating apparatus to be applied to the present invention;

FIGS. 32A to 32F are vertical section diagrams for explaining a method of producing a semiconductor device according to the present invention;

FIGS. 40A to 40C show vertical section diagrams for explaining methods of producing a primary insulating film and an amorphous semiconductor film according to the present invention;

DESCRIPTION OF THE PREFERRED EMBODIMENTS

Figure 26:
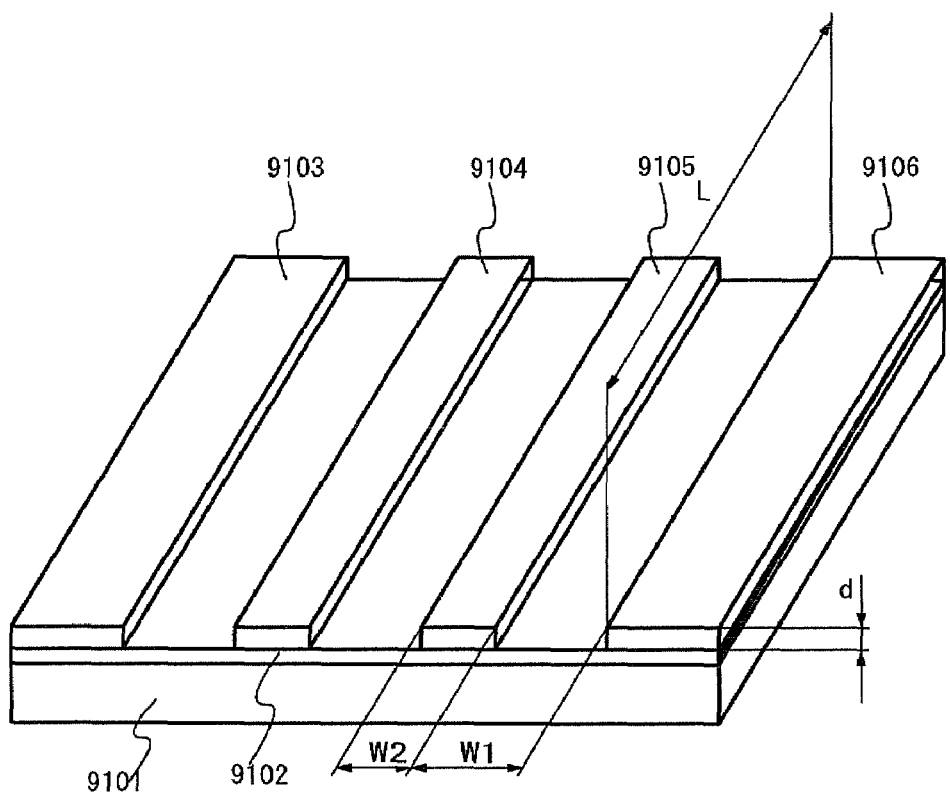
FIG. 26 is a perspective diagram for explaining a construction of a semiconductor device and a method of producing the semiconductor device according to the present invention.

Embodiments of the present invention will be described below with reference to drawings. A perspective diagram shown in FIG. 26 shows an embodiment having a first insulating film 9102, which is a primary insulating film on a substrate 9101, and second insulating films 9103 to 9106, which are pattered in a strip form. Here, three depression bottom portions formed by the second insulating films are shown. However, the number of the depression bottom portions is not limited thereto. The substrate may be one of a commercially available non-alkali glass substrate, quarts substrate, sapphire substrate, a substrate in which a surface of a single crystalline or polycrystalline semiconductor substrate is covered by an insulating film, and a substrate in which a surface of a metal substrate is covered by an insulating film.

Preferably, a width W2 of the strip second insulating film is 1 to 10 µm. Preferably, a space W1 between the adjacent second insulating films is 0.5 to 10 µm, and the thickness is 0.05 to 0.5 µm. The grade changes do not have to be arranged in a regular cyclical pattern. The grade changes may be arranged arbitrarily in accordance with a semiconductor element such as a TFT. A length L of the second insulating film is not limited and only needs to be a length in which a channel forming region of a TFT can be formed, for example.

A material of the first insulating film may be a silicon oxide or silicon oxide nitride. Silicon oxide can be formed by mixing Tetraethyl Ortho silicate (TEOS) and $O_2$ and by using Plasma CVD Method. The silicon nitride oxide contains oxygen of not less than 55 atomic % to not more than 65 atomic % in density, nitrogen of not less than 1 atomic % to not more than 20 atomic % in density and hydrogen of not less than 0.1 atomic % to not more than 10 atomic % in density. The etching rate at 20° C. of a mixed solution having density of not less than $6 \times 10^{22}/cm^3$ to not more than $9 \times 10^{22}/cm^3$ and containing ammonium bifluoride ($NH_4HF_2$) of 7.13% and ammonium fluoride ($NH_4F$) of 15.4% is 110 to 130 nm/min (90 to 100 nm/min after thermal processing at 500° C. for one hour and at 550° C. for four hours). The etching rate defined herein is a value obtained at 20° C. when liquid solution containing $NH_4HF_2$ of 7.13% and $NH_4F$ of 15.4% is used as the etching solution. The silicon oxide nitride film may be formed by using $SiH_4$ or $N_2O$ and Plasma CVD Method.

A material of the second insulating film may be silicon nitride or silicon nitride oxide. The silicon nitride oxide contains oxygen of not less than 20 atomic % to not more than 30 atomic % in density, nitrogen of not less than 20 atomic % to not more than 30 atomic % in density and hydrogen of not less than 10 atomic % to not more than 20 atomic % in density. Alternatively, the composition rate of nitrogen to oxygen is not less than 0.6 to not more than 1.5. The etching rate at 20° C. of a mixed solution having density of not less than $8 \times 10^{22}/cm^3$ to not more than $2 \times 10^{23}/cm^3$ and containing ammonium bifluoride ($NH_4HF_2$) of 7.13% and ammonium fluoride ($NH_4F$) of 15.4% is 60 to 70 nm/min (40 to 50 nm/min after thermal processing at 500° C. for one hour and at 550° C. for four hour). The silicon oxide nitride film may be formed by using $SiH_4$, $NH_3$ or $N_2O$ and Plasma CVD Method.

An angle of a side wall of the grade change formed in the second insulating film may be set in a range of 5 to 90 degree. The sectional form may be not only the rectangular depression-and-projection form but also a sawtooth depression-and-projection form.

Figure 27:
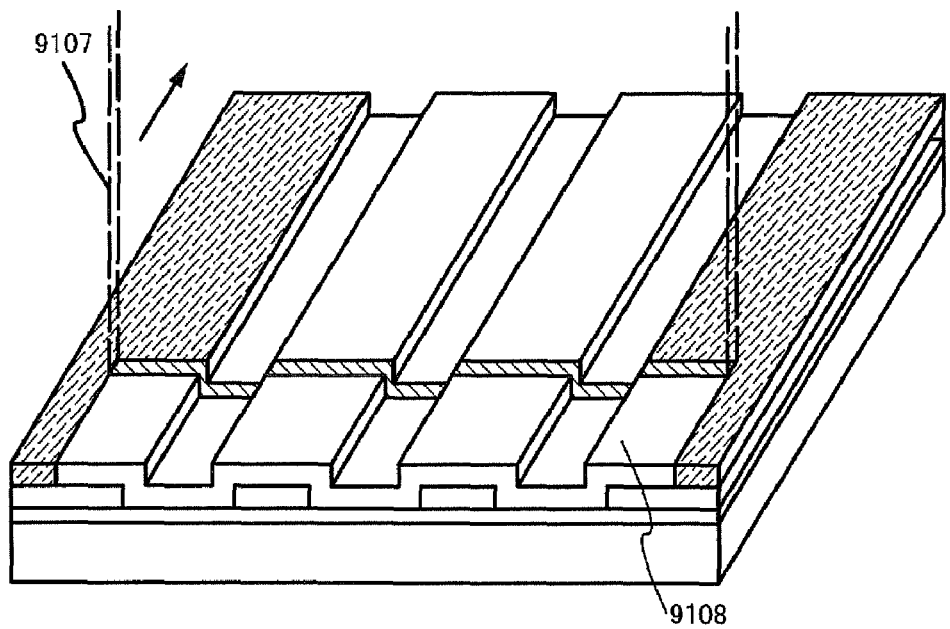
FIG. 27 is a perspective diagram for explaining a construction of a semiconductor device and a method of producing the semiconductor device according to the present invention.

As shown in FIG. 27, the amorphous semiconductor film 9108 of 50 to 200 nm in thickness covers the projection top portions, depression bottom portions and grade-change side surfaces of the first insulating film 9102 and the second insulating films 9103 to 9106 of the primary insulating film. The amorphous semiconductor film is formed by silicon, a compound or alloy of silicon and germanium or a compound or alloy of silicon and carbon. Among them, silicon is the most suitable material.

Then, a continuous wave laser beam 9107 is irradiated to the amorphous semiconductor film 9108 for the crystallization. The laser beam to be applied is formed by gathering the laser beams linearly by using an optical system. The strength distribution may have a uniform area longitudinally and a distribution transversely. A laser oscillating device to be used as an optical source may be a rectangular beam solid laser oscillating device, and, more preferably, may be a slab laser oscillating device. Alternatively, the laser oscillating device may be a solid laser oscillating device using a rod to which Nd, Tm or Ho is doped. Especially, the laser oscillating device may be a combination of a slab-structured amplifier and a solid laser oscillating device using crystal obtained by doping Nd, Tm or Ho into crystal such as YAG, $YVO_4$, YLF and $YAlO_3$. As shown in an arrow in FIG. 27, scanning is performed in a direction crossing the linear longitudinal direction. In this case, the most preferable scanning is performed in a direction parallel to the longitudinal direction of the strip pattern on the primary insulating film. The "linear" herein refers to a state where a traverse length to a longitudinal length is 1 to 10 or more.

The slab material may be crystal such as ND: YAG, Nd: GGG (gadolinium gallium garnet) and Nd: GsGG (gadolinium scandium gallium garnet). The slab laser travels in a zigzag optical path by repeating total reflection in the plate-like laser medium.

A wavelength of the continuous wave laser beam is desirably 400 to 700 nm in consideration of a light absorbing coefficient of the amorphous semiconductor film. The light in the wavelength band can be obtained by extracting a second harmonic and a third harmonic of a fundamental wave by using a wavelength converting element. The wavelength converting element may be ADP (ammonium dyhydrogen phosphate), $Ba_2NaNb_5O_{15}$ (barium sodium niobate), CdSe (cadmium selenide), KDP (kalium dyhydrogen phosphate), $LiNbO_3$ (lithium niobate), Se, Te, LBO, BBO or KB5. Especially, LBO is preferably used. In a typical example, a second harmonic wave (532 nm) of $Nd:YVO_4$ laser oscillating device (fundamental wave of 1064 nm) is used. The laser oscillating mode is a single mode, which is $TEM_{00}$ mode.

Areas of the most suitable silicon have absorbing coefficients $10^3$ to $10^4$ $cm^{-1}$, as a substantially visible light range. When a substrate of glass, for example, having higher visible light transmissivity and an amorphous semiconductor film of silicon of 30 to 200 nm in thickness are crystallized, light having a visible light range having a wavelength of 400 to 700 nm is irradiated thereto. Then, the semiconductor area is selectively heated. Thus, the crystallization can be implemented without damaging on the primary insulating film. More specifically, light having a wavelength of 532 nm can enter to an amorphous semiconductor film about 100 nm to 1000 nm. Thus, the light can reach enough to the inside of the amorphous semiconductor film 9106 of 30 nm to 200 nm in thickness. In other words, the semiconductor film can be heated from the inside. Then, almost the whole of the semiconductor film in the laser-beam-irradiated area can be heated uniformly.

FIGS. 30A to 30C are vertical section diagrams for explaining the crystallization. As shown in FIG. 30A, the first insulating film 9102, the second insulating films 9103 to 9106 and the amorphous semiconductor film 9108 are formed on the substrate 9101. Then, as shown in FIG. 30B, the laser beam 9107 is irradiated thereto for the crystallization. The boundary portion in contact with the first insulating film 9102 and the side walls of the second insulating films 9103 to 9106 may be cooled and be hardened the earliest. The crystallization starts from there, and crystal grows toward the projection top portion. The first insulating film and the second insulating films are stacked on the projection top portion. Therefore, the thermal capacity is larger than and the cooling speed is lower than those of the other areas. As a result, large crystal grains can grow. The grade change is stretched in the crystal growing direction. Due to the shape-related cause, distortion is caused extensively, and the internal stress is accumulated.

This condition is shown in FIG. 30C schematically. Distortion is accumulated in the grade change 9503 in the crystalline semiconductor film 9108. Sometimes, a crack may occur. On the other hand, crystal formed in the depression bottom portion produces a crystalline semiconductor film in which distortion is alleviated. The crystalline semiconductor film formed in this depression bottom portion can be regarded as single crystal or substantial single crystal area.

Figure 28:
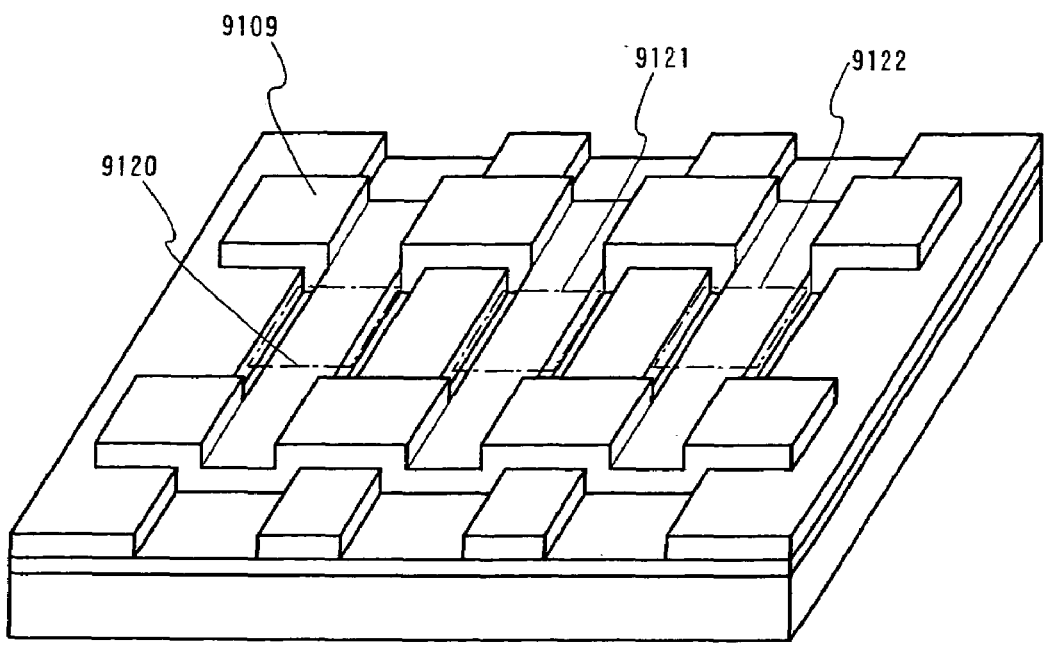
FIG. 28 is a perspective diagram for explaining a construction of a semiconductor device and a method of producing the semiconductor device according to the present invention.

After the crystallization ends, an active layer 9109 formed by a crystalline semiconductor film is formed by etching as shown in FIG. 28. Channel forming regions 9120 to 9122 (regions surrounded by schematic dotted line) are provided on a depression bottom portion of the primary insulating film, that is, on the second insulating films in the active layer 9109. A grade change area in which crystal grain boundaries and/or distortion extended from the projection top portion are accumulated is removed such that crystal cannot occur in the channel forming regions.

In the active layer 9109 shown in FIG. 28, multiple rectangular semiconductor areas arranged in parallel are integrally formed with a pair of semiconductor areas connecting the rectangular semiconductor areas. In each of the multiple rectangular semiconductor areas in the active layer, electrodes crossing through an insulating film may be provided. Thus, a channel forming region can be formed there. Alternatively, in this active layer, multiple rectangular semiconductor areas arranged in parallel are connected in series. Then, a pair of semiconductor areas connecting at the both ends may be integrally formed. Then, the multiple rectangular semiconductor areas extend in a direction parallel to the channel length direction. Alternatively, the crystal directs to the same direction in the channel forming region.

Figure 29:
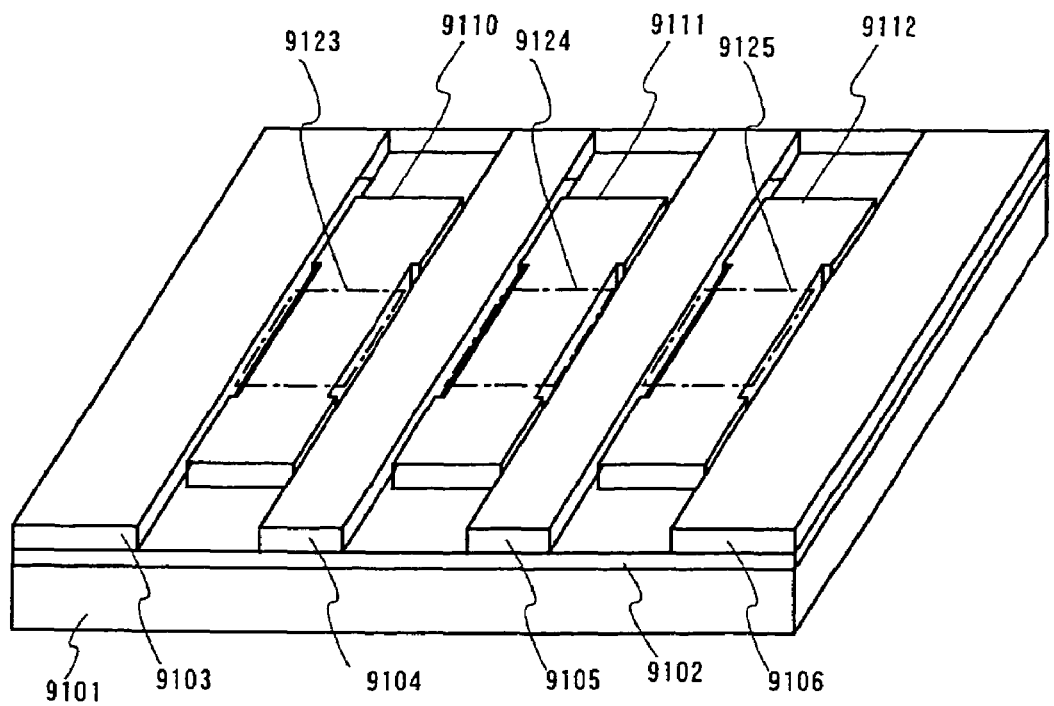
FIG. 29 is a perspective diagram for explaining a construction of a semiconductor device and a method of producing the semiconductor device according to the present invention.

As another embodiment, as shown in FIG. 29, crystalline semiconductor film 9110 to 9112 may be formed by corresponding to the second insulating films 9103 to 9106. By providing a gate electrode, channel forming regions 9123 to 9125 may be provided in a TFT.

FIGS. 31A and 31B show an example of a construction of a laser processing apparatus, which can be applied for crystallization. FIGS. 31A and 31B are a front view and an elevation view, respectively, of the construction of the laser processing apparatus. The laser processing apparatus includes a laser oscillating device 9301, a shutter 9302, high conversion mirrors 9303 to 9306, a slit 9307, cylindrical lenses 9308 and 9309, a mount base 9311, driving units 9312 and 9313 for shifting the mount base 9311 in an X direction and in a Y direction, a control unit 9314 for controlling the driving unit, and an information processing unit 9315 for sending signals to the laser oscillating device 9301 and/or the control unit 9314 based on a pre-stored program.

A laser beam gathered by the cylindrical lenses 9308 and 9309 linearly in a sectional form on the irradiated surface is entered diagonally with respect to the surface of a substrate 320 of the mount base 9311. The focus point is displaced due to the aberration such as astigmatic aberration. Thus, a linear light gathering surface can be formed on the irradiated surface or near the irradiated surface. When the cylindrical lenses 9308 and 9309 are made of synthetic quartz, higher transmissivity can be obtained. The surface of each of the lenses is coated in order to achieve 99% of transmissivity for the wavelength of laser beams. Naturally, the sectional form of the irradiated surface is not limited to the linear form and may be a rectangle, oval, oblong or the other arbitrary form. In all of the cases, the ratio of the minor axis to the major axis falls in a range of 1 to 10 to 1 to 100. A wavelength converting element 9310 is provided for obtaining a harmonic wave of a fundamental wave.

As described above, a rectangular beam solid laser oscillating device is applied as the laser oscillating device. More preferably, a slab laser oscillating device is obtained. Alternatively, the laser oscillating device may be a combination of a solid laser oscillating device using crystal in which Nd, Tm or Ho are doped to crystal such as YAG, YVO$_4$, YLF and YAlO$_3$ and a slab-structured amplifier. The slab material may be crystal such as Nd: YAG, Nd: GGG (gadolinium gallium garnet) and Nd: GsGG (gadolinium scandium gallium garnet). Additionally, a gaseous laser oscillating device or a solid laser oscillating device, which can oscillate continuously, may be applied. As the continuous wave solid laser oscillating device, a laser oscillating device using crystal in which Cr, Nd, Er, Ho, Ce, Co, Ti or Tm is doped to crystal such as YAG, YVO$_4$, YLF and YAlO$_3$. A fundamental wave of an oscillating wavelength depends on a material to be doped. However, oscillation is performed by having a wavelength of 1 μm to 2 μm. In order to obtain higher outputs, a diode-excited solid laser oscillating device is applied, which can be connected in a cascade manner.

The mount base 9311 is moved by the driving units 9312 and 9313 in directions of two axes such that laser processing can be performed on the substrate 9320. The mount base 9311 can be moved by a distance longer than a length of one side of the substrate 9320 in one direction continuously with constant velocity of 1 to 200 cm/sec. and preferably 5 to 50 cm/sec. The mount base 9311 can be moved by a distance equal to a longitudinal length of a linear beam in the other direction discontinuously and in a stepwise manner The oscillation by the laser oscillating device 9101 and the movement of the mount base 9311 are operated in synchronous with the information processing unit 9315 having a microprocessor The mount base 9311 moves straight in the X direction shown in FIG. 31A such that a laser beam irradiated from a fixed optical system can process an entire surface of the substrate. A position detecting means 9316 detects that the substrate 9320 is located at a position irradiated by the laser beam. Then, the position detecting unit 9316 transmits the signal to the information processing unit 9315. Thus, the information processing unit 9315 causes the timing to be synchronized with the oscillating operation by the laser oscillating device 9301. In other words, when the substrate 9320 is not at the laser beam irradiated position, the laser oscillation is stopped. As a result, the life can be extended.

A laser beam irradiated to the substrate 9320 by the laser irradiating apparatus having the construction is relatively moved in the X-direction or Y-direction shown in FIGS. 31A and 31B. Thus, the laser beam can process a desired area or the entire surface of the semiconductor film.

In this way, for the crystallization by irradiating a continuous wave laser beam to an amorphous semiconductor film, grade changes are provided in a primary insulating film. Thus, distortion and/or stress caused by the crystallization can be concentrated on the grade change. Therefore, the distortion and/or the stress are not imposed on a crystalline semiconductor to be an active layer. A TFT may be formed such that a channel forming region can be provided in the crystalline semiconductor film free from the distortion and/or the stress. Thus, the current driving ability can be improved fast. Then, the reliability of the element can be also improved.

Next, a method of irradiating laser light used in the present invention will be described with reference to FIGS. 2A to 2D.

Figure 1A:
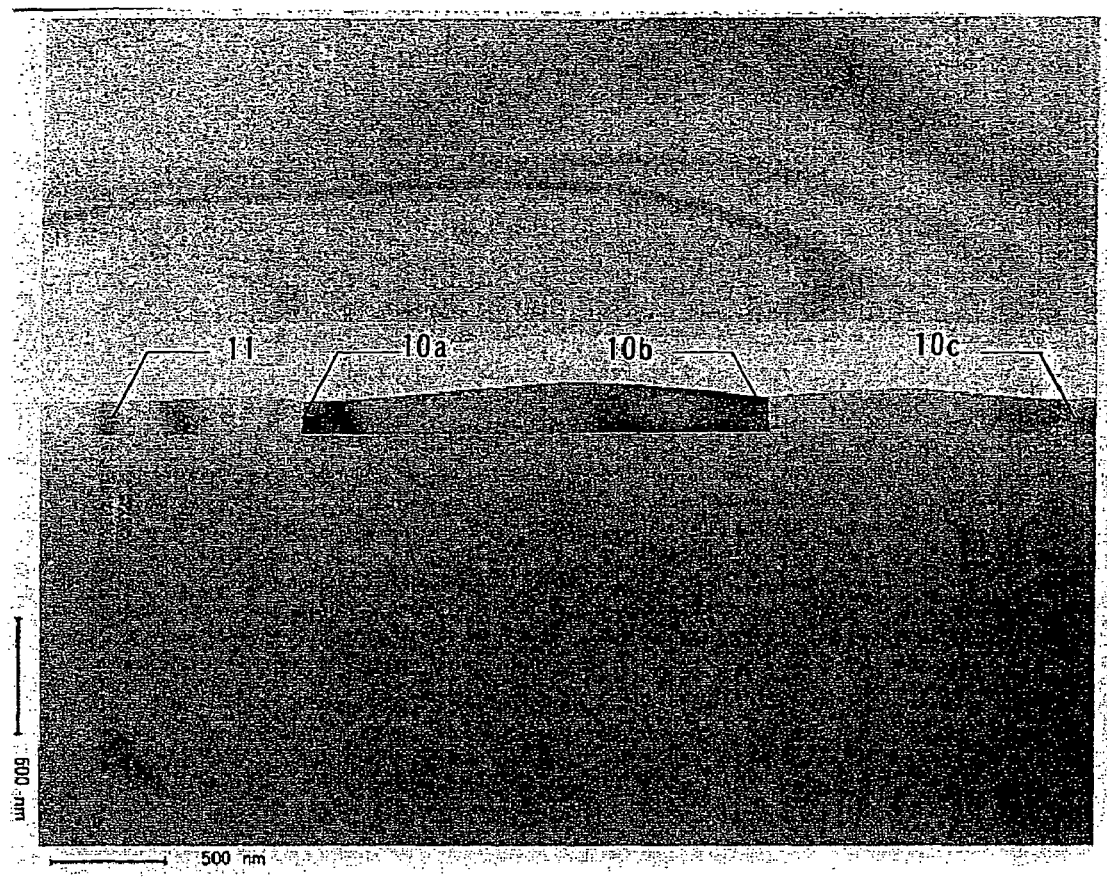
FIGS. 1A and 1B show a TEM sectional image and a schematic sectional diagram of a crystallized semiconductor film.
Figure 1B:
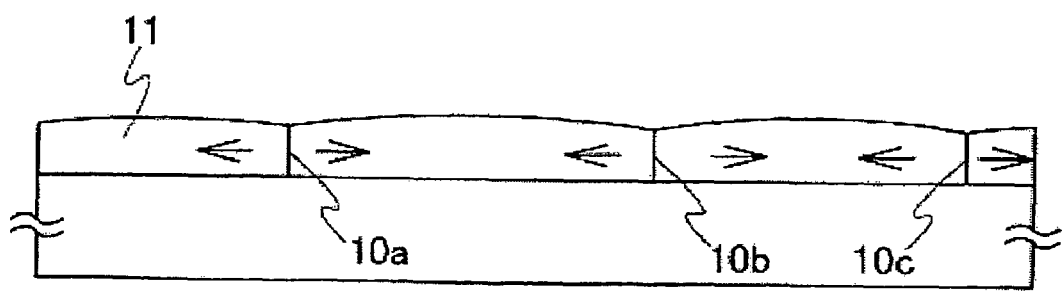
Figure 2A:
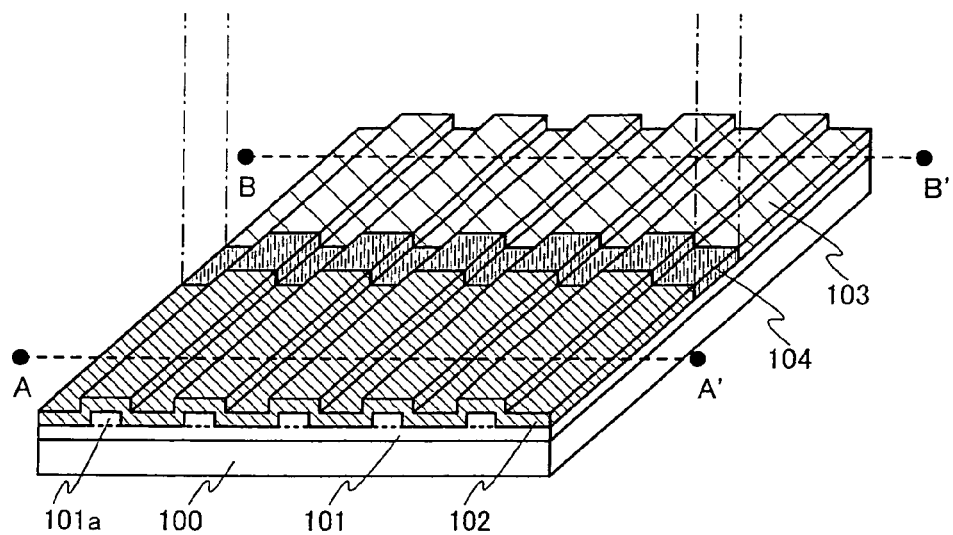
FIGS. 2A to 2D show states where laser light is irradiated to a semiconductor film.

First of all, as shown in FIG. 2A, an insulating film 101 is formed on a substrate 100. The insulating film 101 includes stripe projections 101a. A method of forming the projections and depressions will be described in detail later. The insulating film 101 may be a silicon oxide film, a silicon oxide nitride film or a silicon nitride film. In this case, the other insulating film may be used which can prevent impurities such as alkali metal from intruding into a semiconductor film to be formed later, and which has an insulating characteristic resisting a temperature caused by later processing. Additionally, projection and depressions need to be able to form on the film. Alternatively, a structure stacking two or more films can be adopted.

Here, a marker may be formed by using a part of the insulating film 101 simultaneously with forming the insulating film 101.

The substrate 100 only needs to be made of a material resisting a processing temperature in later steps. For example, the substrate 100 may be a quartz substrate, a silicon substrate, a glass substrate of barium borosilicate glass or aluminosilicate glass, or a substrate in which an insulating film is formed on a surface of a metal substrate or a stainless substrate. Alternatively, a plastic substrate may be used which is heat-proof resisting the processing temperatures.

Next, a semiconductor film 102 is formed to cover the insulating film 101. The semiconductor film 102 can be formed by using a publicly-known method (such as Sputtering method, LPCVD method, and Plasma CVD method). The semiconductor film may be an amorphous semiconductor film, a microcrystal semiconductor film or a crystalline semiconductor film. Not only silicon but also silicon germanium may be used.

Here, projections and depressions appear on the semiconductor film 102 along the projection and depressions of the insulating film 101. The projections 101a of the insulating film 101 must be formed in consideration of a thickness of the semiconductor film 102 such that depression and projections can appear on the surface of the semiconductor film 102, which will be formed later.

Next, as shown in FIG. 2A, laser light is irradiated to the semiconductor film 102. Then, a semiconductor film (after LC) 103 is formed having higher crystallinity. The energy density of the laser light is lower near an edge of a laser beam 104. Therefore, crystal grains are smaller near the edge. As a result, a projected part (ridge) appears along the crystal grain boundary. Thus, the edge of a track of the laser beam 104 of the laser light is prevented from overlapping with a part to be a channel forming region or a flat surface of a depression between the projections 101a of the semiconductor film 102.

The scanning direction of the laser light is defined to be parallel with a direction of the projections 101a, as indicated by an arrow.

In the present invention, publicly known laser can be used. Desirably, the continuous wave laser light is used. However, the effects of the present invention can be obtained even if the pulse laser light is used. The laser may be gaseous laser or solid laser. The gaseous laser may be excimer laser, Ar laser, Kr laser or the like. The solid laser may be YAG laser, YVO$_4$ laser, YLF laser, YAlO$_3$ laser, glass laser, ruby laser, alexandrite laser, Ti:sapphire laser, Y$_2$O$_3$ laser or the like. The solid laser may be laser using crystal such as YAG, YVO$_4$, YLF and YAlO$_3$ to which Cr, Nd, Er, Ho, Ce, Co, Ti, Yb or Tm is doped. A fundamental wave of the laser depends on a material to be doped. Laser light having a fundamental wave of around 1 μm can be obtained. A harmonic wave for the fundamental wave can be obtained by using a non-linear optical element.

Infrared laser light emitted from the solid laser is converted to green laser light by the non-linear optical element. After that, ultraviolet laser light is obtained by another non-linear optical element. The ultraviolet laser light can be used.

Figure 2B:
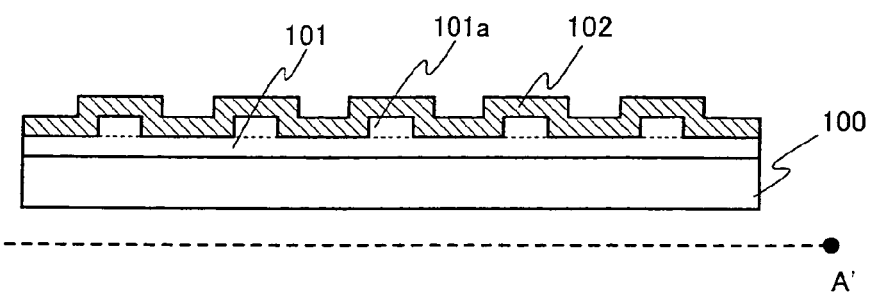
Figure 2C:
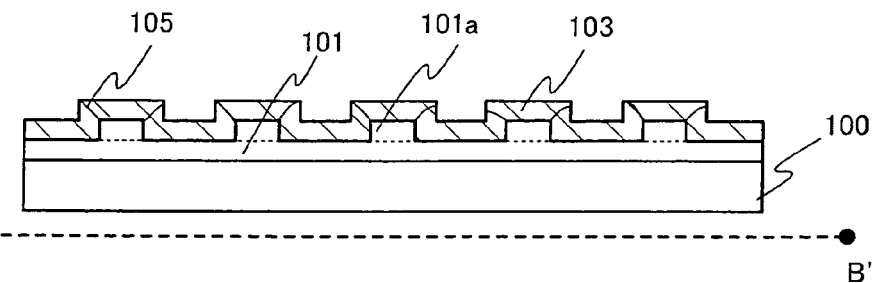
Figure 2D:
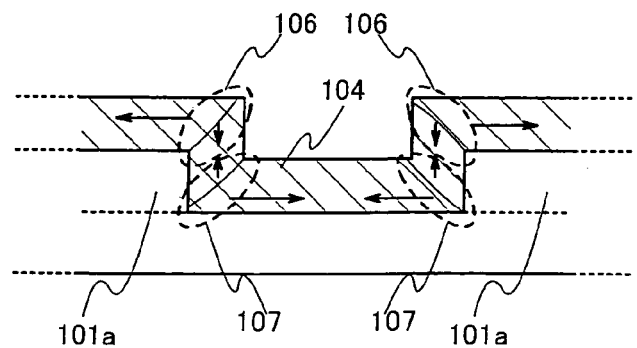

FIG. 2B is a sectional diagram of FIG. 2A taken at a line A-A', which is before crystallization. FIG. 2C is a sectional diagram of FIG. 2A taken at a line B-B', which is after crystallization. In the semiconductor film (after LC) 103 crystallized by laser light irradiation, stress concentrates near the edges of projections or near the edges of depressions. Thus, a grain boundary 105 can occur easily. FIG. 2D shows a magnified diagram of the depression of the semiconductor film 103 after crystallization. Arrows indicate directions of internal stress. Stress concentrates at a part 106 near the edge of the projection of the semiconductor film 103 and a part 107 near the edges of the depression of the semiconductor film 103. Then, grain boundaries 105 may occur. However, smaller stress occurs in a top flat part of the depression 101a than the stress near the edge of the depression. Therefore, grain boundaries are hard to occur. Even grain boundaries occur, a larger crystal grain can be obtained.

Figure 3A:
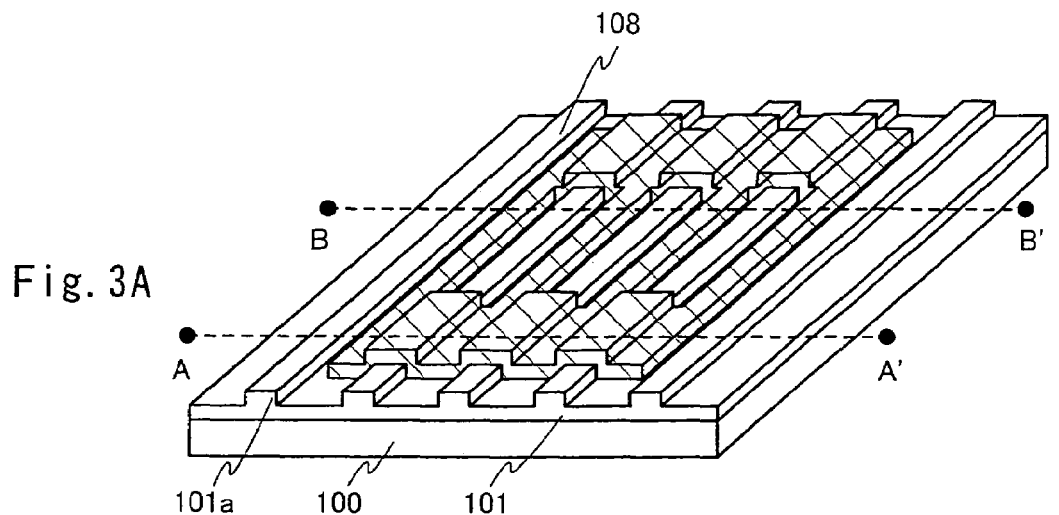
FIGS. 3A to 3C show an island formed by patterning a crystallized semiconductor film.

Next, as shown in FIG. 3A, in order to remove the part near the edges of the projections or near the edges of the depressions and the projections, the semiconductor film 103 after crystallization is patterned. Then, by using a top flat part of the depression between the projections 101a having good crystallinity, island-shaped semiconductor film (called "island, hereinafter) 108 is formed.

Figure 3B:
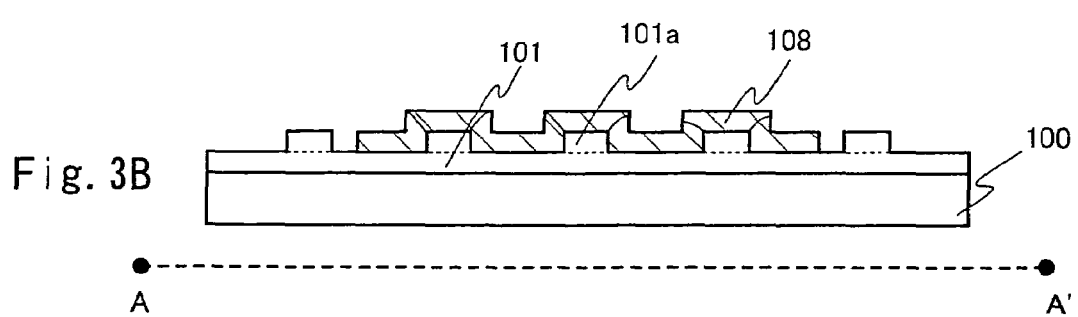
Figure 3C:
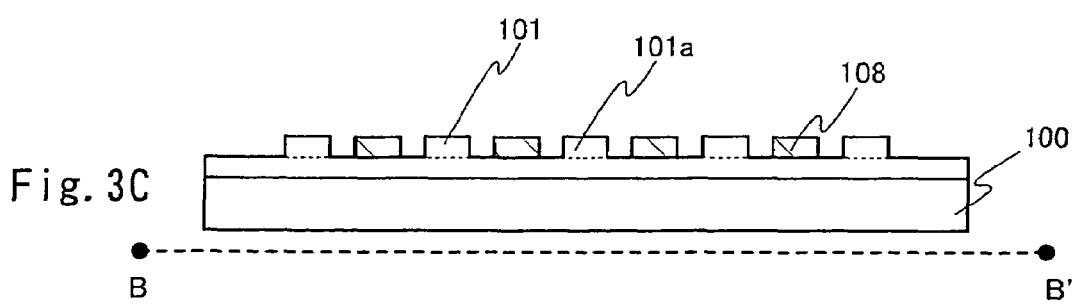

In this example, the semiconductor film 103 is patterned so as to leave the part near the edges of the projections or near the edges of the depressions and the projections partly. Thus, as shown in FIG. 3A, each of the islands 108 is formed to be use as a slit-shaped active layer from which a channel forming region is only separated. FIG. 3B shows a section diagram the island 108 taken at a line A-A'. FIG. 3C shows a section diagram of the island 108 taken at a line B-B'. A part to be a source region or a drain region does not have larger effect of the semiconductor film crystallinity on TFT characteristics than that of the channel forming region. Therefore, the parts near the edge of the projection and near the edge of the depression having poor crystallinity may be left, which is not much problematic.

Figure 4A:
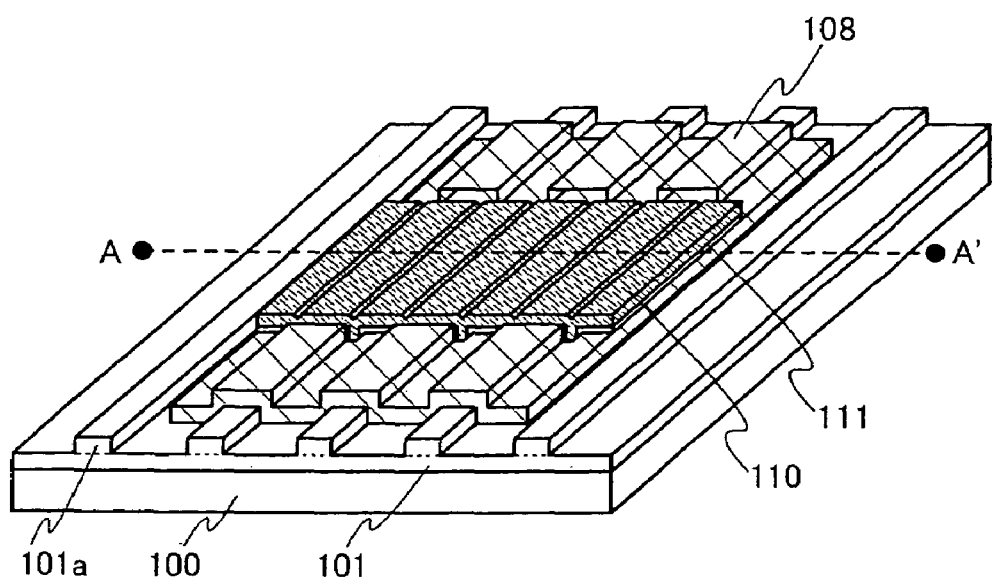
FIGS. 4A and 4B show a construction of a TFT formed by using the island shown in FIG. 3.

Next, as shown in FIG. 4A, a gate insulating film 110 is formed so as to cover at least a part to be a channel forming region of the island 108. In FIG. 4A, a part to be a source region or a drain region is exposed. However, the entire island 108 may be covered by the gate insulating film 110.

Figure 4B:
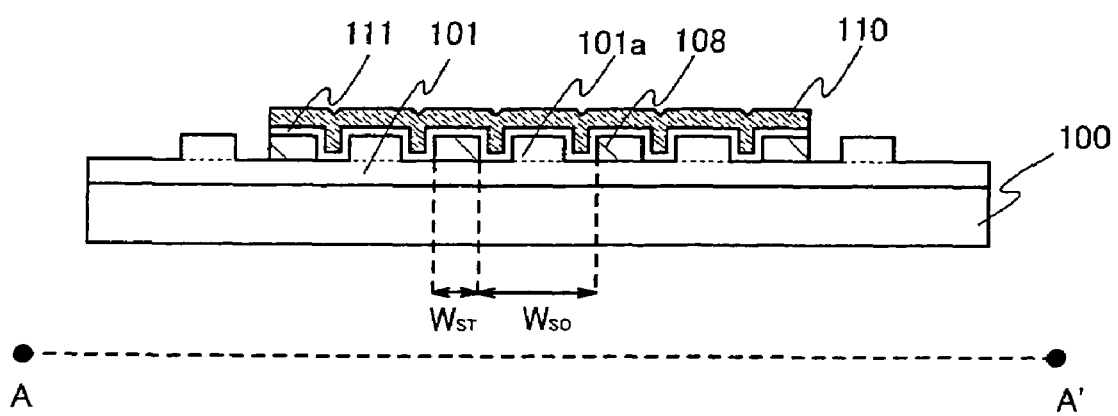

Next, a conductive film is formed and is patterned in order to form a gate electrode 111. FIG. 4B shows a section diagram taken as a line A-A' in FIG. 4A. The gate electrode 111 overlaps with all of the channel forming regions.

Through these production steps, a TFT having multiple channel forming regions, which separate from each other, is completed. With this construction, when a channel width of each of the channel forming regions is long, ON-current can be obtained. At the same time, heat caused by driving the TFT can be released efficiently.

When a ratio of a channel width of each of the channel forming regions is $W_{ST}$ and a width between two of the channel forming regions is $W_{SO}$, the ratio between the $W_{ST}$ and the $W_{SO}$ can be set by a designer as appropriately. More preferably, $3W_{ST}$ is substantially equal to $W_{SO}$.

Figure 5:
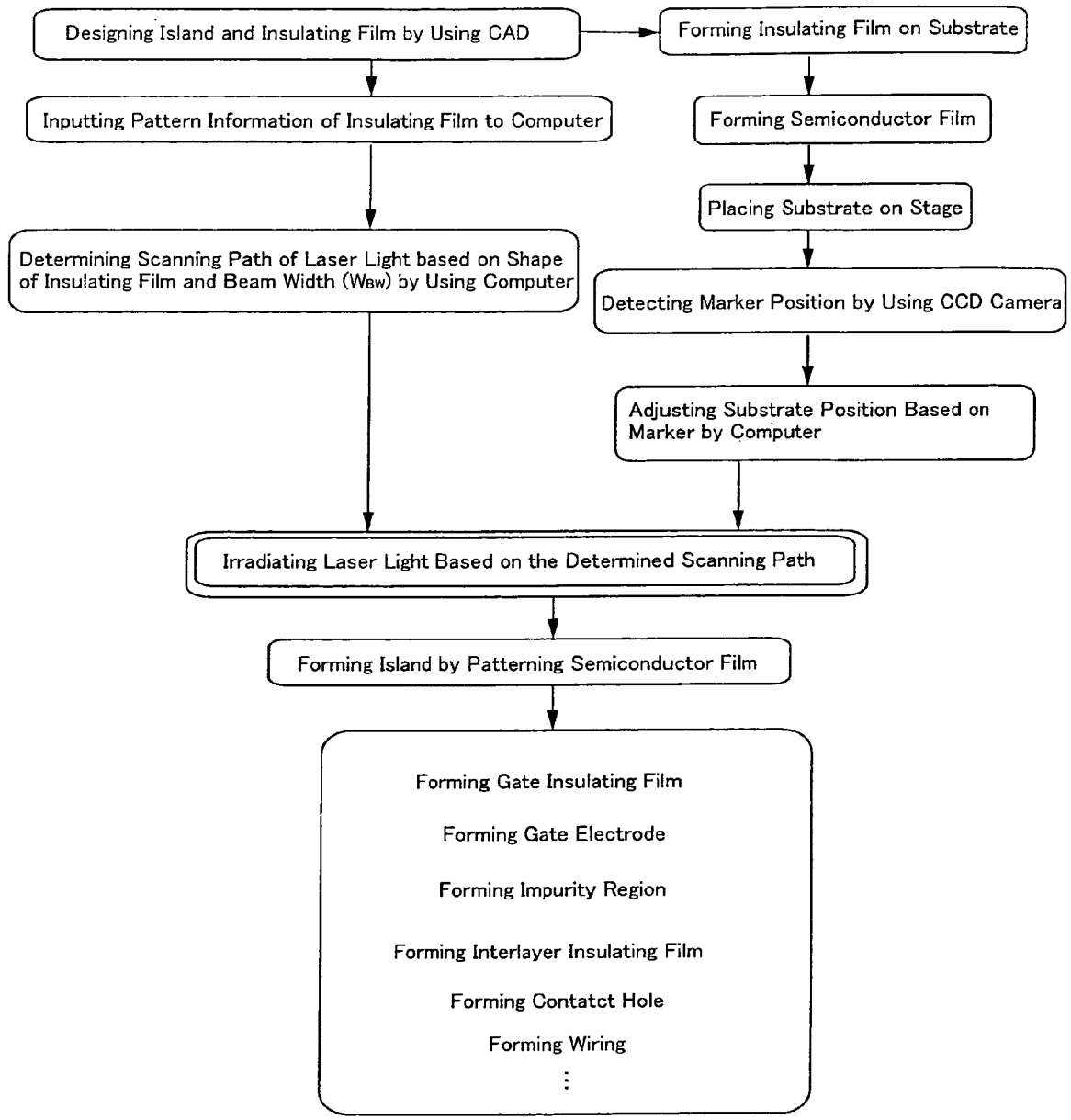
FIG. 5 is flowchart of a producing system according to the present invention.

Next, a producing system according to the present invention will be described. FIG. 5 shows a flowchart of the producing system according to the present invention. First of all, a mask for the islands is designed. Next, a form of an insulating film is designed to have stripe or rectangular projections and depressions. Here, one or multiple islands are laid out on a flat surface of the depression of the insulating film. Then, when the islands are used as an active layer of a TFT, the direction that carriers move is desirably the same as the direction of the stripe of the insulating film or the direction of the longer or shorter sides of the rectangle. However, these directions may be differentiated intentionally in accordance with the application.

Here, the form of the insulating film may be designed such that a marker can be formed in a part of the insulating film.

Information (pattern information) regarding a form of the designed insulating film is input to a computer of the laser irradiating apparatus and is stored in the memory unit. The computer determines a laser light scanning path based on the input insulating film pattern information and a width in a direction perpendicular to the scanning direction of a laser beam. In this case, the scanning path needs to be determined such that an edge of a track of laser light and a flat surface of the depression of the insulating film cannot overlap with each other. In addition to the insulating film pattern information, island pattern information is stored in the memory unit of the computer. Thus, the scanning path may be determined such that an edge of a track of laser light and the island or the channel forming region of the island cannot overlap with each other.

When a slit is provided to control a width of a laser beam, the computer can identify a width of the depression of the insulating film in the direction perpendicular to the scanning direction based on the input insulating film pattern information. In consideration of the width of the depression of the insulating film, a width of the slit in the direction perpendicular to the scanning direction is set such that the edge of the track of the laser light and the flat surface of the depression of the insulating film cannot overlap with each other.

On the other hand, an insulating film is formed on a substrate in accordance with the designed pattern. Next, a semiconductor film is formed on the insulating film. After forming the semiconductor film, the substrate is placed on a stage of the laser irradiating apparatus so as to position the substrate. In FIG. 5, a marker is detected by using a CCD camera to position the substrate. The CCD camera refers to a camera using charge-coupled device (CCD) as an imaging element.

Alternatively, pattern information of the insulating film or the semiconductor film on the substrate placed on the stage is detected by using the CCD camera, for example. Then, the pattern information of the insulating film or the semiconductor film designed by a CAD in the computer is compared with the pattern information of the insulating film or the semiconductor film formed on the substrate actually, which is obtained by using the CCD camera. Then, the substrate may be positioned.

Then, laser light is irradiated by following a determined scanning path so as to crystallize the semiconductor film.

Next, after irradiating the laser light, the semiconductor film having crystallinity improved by the laser light irradiation is patterned. Thus, an island is formed. After that, a TFT is produced from the island. The concrete process for producing the TFT depends on the form of the TFT. However, typically, a gate insulating film is deposited, and an impurity region is formed in the island. Then, an interlayer insulating film is formed so as to cover the gate insulating film and a gate electrode. Then, a contact hole is formed in the interlayer insulating film. A part of the impurity region is exposed. Then, a wire is formed on the interlayer insulating film so as to be in contact with the impurity region through the contact hole.

Figure 6:
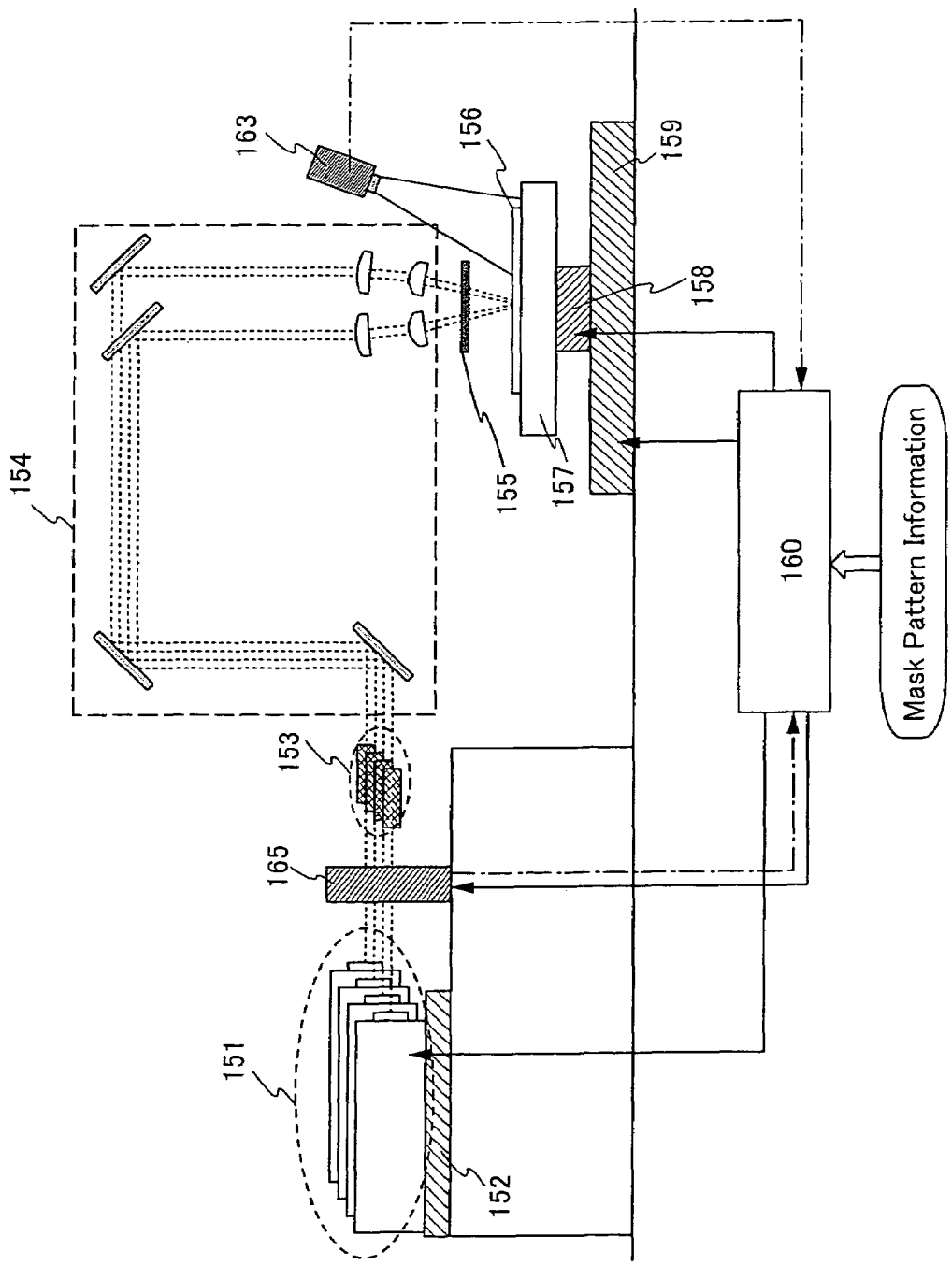
FIG. 6 shows a laser irradiating apparatus.

Next, a construction of the laser irradiating apparatus used in the present invention will be described with reference to FIG. 6. The laser irradiating apparatus includes a laser oscillating device 151. Four laser oscillating devices are shown in FIG. 6. However, the number of the laser oscillating devices of the laser irradiating apparatus are not limited thereto.

The laser oscillating device 151 may keep a constant temperature by using a chiller 152. The chiller 152 is not always necessary. However, keeping the temperature of the laser oscillating device 151 constant can prevent variations in energy of output laser light depending on the temperature.

The laser irradiating apparatus further includes an optical system 154. The optical system 154 changes an optical path output from the laser oscillating device 151, or processes a form of the laser beam and gathers laser light. In addition, the optical system 154 of the laser irradiating apparatus in FIG. 6 can combine laser beams of laser light output from the multiple laser oscillating devices 151 by overlapping them partially.

An AO modulator 153, which can change a direction that laser light travels in an extremely short period of time may be provided in an optical path between a substrate 156 to be processed and the laser oscillating device 151. Instead of the AO modulator, an attenuator (light-amount adjusting filter) may be provided to adjust an energy density of laser light.

An energy density measuring unit 165 may be provided in an optical path between the substrate 156 to be processed and the laser oscillating device 151 for measuring an energy density of laser light output from the laser oscillating device 151. Then, changes in the measured energy density with a lapse of time may be monitored in the computer 160. In this case, in order to compensate attenuation in energy density of laser light, the output from the laser oscillating device 151 may be raised.

The resultant laser beam is irradiated, through a slit 155, to the substrate 156. The slit 155 can block laser light and is desirably formed by a material, which is not deformed or damaged by laser light. A width of the slit 155 is variable. A width of a laser beam may be changed in accordance with the width of the slit.

On the substrate 156, a form of the laser beam of laser light oscillated from the laser oscillating device 151 not through the slit 155 depends on the type of laser. In addition, the form may be defined by using an optical system.

The substrate 156 is mounted on a stage 157. In FIG. 6, position-control units 158 and 159 correspond to units for controlling a position of a laser beam on an object. The position of the stage 157 is controlled by the position-control units 158 and 159.

In FIG. 6, the position-control unit 158 controls a position of the stage 157 in the X-direction. The position-control unit 159 controls a position of the stage 157 in the Y-direction.

The laser irradiating apparatus in FIG. 6 includes the computer 160 having a storage unit such as a memory and a central processing unit. The computer 160 controls oscillation by the laser oscillating device 151. The computer 160 determines a scanning path of laser light and controls the position-control units 158 and 159 such that laser beams of laser light can be scanned in accordance with the determined scanning path. Then, the substrate can be moved to a predetermined position.

In FIG. 6, the laser beam position is controlled by moving the substrate. However, the laser beam may be moved by using an optical system such as a galvano-meter mirror, or the combination thereof may be used.

In FIG. 6, the computer 160 controls the width of the slit 155 such that a laser beam width can be changed in accordance with the mask pattern information. The slit is not always necessary.

The laser irradiating apparatus may include a unit for adjusting a temperature of an object. Laser light is light having higher orientation and energy density. Therefore, damper may be provided to prevent reflection light from being irradiated to an inappropriate part. The damper desirably has a characteristic of absorbing reflection light. Cold water may be circulated within the damper to prevent an increase in temperature of a diaphragm by absorbing reflection light. Furthermore, a substrate heating unit for heating a substrate may be provided in the stage 157.

In order to form a marker by using laser, a laser oscillating device for markers may be provided. In this case, the oscillation by the laser oscillating device for markers may be controlled in the computer 160. When the laser oscillating device for markers is provided, an optical system is additionally provided for gathering laser light output from the laser oscillating device for markers. Laser used for forming markers may be YAG laser or $CO_2$ laser typically. In addition, the other laser may be used to form markers.

For positioning by using markers, one or several CCD cameras 163 may be provided. The "CCD camera" refers to a camera using a charge-coupled device (CCD) as an imaging element.

Without markers, a pattern on an insulating film or a semiconductor film may be identified by using the CCD camera 163 to position the substrate. In this case, mask pattern information of the insulating film or the semiconductor film, which is input to the computer 160, is compared with actual pattern information of the insulating film or the semiconductor film, which is collected by the CCD camera 163. Thus, the substrate position information can be obtained. In this case, markers are not needed additionally.

Laser light incident to the substrate is reflected by the surface of the substrate and returns to the same optical path as the incident optical path (that is, becoming so-called "return light"). The return light has bad effects such as changes in laser output and/or frequency and/or destruction of rods. In order to stabilize the laser oscillation by removing the return light, an isolator may be provided.

Figure 7:
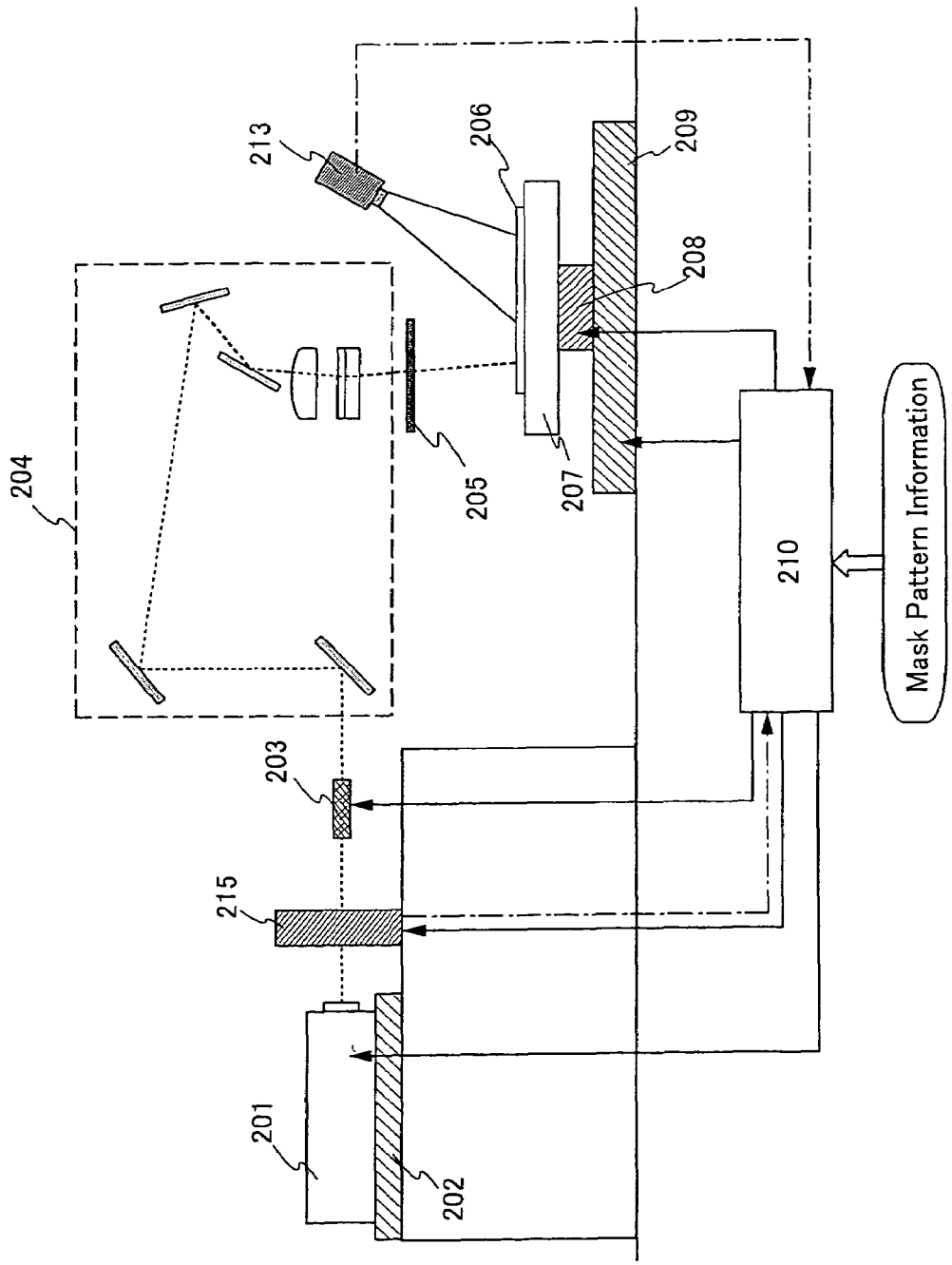
FIG. 7 shows a laser irradiating apparatus.

FIG. 6 shows the construction of the laser irradiating apparatus having the multiple laser oscillating devices. However, a single laser oscillating device may be used. FIG. 7 shows a construction of another laser irradiating apparatus having a single laser oscillating device. The laser irradiating apparatus in FIG. 7 includes a laser oscillating device 201, a chiller 202, an energy density measuring device 215, an AO modulator 203, an optical system 204, a slit 205 and a CCD camera 213. A substrate 206 is placed on the stage 207. The position of the stage 207 is controlled by an X-direction position-control unit 208 and an Y-direction position-control unit 209. Then, like the one' shown in FIG. 6, operations of the components of the laser irradiating apparatus are controlled by a computer 210. Unlike the one in FIG. 6, only one laser oscillating device is used. Unlike the case in FIG. 6, the optical system 204 only needs to have a function for gathering one laser light beam.

In this way, according to the present invention, after crystallization by using laser light, a part near edges of each depression or near edges of each projection in a semiconductor film is removed by patterning. Then, a part having good crystallinity around a center of the depression is used positively as an active layer of a TFT. Thus, a grain boundary can be prevented from forming in a channel forming region of the TFT, which can prevent a significant decrease in mobility, a decrease in ON-current and/or an increase in OFF current of the TFT due to the grain boundary. The part to be removed near the edge of the depression is determined by a designer appropriately.

Laser light does not need to be scanned and be irradiated to an entire semiconductor film. By scanning laser light such that at least only the required part can be crystallized, the time can be saved for irradiating laser light to a part to be removed by patterning after crystallizing the semiconductor film. Therefore, processing time taken for one substrate can be reduced significantly.

EXAMPLES

Examples of the present invention will be described below.

First Example

A first example is a case where a crystalline semiconductor film is formed on a primary insulating film having grade changes. Then, a TFT is produced in which a channel forming regions are provided in a crystalline semiconductor film on the projection top portion.

In FIGS. 32A to 32F, a first insulating film 9602, which is a silicon oxide nitride film of 100 nm in thickness, is formed on a glass substrate 9601. Then, a silicon nitride film is formed thereon, and second insulating films 9603 to 9607 are formed having a rectangular pattern by photo-engraving. The silicon oxide nitride film and the silicon nitride film are formed by Plasma CVD method.

Figure 34:
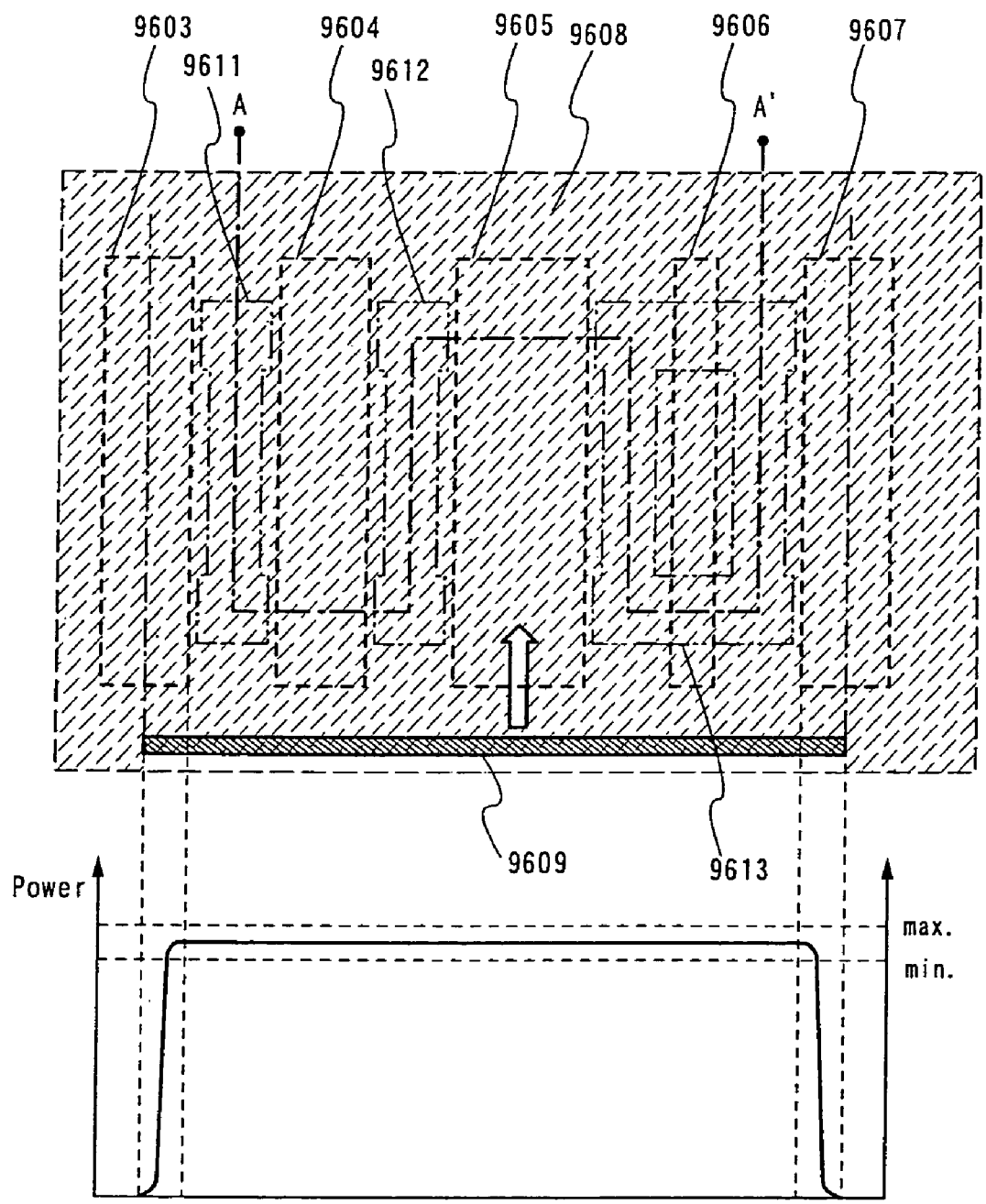
FIG. 34 is a top view for explaining a detail of crystallization according to the present invention.

After an amorphous silicon film 9608 of 150 nm in thickness is formed by Plasma CVD method, a continuous-wave laser beam is irradiated thereto for the crystallization. FIG. 34 is a top view thereof. FIG. 32A is a vertical section diagram taken at a line A-A' in FIG. 34. Areas 9611 to 9613 indicated by one-dashed lines over the second insulating films 9603 to 9607 are positions where active layers of the TFT are formed.

A linear laser beam 9609 having a uniform energy density distribution longitudinally is scanned and is irradiated. As a result, as shown in FIG. 32B, a crystalline semiconductor film 9610 is formed. The "uniform energy density distribution" does not refer to exclusion of those, which are not completely constant. An acceptable range for the energy density distribution is ±5%. The laser beam irradiation may be performed by the laser processing device having the construction shown in FIGS. 31A and 31B. Laser beams gathered by an optical system may have a uniform longitudinal area in the strength distribution. Laser beams may have a traverse distribution. Crystallization is arranged to have a uniform longitudinal uniform area in the strength distribution. Thus, an effect for raising crystal in a direction parallel to the scanning direction of a laser beam can be improved.

Figure 35:
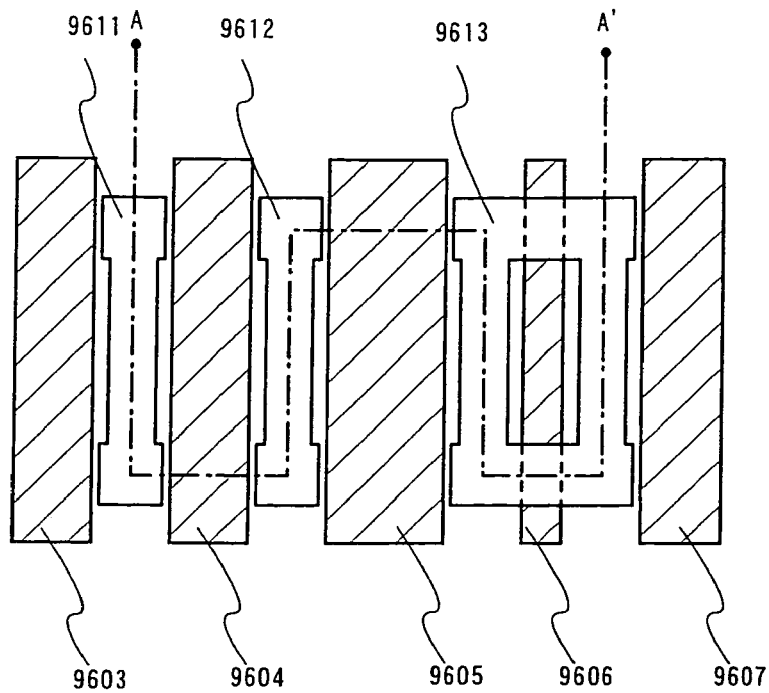
FIG. 35 is a top view for explaining a method of producing a semiconductor device according to the present invention.

After that, the first insulating film 9602 is etched in a form that a crystalline semiconductor film is left. As a result, active layers 9611 to 9613 are formed. FIG. 35 shows a top view of this state.

As shown in FIG. 32D, a gate insulating film 9614 is formed by a silicon oxide film. A conductive film 9615 forming a gate electrode is formed by tungsten or an alloy containing tungsten. Then, as shown in FIG. 32E, gate electrodes 9616 and 9617 are formed by photo-engraving.

Figure 33:
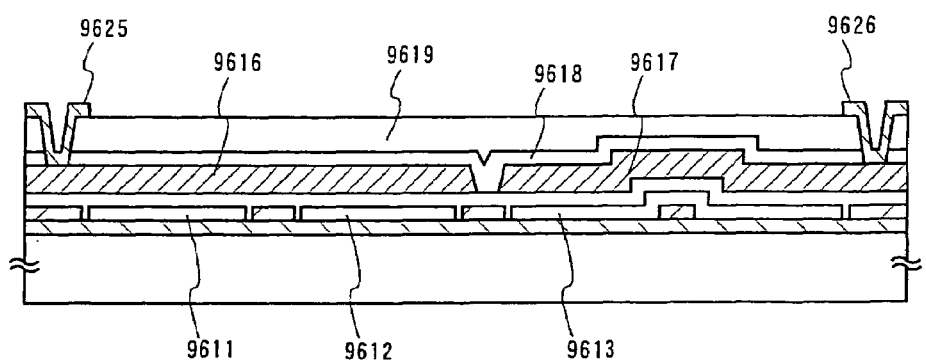
FIG. 33 is a vertical section diagram for explaining the method of producing the semiconductor device according to the present invention.
Figure 36:
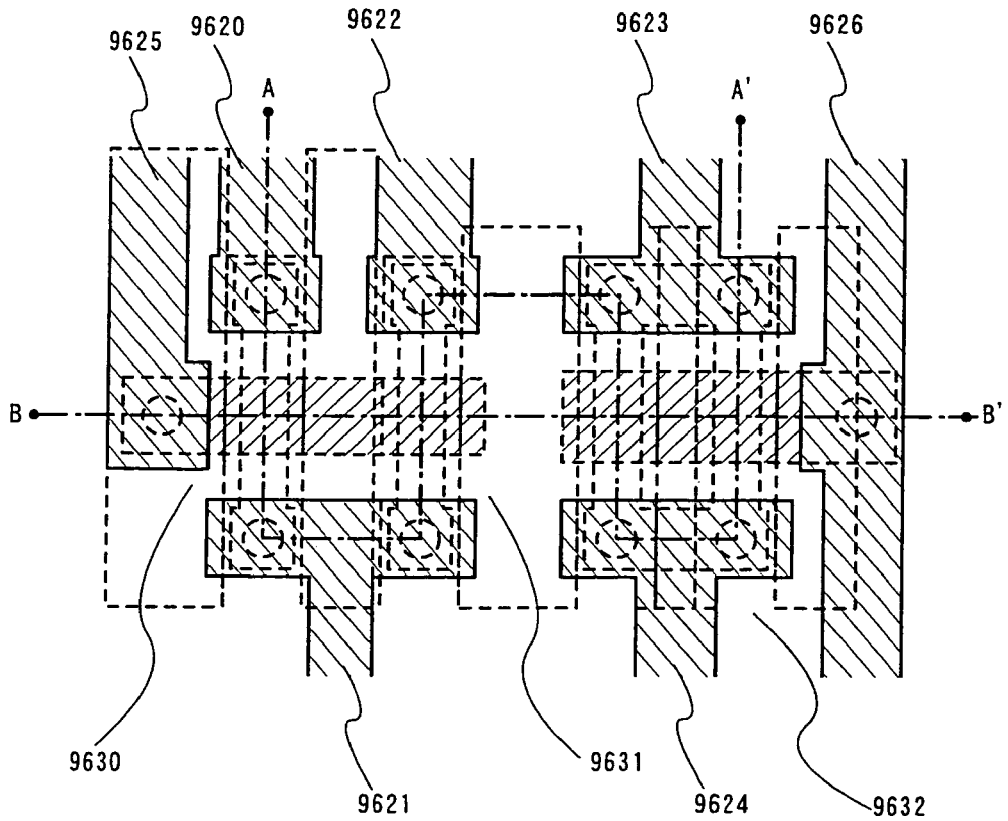
FIG. 36 is a top view for explaining a method of producing a semiconductor device according to the present invention.

Furthermore, a source region and a drain region are formed in each of the active layers by doping processing. As a result, a passivation film 9618 and a planarization film 9619 are formed. After forming a contact hole, wires 9620 to 9623 are formed on the planarization film 9619 by combining aluminum, titan and so on appropriately. Thus, an n-channel type TFT 9630 and a p-channel type TFT 9631, both of which are of the single channel type, and an n-channel type TFT 9632 of the multi-channel type are formed. FIG. 36 shows a top view of this state. FIG. 32F is a vertical section diagram taken at a line A-A' in FIG. 36. FIG. 36 shows an example where the single channel, n-channel type TFT 9630 and p-channel type TFT 9631 form an inverter circuit. FIG. 33 shows a vertical section diagram taken at a line B-B' in FIG. 36.

Figure 37:
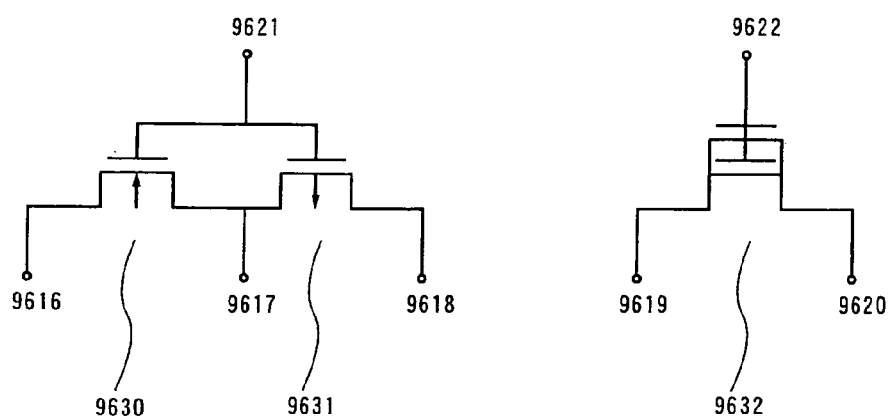
FIG. 37 is an equivalent circuit diagram corresponding to the top view of the TFT shown in FIG. 36.

FIG. 37 shows an equivalent circuit of the single-channel, n-channel type TFT 9630 and p-channel type TFT 9631 and the multi-channel, n-channel type TFT 9632. The multi-channel, n-channel type TFT 9632 forms one transistor by having multiple parallel channels between source and drain regions. In this way, by having parallel channel forming regions, a feedback is caused by resistance of the source and drain regions and/or resistance of a low density drain region. Thus, currents flowing the channels can be leveled out. By using the transistor with the construction, a variation in characteristic between multiple elements can be reduced.

Second Example

Like the first example, in order to form active layers, a laser beam may be irradiated to an amorphous semiconductor film for crystallization. However, after poly-crystallization, the laser beam may be further irradiated so as to improve the crystallinity. This two-level crystallization processing can form a crystalline semiconductor film having fewer distortions than those of the first example.

Figure 38A:
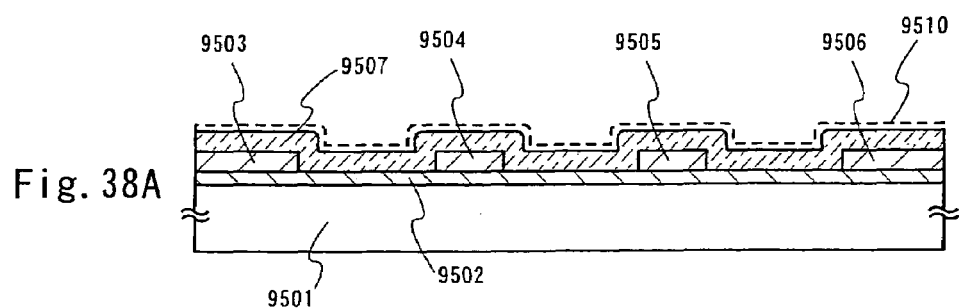
FIGS. 38A to 38C are vertical section diagrams for explaining details of crystallization according to the present invention.
Figure 38B:
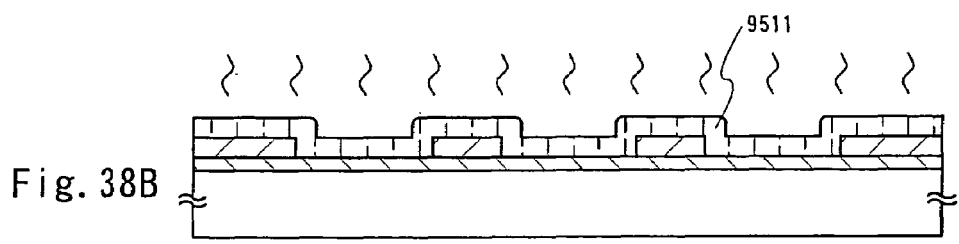
Figure 38C:
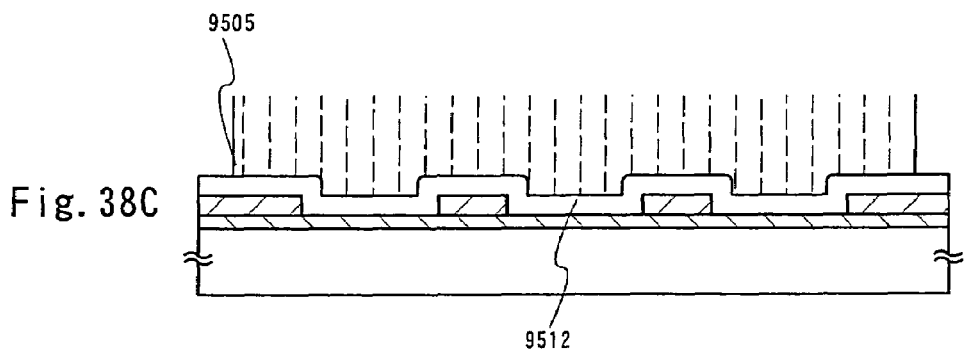

FIGS. 38A to 38C are vertical section diagrams showing the processing steps. In FIG. 38A, a first insulating film 9502, which is a silicon oxide nitride film of 100 nm in thickness, is formed on a glass substrate 9501. A silicon oxide film is formed thereon, and second insulating films 9503 to 9506 are formed having a rectangular pattern by photo-engraving. Then, an amorphous silicon film 9507 of 150 nm in thickness is formed thereon.

Ni is added to an entire surface of the amorphous semiconductor film 9507. Ni is a medium element, which can decrease a temperature for crystallizing silicon and can improve the orientational characteristic. A method of adding Ni is not limited and may be spin-coating method, vapor-deposition method or sputtering method. In the spin coating method, a solution containing 5 ppm nickel salt acetate is coated on the surface to form a medium-element containing layer 510. The medium element is not limited to Ni and may be the other publicly known material.

After that, as shown in FIG. 38B, the amorphous silicon film 9507 is crystallized by heating processing at 580° C. for four hours. As a result, a crystalline silicon film 511 may be obtained. The crystalline silicon film 511 is formed by a collection of stick-shaped or needle-shaped crystal. Each crystal grows in a specific orientation in a macroscopic manner. Therefore, the uniform crystallinity is obtained. Additionally, the orientational rate in a specific direction is high.

As shown in FIG. 38C, a continuous-wave laser beam is irradiated to the crystalline semiconductor film having crystallized through heating processing so as to improve the crystallinity. The linear laser beam 9505 having uniform longitudinal energy density distribution is scanned and is irradiated to the crystal semiconductor film. Thus, the crystalline semiconductor film 511 is melted and is re-crystallized. The amorphous area left in the crystalline semiconductor film 511 can be also crystallized through this processing. This re-crystallization processing can control an increase in grain size and the orientation. During the crystallization stage, a small amount of volume shrinkage occurs. Then, the distortion is accumulated in grade changes. Thus, a crystalline semiconductor film 512 can be formed without affecting on the crystalline semiconductor film on the second insulating film.

After that, by following the same steps as those of the first example, a TFT can be completed.

Third Example

Figure 39A:
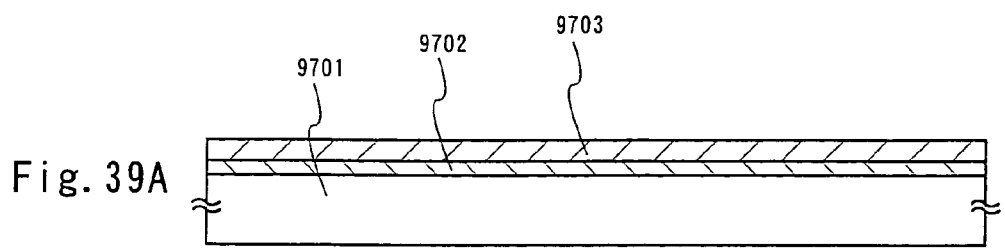
FIGS. 39A to 39C show vertical section diagrams for explaining methods of producing a primary insulating film and an amorphous semiconductor film according to the present invention.
Figure 39B:
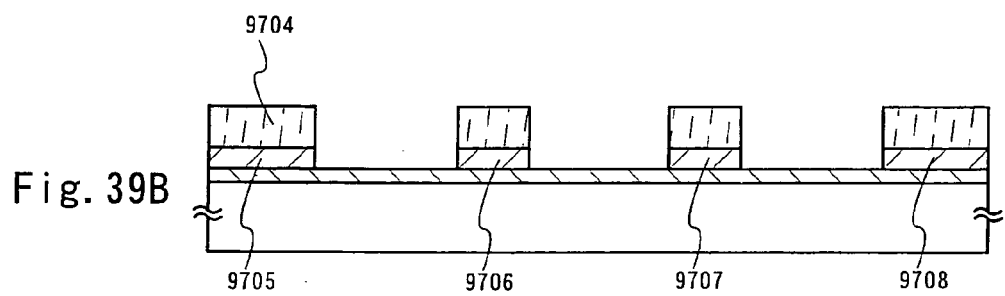
Figure 39C:
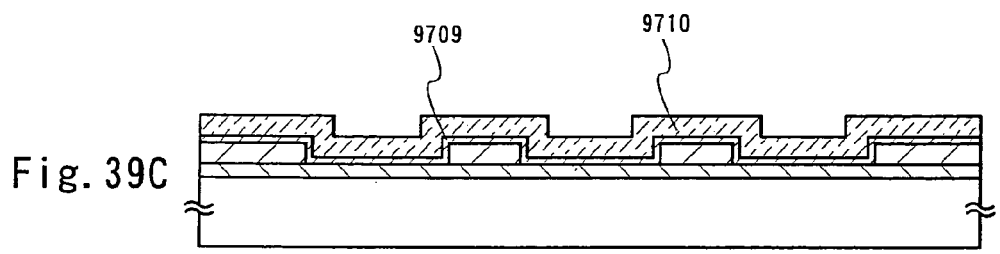

In the method of producing a primary insulating film having projections and depressions according to the first example, as shown in FIG. 39A, a first insulating film 9702 formed by a silicon oxide nitride film and a second insulating film 9703 formed by a silicon nitride film are stacked on a glass substrate 9701. After that, as shown in FIG. 39B, a mask 9704 is formed thereon, and the second insulating film 9703 is formed in a pattern having areas 9705 to 9708. An example of etching methods may be wet-etching, which can etch with better selectivity by using a mixed solution containing hydrogen ammonium fluoride ($NH_4HF_2$) of 7.13% and ammonium fluoride ($NH_4F$) of 15.4%.

In order to form an amorphous semiconductor film thereon, a silicon oxide nitride film 9709 and an amorphous semiconductor film 9710 may be formed continuously in a plasma CVD apparatus without exposing them to the air. Thus, the contamination effect of the interface with the primary insulating film can be avoided. Through this processing method, a cleaner interface can be formed. Thus, the occurrence of crystal cores, which cannot be controlled due to the interface impurities, may be prevented.

After this, by following the same steps as those of the first and second examples, a TFI can be completed.

Fourth Example

According to another method of producing a primary insulating film having projections and depressions, as shown in FIG. 40A, a silicon oxide film is formed on the glass substrate 9701. Then, insulating films 9711 to 9714 are formed by silicon oxide films by photo-engraving and are formed into rectangular or strip patterns.

Then, after the mask 9710 is removed, a first insulating film 9715 is formed by a silicon oxide nitride film by covering the pattern formed by the insulating films 9711 to 9714. Then, an amorphous semiconductor film 9716 is formed on the first insulating film. The silicon oxide nitride film formed as the first insulating film can block, for example, alkali metal contained in the glass substrate 9701. In addition, the silicon oxide nitride film has lower internal stress. Therefore, the silicon oxide nitride film is suitable for a primary insulating film in contact with a semiconductor film.

After this, a TFT may be completed by following the same steps of those of any one of the first to third examples.

Fifth Example

The present invention can be applied to various semiconductor devices. A form of a display panel produced based on the first to the fifth examples will be described with reference to FIGS. 41 and 42.

Figure 41:
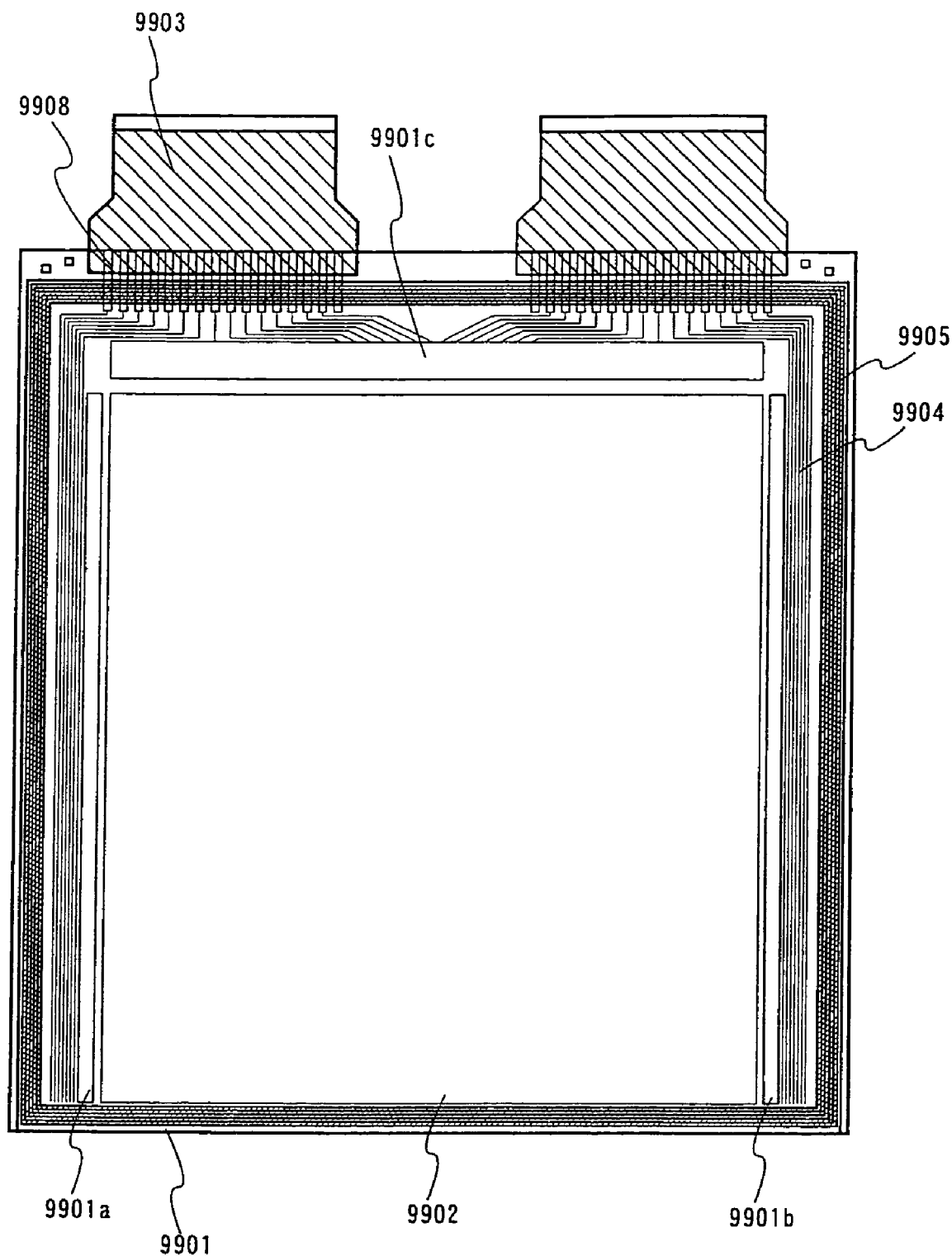
FIG. 41 is an external view of a display panel.

In FIG. 41, a substrate 9901 includes a pixel portion 9902, gate-signal-side driving circuits 9901a and 9901b, a data-signal-side driving circuit 9901c, an input/output terminal portion 9908 and a wire or wires 9904. A shield pattern 9905 may be overlapped partially with the gate-signal-side driving circuits 9901a and 9901b, the data-signal-side driving circuit 9901c and the wire or wires 9904, which connect the driving circuits and the input terminal. Thus, a size of a frame area of a display panel (that is, peripheral area of the pixel portion) can be reduced. An FPC 9903 is fixed to an external input terminal portion.

The TFT shown in the first to fifth examples can be applied as a switching element of the pixel portion 9902, and as active elements included in the gate-signal-side driving circuits 9901a and 9901b and the data-signal-side driving circuit 9901c.

Figure 42:
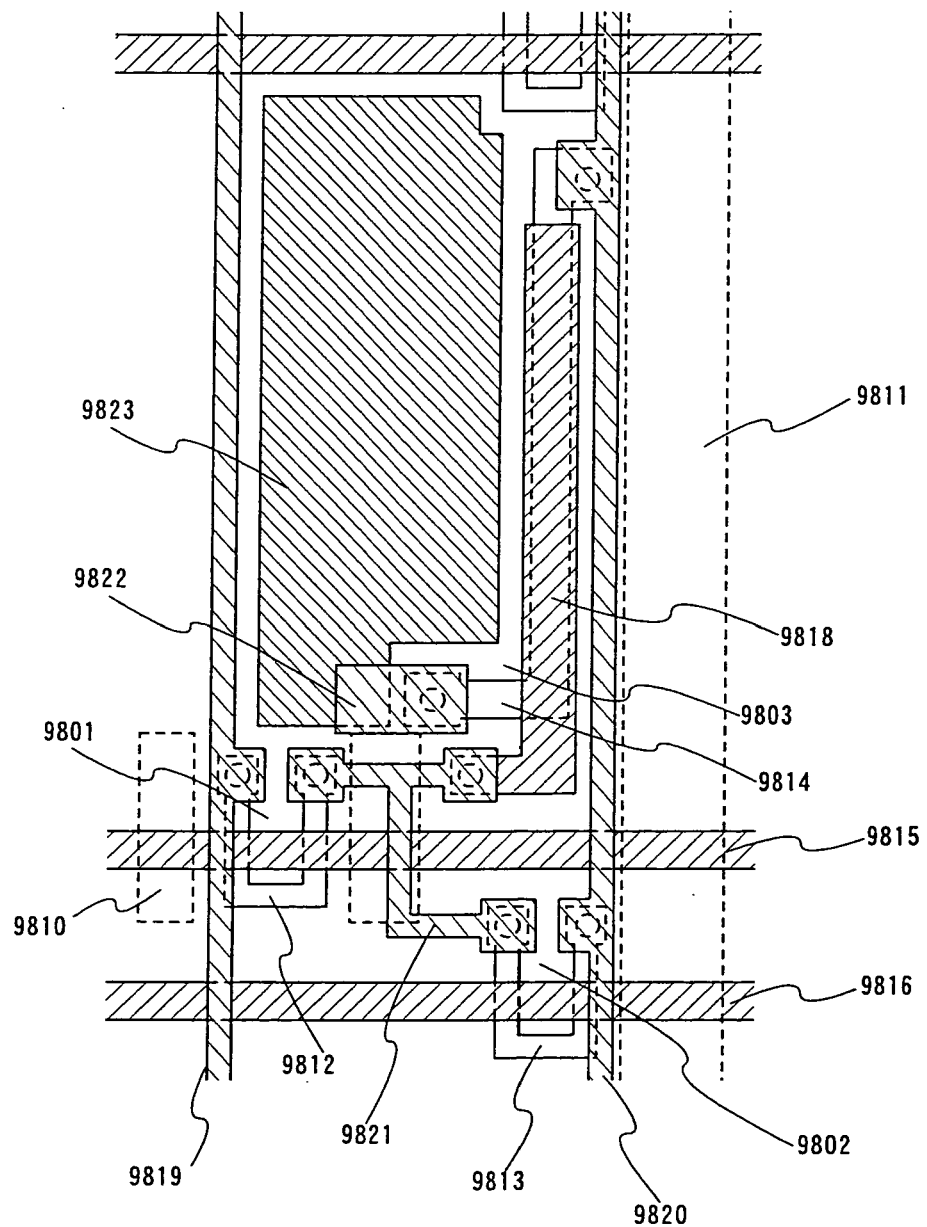
FIG. 42 is a top view for explaining a construction of a pixel portion of the display panel.

FIG. 42 is an example of a construction of one pixel of the pixel portion 9902 shown in FIG. 41. The pixel includes TFTs 9801 to 9803. These TFTs are used for switching, resetting and driving in order to control a light-emitting element and/or a liquid crystal element included in the pixel.

Active layers 9812 to 9814 of these TFTs are placed in projection top portion of a primary insulating film therebelow. A crystalline semiconductor film forming the active layers can be formed based on the first to fourth examples. Gate wires 9815 to 9817 are formed on the active layers 9812 to 9814. Then, a data line 9818, a power-supply line 9819, the other different kinds of wires 9820 and 9821 and a pixel electrode 9823 are formed thereon through a passivation film and a planarization film.

In this way, according to the present invention, a display panel can be completed with no effects.

Sixth Example

A semiconductor device including TFTs produced according to the present invention can be applied in various ways. For example, the semiconductor may be a mobile information terminal (such as an electrical organizer, a mobile computer and a mobile telephone), a video camera, a digital camera, a personal computer, a television receiver, a mobile telephone or a projecting type display apparatus. These examples are shown in FIGS. 43A to 44D.

Figure 43A:
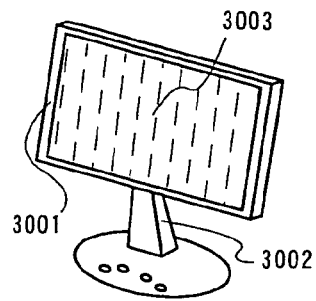
FIGS. 43A to 43G show examples of the semiconductor device.

FIG. 43A is an example of a television receiver completed by applying the present invention. The television receiver includes a cabinet 3001, a supporting base 3002 and a display portion 3003. TFTs produced according to the present invention are applied to the display portion 3003. Therefore, a television receiver can be completed according to the present invention.

Figure 43B:
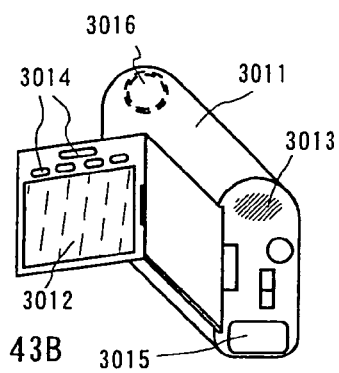

FIG. 43B is an example of a video camera completed by applying the present invention. The video camera includes a body 3011, a display portion 3012, a voice input portion 3013, an operation switch 3014, a battery 3015 and a receiver 3016. TFTs produced according to the present invention are applied to the display portion 3012. Therefore, a video camera can be completed according to the present invention.

Figure 43C:
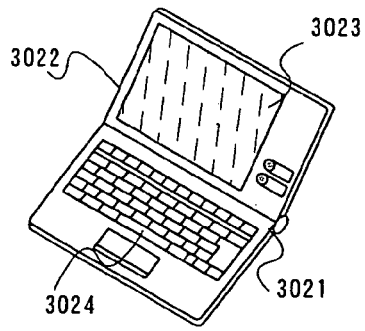

FIG. 43C is an example of a laptop personal computer completed by applying the present invention. The laptop personal computer includes a body 3021, a cabinet 3022, a display portion 3023 and a keyboard 3024. TFTs produced according to the present invention are applied to the display portion 3023. Therefore, a personal computer can be completed according to the present invention.

Figure 43D:
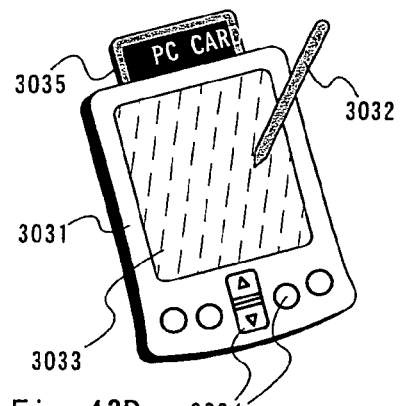

FIG. 43D is an example of a personal digital assistant (PDA) completed by applying the present invention. The PDA includes a body 3031, a stylus 3032, a display portion 3033, an operation button 3034 and an external interface 3035. TFTs produced according to the present invention are applied to the display portion 3033. Therefore, a PDA can be completed according to the present invention.

Figure 43E:
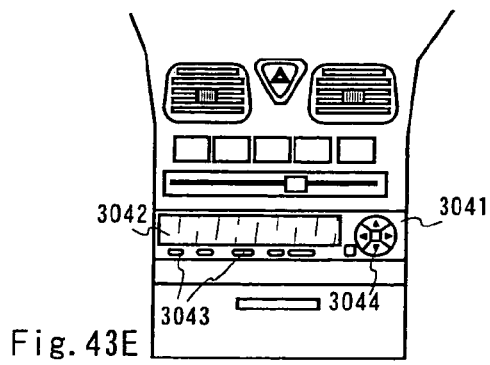

FIG. 43E is an example of a sound-effect playing apparatus by applying the present invention. Specifically, the sound-effect playing apparatus is a car-mounted audio apparatus and includes a body 3041, a display portion 3042 and operation switches 3042 and 3044. TFTs produced according to the present invention are applied to the display portion 3042. Therefore, an audio apparatus can be completed according to the present invention.

Figure 43F:
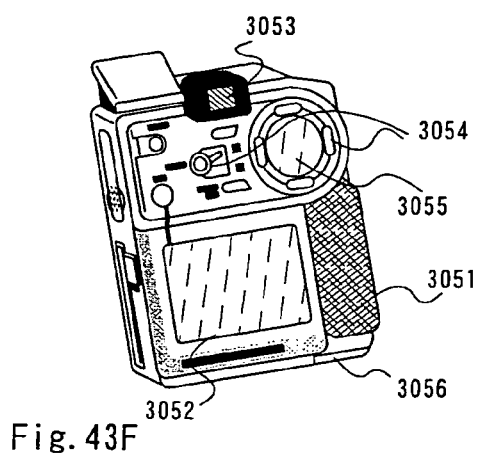

FIG. 43F is an example of a digital camera completed by applying the present invention. The digital camera includes a body 3051, a display portion (A) 3052, an objective portion 3053, an operation switch 3054, a display portion (B) 3055 and a battery 3056. TFTs produced according to the present invention are applied to the display portion (A) 3052 and the display portion (B) 3055. Therefore, a digital camera can be completed according to the present invention.

Figure 43G:
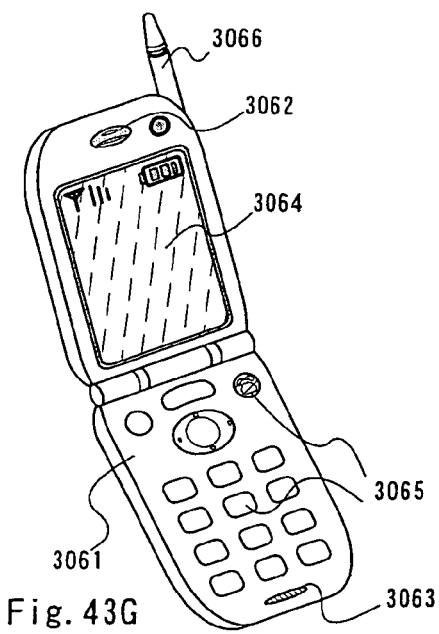

FIG. 43G is an example of a mobile telephone completed by applying the present invention. The mobile telephone includes a body 3061, a voice output portion 3062, a voice input portion 3063, a display portion 3064, an operation switch 3065 and an antenna 3066. TFTs produced according to the present invention are applied to the display portion 3064. Therefore, a mobile telephone can be completed according to the present invention.

Figure 44A:
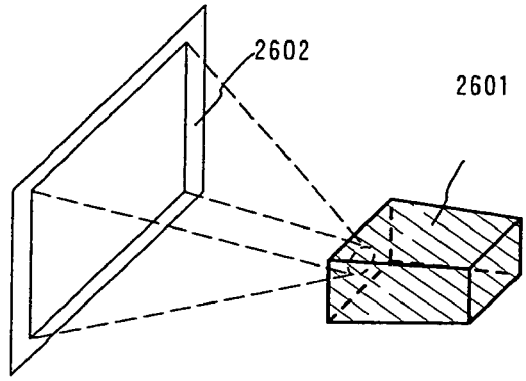
FIGS. 44A to 44D show examples of a projector.
Figure 44B:
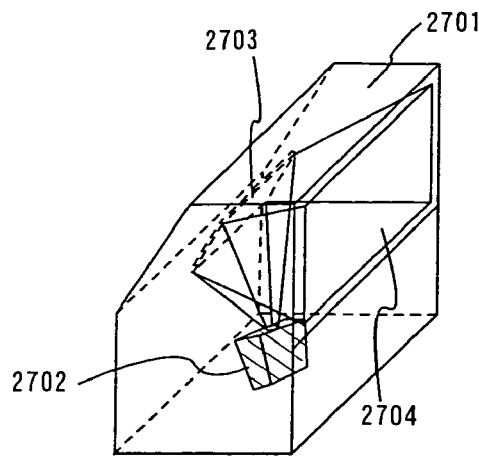

FIG. 44A is a front type projector and includes a projecting apparatus 2601 and a screen 2602. FIG. 44B is a rear type projector and includes a body 2701, a projecting apparatus 2702, a mirror 2703 and a screen 2704.

Figure 44C:
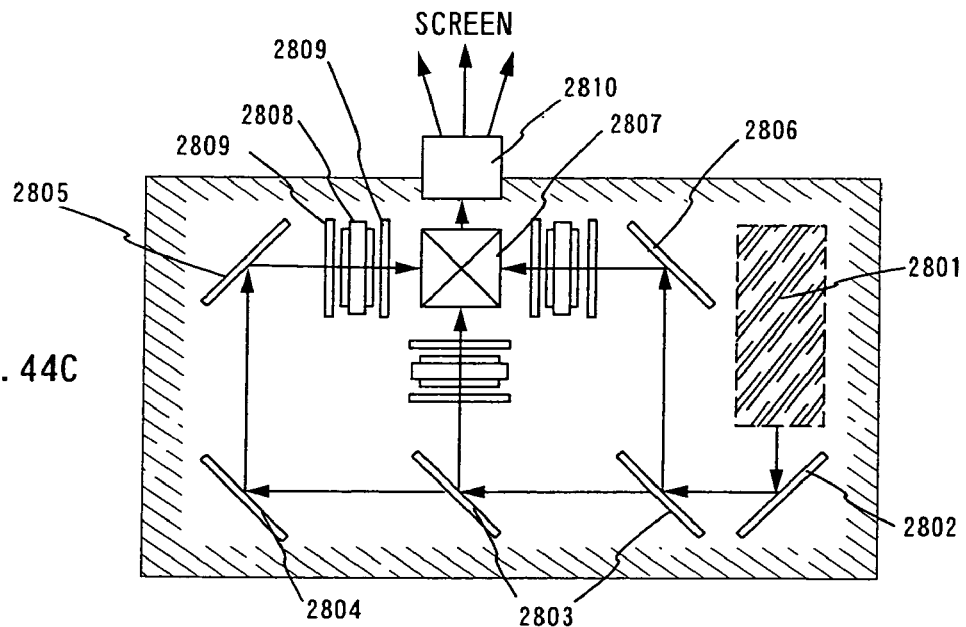

FIG. 44C shows an example of a construction of the projecting apparatus 2601 and 2702 in FIGS. 44A and 44B. Each of the projecting apparatus 2601 and 2702 includes a light source optical system 2801, mirrors 2802 and 2804 to 2806, a dichroic mirror 2803, a prism 2807, a liquid crystal display apparatus 2808, a phase contrast place 2809 and a projecting optical system 2810. The projecting optical system 2810 includes an optical system having a projecting lens. This example shows an apparatus of a three-plate type but is not limited thereto. For example, the apparatus may be of a single-plate type. In addition, an optical system may be provided, by a practitioner appropriately, in an optical path indicated by an arrow in FIG. 44C, such as an optical lens, a film having a polarizing function, a film for adjusting a phase difference and an IR film.

Figure 44D:
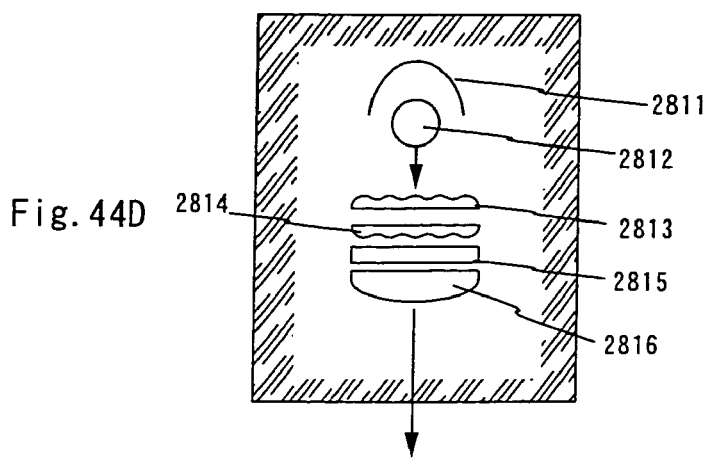

FIG. 44D shows an example of a construction of the light source optical system 2801 in FIG. 44C. In this example, the light source optical system 2801 includes a reflector 2811, a light source 2812, lens arrays 2813 and 2814, a polarization converting element 2815, and a light-gathering lens 2816. The light source optical system shown in FIG. 44D is only the example and is not especially limited. For example, an optical system may be provided, by a practitioner appropriately, with an optical system such as an optical lens, a film having a polarizing function, a film for adjusting a phase difference and an IR film.

These apparatus shown herein are only the part of examples. The present invention is not limited to these applications.

Seventh Example

A method for forming an insulating film having depressions and projections will be described in this example.

Figure 8A:
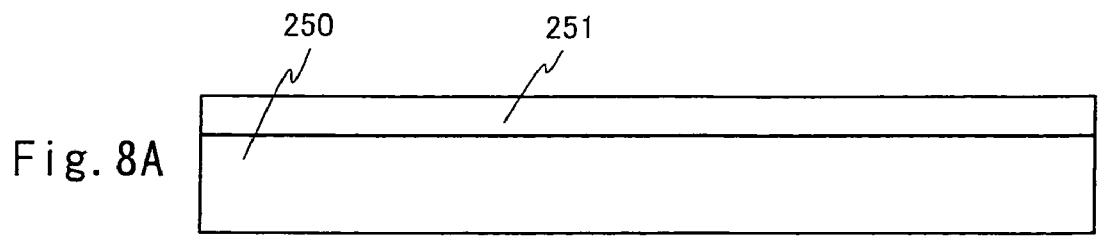
FIGS. 8A to 8D show how an insulating film having projections and depressions is produced.

First of all, as shown in FIG. 8A, a first insulating film 251 is formed of a substrate 250. In this example, the first insulating film 251 is formed on silicon oxide nitride but is not limited thereto. The first insulating film 251 only needs to have a more select rate for etching than that of a second insulating film. In this example, the first insulating film 251 is formed of 50 to 200 nm in thickness by using $SiH_4$ and $N_2O$ in a CVD apparatus. The first insulating film may be a single layer or may have a structure depositing multiple insulating films.

Figure 8B:
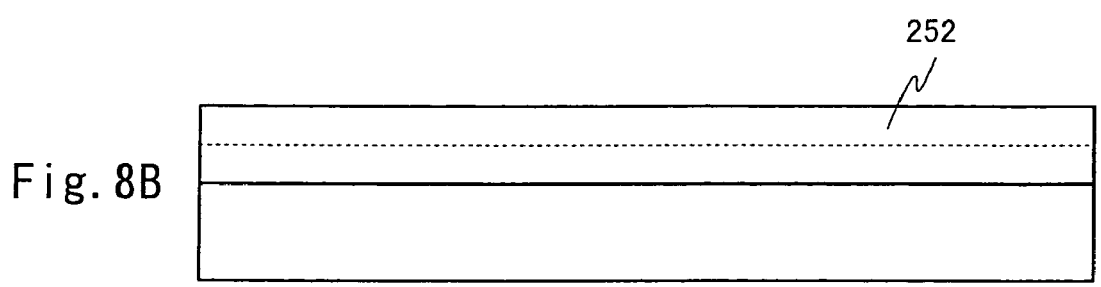

Next, as shown in FIG. 8B, a second insulating film 252 is formed such that the second insulating film 252 can be in contact with the first insulating film 251. The second insulating film 252 is patterned to form depressions and projections in a later step. In this case, the second insulating film 252 needs to have a thickness, which allows depressions and projections to appear on the surface of a semiconductor film formed later. In this example, as the second insulating film 252, silicon oxide is formed of 30 to 300 nm in thickness by using Plasma CVD method.

Figure 8C:
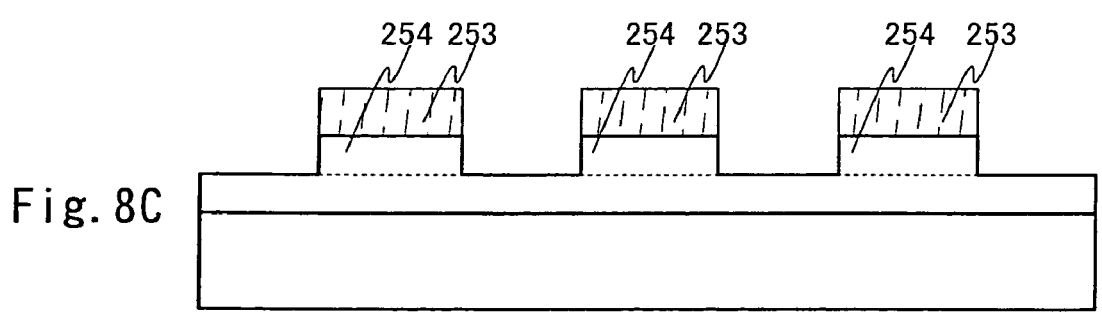
Figure 8D:
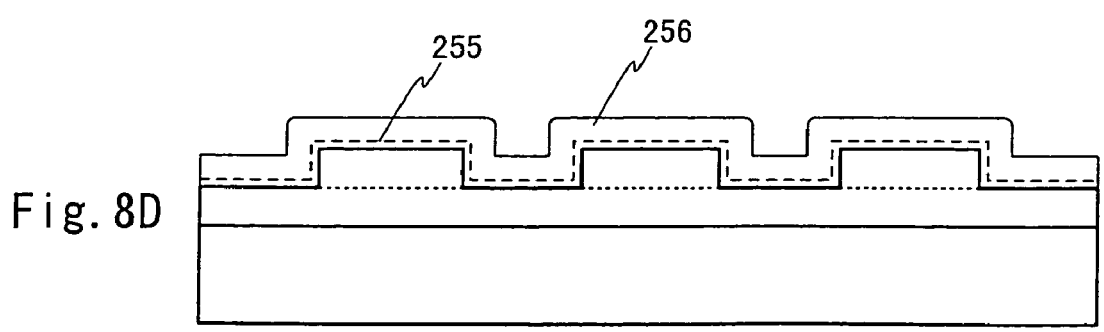

Next, as shown in FIG. 8C, a mask 253 is formed. Then, the second insulating film 252 is etched. In this example, the wet-etching is performed at 20° C. by using a mixed solution containing ammonium bifluoride ($NH_4HF_2$) of 7.13% and ammonium fluoride ($NH_4F$) of 15.4% (for example, LAL 500 (product name) of Stella Chemifa Corporation) as an etchant. Through this etching, rectangular or stripe-shaped projections 254 are formed. The first insulating film 251 and the projection 253 are regarded as one insulating film herein.

Next, a semiconductor film is formed so as to cover the first insulating film 251 and the projections 253. In this example, the thickness of the projection is 30 nm to 300 nm. Therefore, the thickness of the semiconductor film is desirably 50 to 200 nm. In this case, the thickness of the semiconductor film is 60 nm. When an impurity is present between the semiconductor film and the insulating film, the crystallinity of the semiconductor is adversely effected. Then, a variation in characteristic and/or changes in threshold voltage of a TFT to be produced may increase. Therefore, the insulating film and the semiconductor film are desirably formed continuously. In this example, after the insulating film including the first insulating film 251 and the projections 253 is formed, a silicon oxide film 255 is formed thinly on the insulating film. Then, in order to prevent it from being exposed to the air, a semiconductor film 256 is formed continuously. A designer can define the thickness of the silicon oxide film appropriately. In this example, the thickness of the silicon oxide film is 5 nm to 30 nm.

The second insulating film 252 may be etched such that the projections can be tapered. By having tapered projections, a semiconductor film, a gate insulting film, a gate electrode and so on to be formed on the insulating film may be prevented from being damaged by the edges of the projections.

Figure 9A:
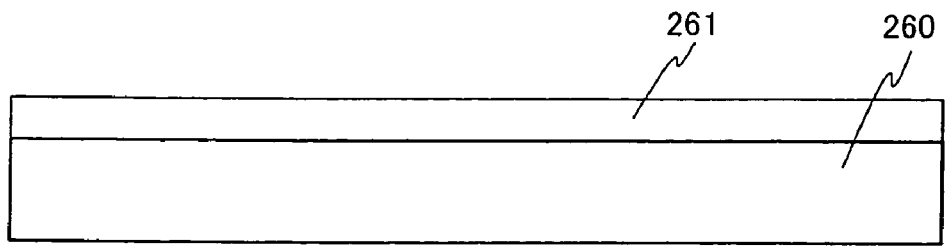
FIGS. 9A to 9C show how an insulating film having projections and depressions is produced.

Next, another method of forming an insulating film will be described which is different from the one shown in FIGS. 8A to 8D. First of all, as shown in FIG. 9A, a first insulating film is formed on a substrate 260. The first insulating film may be a silicon oxide film, a silicon nitride film, a silicon oxide nitride film or the like.

When a silicon oxide film is used, according to Plasma CVD method, tetraethyl orthosilicate (TEOS) and $O_2$ are mixed and are discharged by having the reaction pressure of 40 Pa, the substrate temperature of 300° C. to 400° C. and the high frequency (13.56 MHz) power density of 0.5 to 0.8 W/cm². The silicon oxide nitride film to be used as the first insulating film may be a silicon oxide nitride film produced from $SiH_4$, $N_2O$ and $NH_3$ or a silicon oxide nitride film produced from $SiH_4$ and $N_2O$, according to Plasma CVD method. In this case, the producing condition includes the reaction pressure of 20 to 200 Pa, the substrate temperature of 300 to 400° C. and the high frequency (60 MHz) power density of 0.1 to 1.0 W/cm². Alternatively, a silicon oxide nitride hydride film produced from $SiH_4$, $N_2O$ and $H_2$ may be applied. Like the silicon nitride film, the silicon oxide nitride hydride film may be produced from $SiH_4$ and $NH_3$ by using Plasma CVD method.

Figure 9B:
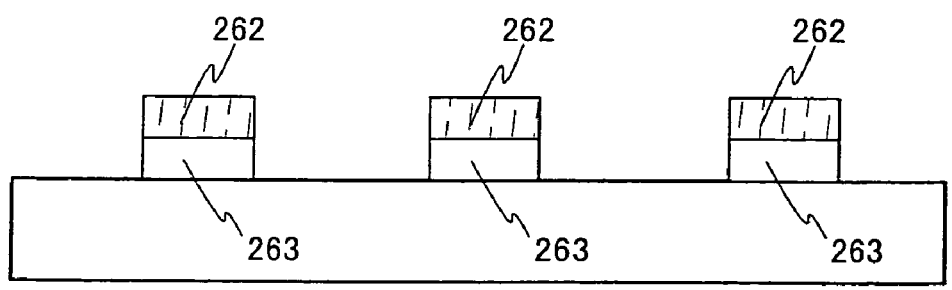
Figure 9C:
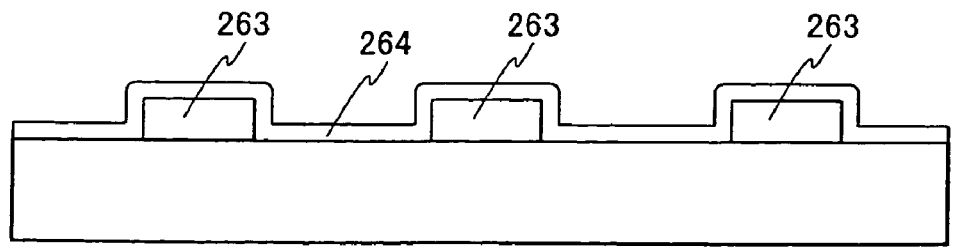

The first insulating film is formed of 20 to 200 nm (preferably 30 to 60 nm) in thickness on the entire surface of the substrate. Then, as shown in FIG. 9B, a mask 262 is formed by using a photolithography technology. Unnecessary parts are removed by etching, and stripe-shaped or rectangular projections 263 are formed. For the first insulating film 261, a dry-etching method using fluorine gas or a wet-etching method using a fluorine solution may be used. If the wet-etching method is used, a mixed solution containing ammonium bifluoride ($NH_4HF_2$) of 7.13% and ammonium fluoride ($NH_4F$) of 15.4% (for example, LAL 500 (product name) of Stella Chemifa Corporation) may be used for the etching.

Next, a second insulating film 264 is formed by covering projections 262 and the substrate 260. This layer may be a silicon oxide film, silicon nitride film or a silicon oxide and nitride film, like the first insulating film 261, of 50 to 300 nm (preferably, 100 to 200 nm) in thickness.

Through the production steps, an insulating film including the projections 262 and the second insulating film 264 is formed. After the second insulating film 264 is formed, a semiconductor film is formed continuously in order to prevent the second insulating film 264 from being exposed to the air. Thus, impurities in the air are prevented from intruding between the semiconductor film and the insulating film.

Eighth Example

In this example, a semiconductor film formed on a stripe-shaped insulating film is crystallized by laser light irradiation. Then, islands separated from each other are formed on depression surfaces parallel to the substrate. Then, a TFT is produced by using the islands. This example will be described below.

Figure 10A:
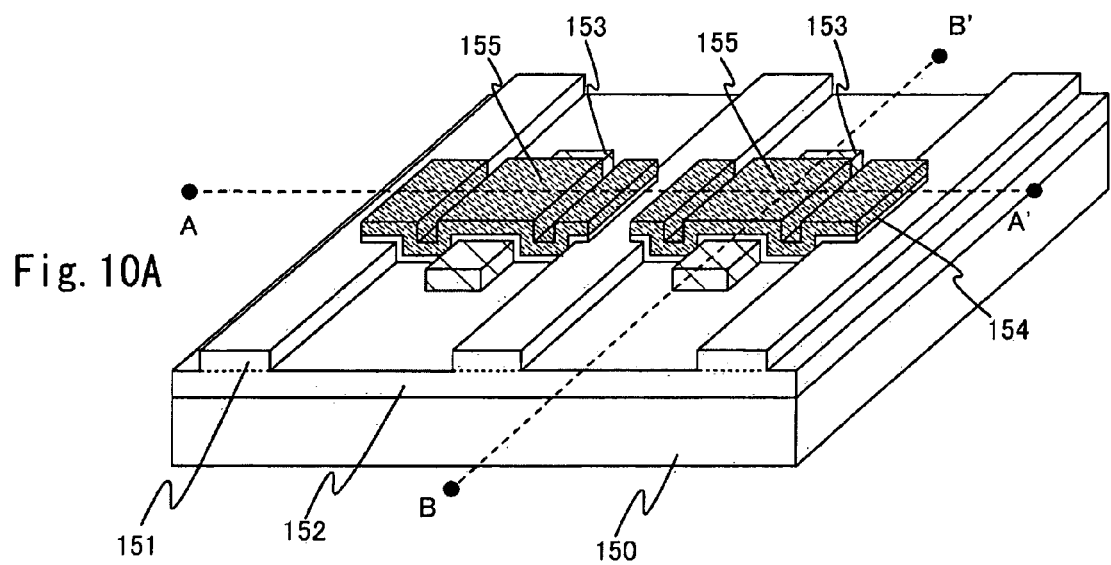
FIGS. 10A to 10C show an island formed by patterning a crystallized semiconductor film.

FIG. 10A shows a construction of a TFT according to this example. In FIG. 10A, an insulating film 152 having stripe-shaped projections 151 is formed on a substrate 150. Multiple islands 153 separated from each other are formed on the top surface of each depression between the projections 151. A gate insulating film 154 is formed so as to be in contact with the island 153. The gate insulating film 154 shown in FIG. 10A is formed such that an impurity area of the island can be exposed. However, the gate insulating film may be formed by covering the island 153.

Multiple gate electrodes 155 are formed on the gate insulating film 154 by overlapping with multiple islands 153. The multiple gate electrodes 155 may be connected to each other in some circuit constructions.

Figure 10B:
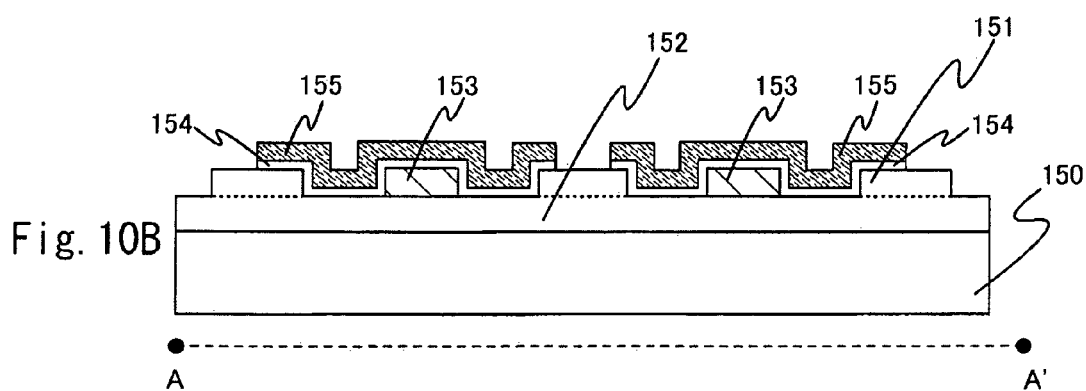
Figure 10C:
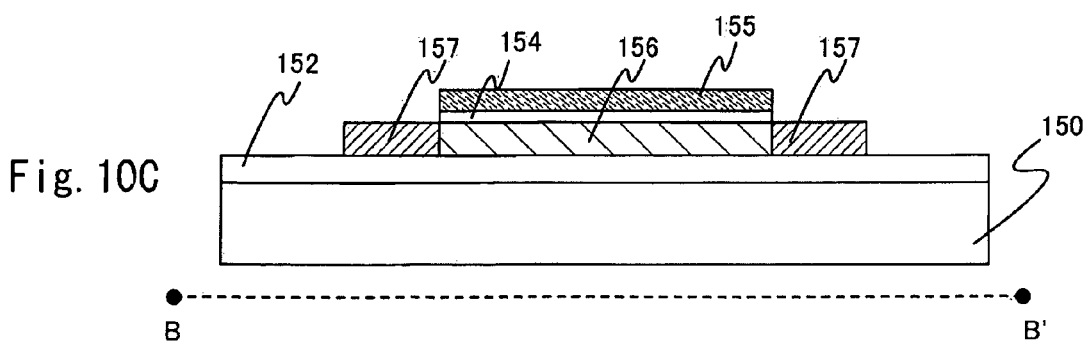

FIG. 10B shows a section diagram taken at a line A-A' in FIG. 10A. FIG. 10C shows a section diagram taken at a line B-B' in FIG. 10A. As shown in FIG. 10C, each of the gate electrodes 155 is overlapped with a channel forming region 156 of the island 153 through the gate insulating film 154. The channel forming region 156 is also between two impurity regions 157 included in the island 153.

This example can be implemented in combination with the first to seventh examples.

Ninth Example

This example will be described about various forms of an insulating film.

Figure 11A:
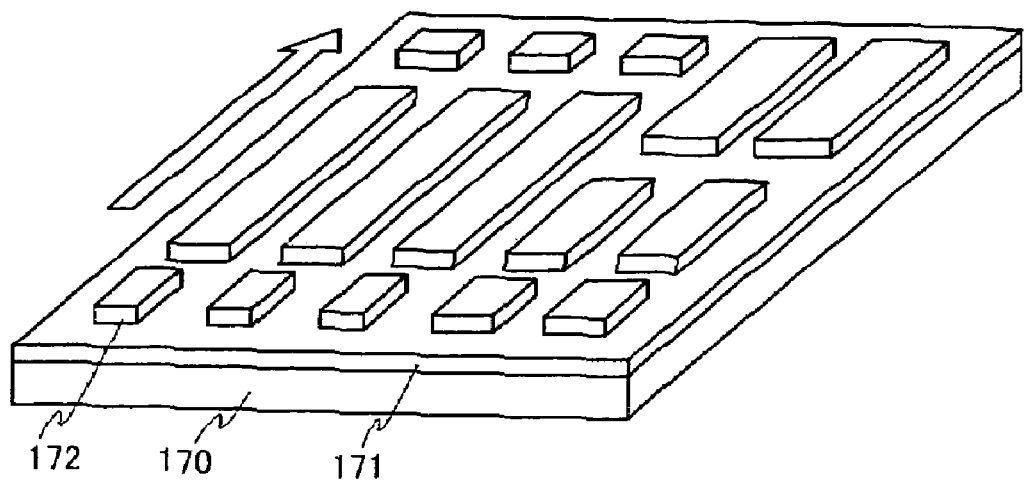
FIGS. 11A and 11B show insulating films having depressions and projections.

FIG. 11A shows an example of the form of an insulating film according to the present invention. In FIG. 11A, an insulating film 171 is formed on a substrate 170. The insulating film 171 has multiple projections 172. Each of the projections is rectangular when viewed from the above. All of the projections have a longer side direction or shorter side direction of the rectangular, which is parallel to a scanning direction of laser light indicated by an arrow.

The projection 172 does not always have the same widths in the scanning direction of laser light and in the direction perpendicular to the scanning direction. A form of insulating film is desirably designed in accordance with a desired form of an island.

Figure 11B:
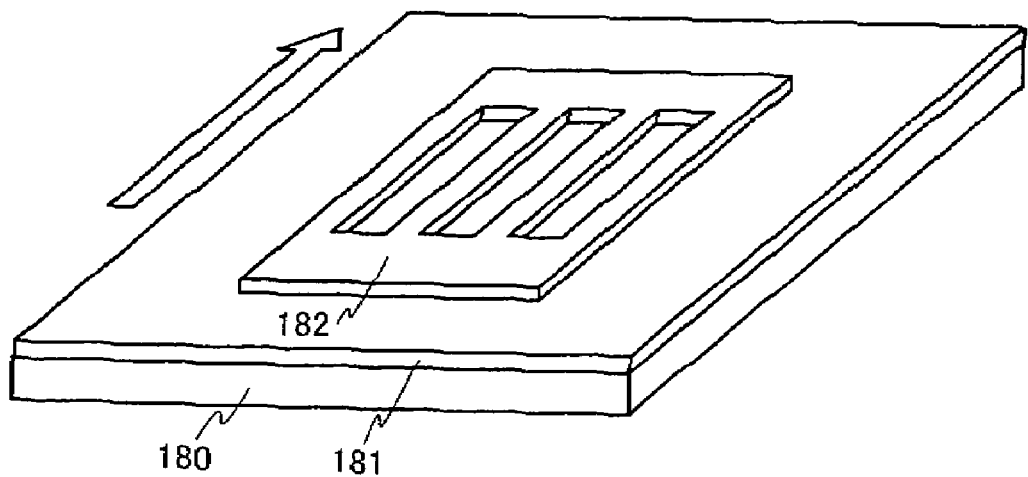

FIG. 11B shows another example of the form of the insulating film according to the present invention. In FIG. 11B, an insulating film 181 is formed on a substrate 180. The insulating film 181 has a rectangular projection 182 each having slit-shaped opening portions when viewed from the above. A longer or shorter side direction of the slit of the projection 182 is parallel with a scanning direction of laser light indicated by an arrow.

Next, an example of a construction of a TFT will be described which is formed by using an insulating film having slit-shaped opening portions shown in FIG. 11B.

Figures 12A, 12B, 12C, 12D:
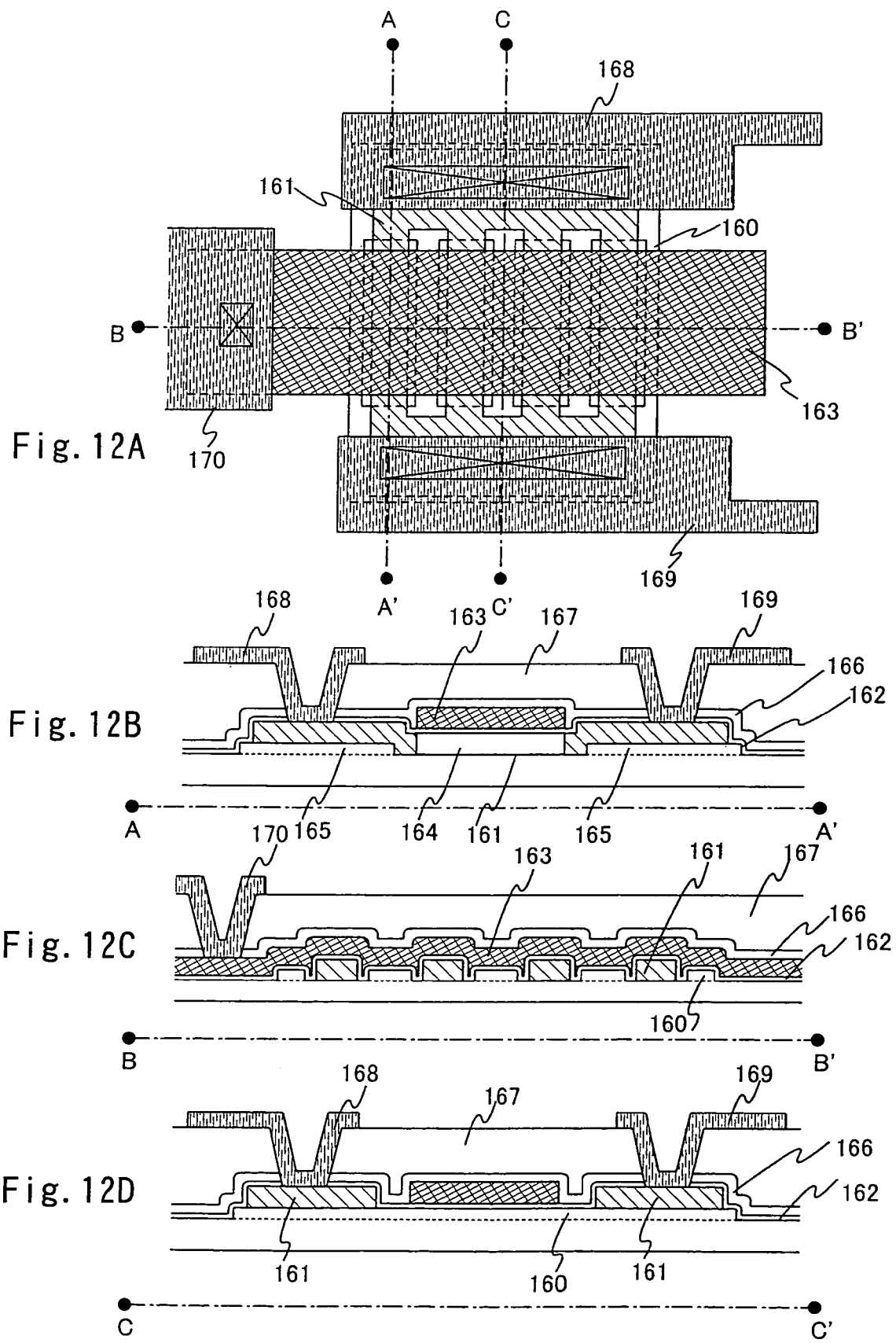
FIGS. 12A to 12D are a top view and sectional views of a TFT formed by using the insulating film shown in FIG. 11B.

FIG. 12A shows a top view of the TFT according to this example. As shown in FIG. 12A, in this example, an insulating film is used which has a rectangular projection 160 having slit-shaped opening portions inside. A semiconductor film is formed by covering the projection 160. Laser light scans in a direction indicated by an arrow along a direction of a major axis of the slit-shaped opening portion. Thus, the semiconductor film is crystallized. Then, the semiconductor film is patterned, and an island 161 having opening portions is formed. A channel forming region is formed on the top surface of a depression surrounded by projections.

Then, a gate insulating film 162 is formed so as to be in contact with the island 161. FIG. 12B is a section diagram taken at a line A-A' in FIG. 12A. FIG. 12C is a section diagram taken at a line B-B'. FIG. 12D is a section diagram taken at a line C-C'.

A conductive film is formed on the gate insulating film 162. The conductive film is patterned so that a gate electrode 163 can be formed. The gate electrode 163 overlaps with a channel forming region 164 of the island 161 through the gate insulating film 162. The channel forming region 164 is between two impurity regions 165 included in the island 161.

A first interlayer insulating film 166 is formed so as to cover the gate electrode 163, the island 161 and the gate insulating film 162. The first interlayer insulating film 166 is an inorganic insulating film and can prevent a substance adversely affecting on characteristics of TFT of alkali metal from intruding into the island 161.

Then, a second interlayer insulating film 167 of organic resin is formed on the first interlayer insulating film 166. The second interlayer insulating film 167, the first interlayer insulating film 166 and the gate insulating film 162 have opening portions formed by etching. Wires 168 and 169 are formed on the second interlayer insulating film 167. The wires 168 and 169 are connected to two impurity areas 165 and the gate electrode 163, respectively, through the opening portions.

In this example, the multiple channel forming regions 164 are formed. In addition, the multiple channel forming regions 164 are separated from each other. Therefore, by increasing a channel width of each of the channel forming regions, ON current can be obtained. At the same time, heat generated by driving TFTs can be released efficiently.

This example can be implemented in combination with the first to eighth examples.

Tenth Example

This example is a method of producing an active matrix substrate by using a laser crystallization method according to the present invention. This example will be described with reference to FIGS. 13A to 16. For convenience, an active matrix substrate refers to a substrate having a CMOS circuit, a driving circuit, and a pixel portion having pixel TFTs and a latching capacity thereon.

First of all, a substrate 600 of glass such as barium borosilicate glass or aluminosilicate glass is used. The substrate 600 may be obtained by forming an insulating film on a substrate of a quartz substrate, silicon substrate, a metal substrate or a stainless substrate. Alternatively, a plastic substrate may be used which has heat resistance resisting a processing temperature of this example.

Next, an insulating film of 100 to 300 nm in thickness such as a silicon oxide film, a silicon nitride film and a silicon oxide nitride film is formed on the substrate 600 by using a publicly known method (such as Sputtering method, LPCVD method and Plasma CVD method).

Next, in order to form thick parts and thin parts in the insulating film according to this example, a mask 693 of resist is formed by photo-engraving (photolithography), and etching processing is performed thereon. The thickness depends on the etching amounts. In this example, the thickness is about 50 to 100 nm. For example, in order to etch a silicon oxide nitride film of 150 nm in thickness by 75 nm, wet-etching using a solution containing fluoride may be used. Alternatively, dry-etching using $CF_4$ may be applied. In this way, an insulating film 601 having projections is formed. Here, a width of the projection in a direction perpendicular to the scanning direction of laser light may be determined properly in consideration of a size of a TFT to be produced. A size (diameter or a length of a diagonal line) as much as 2 to 6 μm is preferable in order to control a number of created crystal cores (FIG. 13A).

Next, an amorphous semiconductor film 692 of 25 to 80 nm in thickness (preferably, 30 to 60 nm in thickness) is formed on the insulating film 601 by using a publicly known method (such as Sputtering method, LPCVD method and Plasma CVD method) (FIG. 13B). In this example, an amorphous semiconductor film is formed but may be a microcrystal semiconductor film or a crystalline semiconductor film. Alternatively, a compound semiconductor film may be formed having an amorphous structure such as an amorphous silicon geranium film.

Next, the amorphous semiconductor film 692 is crystallized by laser crystallizing method. The scanning direction of the laser light is arranged to be parallel with a direction that the stripe-shaped projections extend in the insulating film 601. If the projection in the insulating film 601 is rectangular when viewed from the above of the substrate, the scanning direction of the laser light is determined so as to be parallel with a direction of the longer or shorter side of the rectangle. More specifically, based on mask information input to a computer of the laser irradiating apparatus, laser light is irradiated selectively. In this case, the crystallization may be implemented not only by the laser crystallization method but also in combination with the other publicly known crystallization method (such as a thermal crystallization method using RTA and/or furnace annealing and a thermal crystallization method using a metal element promoting the crystallization). In this example, a width of a laser beam is changed by using a slit in accordance with the width of the insulating film in a direction perpendicular to the scanning direction. However, the present invention is not limited thereto. The slit is not always necessary.

For the crystallizing an amorphous semiconductor film, solid laser provided for continuous waves may be used, and the second to fourth harmonic waves of a fundamental wave may be used. Thus, large crystal grains can be obtained. Typically, the second harmonic (532 nm) and/or the third harmonic wave (355 nm) of Nd:YVO$_4$ laser (fundamental wave of 1064 nm) are desirably used. More specifically, laser light emitted from the continuous wave YVO$_4$ laser is converted to harmonics by a nonlinear optical element. Thus, laser light has an output of 10 W. Alternatively, YVO$_4$ crystal and a nonlinear optical element may be put into a resonator to emit harmonics. Preferably, rectangular or oval laser light is formed on an irradiated surface by an optical system and is irradiated to an object. The energy density here must be about 0.01 to 100 MW/cm$^2$ (preferably, 0.1 to 10 MW/cm$^2$). The laser light is irradiated at a speed of about 10 to 2000 cm/s by moving the semiconductor film relatively.

For the laser irradiation, pulse or continuous wave gaseous laser or solid laser may be used. The gaseous laser may be excimer laser, Ar laser, Kr laser or the like. The solid laser may be YAG laser, YVO$_4$ laser, YLF laser, YAlO$_3$ laser, glass laser, ruby laser, alexandrite laser, Ti:sapphire laser, $Y_2O_3$ laser or the like. The solid laser may be laser using crystal such as YAG, YVO$_4$, YLF and YAlO$_3$ to which Cr, Nd, Er, Ho, Ce, Co, Ti, Yb or Tm is doped. Alternatively, slab laser may be used. A fundamental wave of the laser depends on the material to be doped. Laser light having a fundamental wave of around 1 μm can be obtained. A harmonic for the fundamental wave can be obtained by using a non-linear optical element.

As a result of the laser crystallization, a crystalline semiconductor film 694 having improved crystallinity is formed (FIG. 13C). In the crystalline semiconductor film, a grain boundary may occur easily near the edges of projections or depressions.

Next, the crystalline semiconductor film 694 having improved crystallinity is patterned into a desired form. Thus, crystallized islands 602 to 606 are formed (FIG. 13D).

After the islands 602 to 606 are formed, a slight amount of impurity element (boron or phosphorous) may be doped in order to control the threshold value of a TFT.

Next, a gate insulating film 607 covering the islands 602 to 606 is formed. The gate insulating film 607 contains silicon and is formed of 40 to 150 nm in thickness by using Plasma CVD method or Sputtering method. In this example, a silicon oxide nitride film of 110 nm in thickness (composition rate: Si=32%, O=59%, N=7% and H=2%) is formed by Plasma CVD method. The gate insulating film is not limited to the silicon oxide nitride film and may be the other insulating film containing silicon having a single-layer or laminated structure.

When a silicon oxide film is used, according to Plasma CVD method, tetraethyl orthosilicate (TEOS) and O$_2$ are mixed and are discharged by having the reaction pressure of 40 Pa, the substrate temperature of 300° C. to 400° C. and the high frequency (13.56 MHz) power density of 0.5 to 0.8 W/cm$^2$. The produced silicon oxide film can obtain good characteristics as a gate insulating film by later thermal annealing at 400° C. to 500° C.

Next, a first conductive film 608 of 20 to 100 nm in thickness and a second conductive film 609 of 100 to 400 nm in thickness are stacked on the gate insulating film 607 (FIG. 14A). In this example, the first conductive film 608 containing a TaN film of 30 nm in thickness and the second conductive film 609 containing a W film of 370 nm in thickness are stacked. The TaN film is formed by Sputtering method. Ta is used as a target and is sputtered in an atmosphere containing nitrogen. The W film is formed by Sputtering method using W as a target. Alternatively, a thermal CVD method may be used by using tungsten hexafluoride (WF$_6$). In all of the cases, in order to use them as gate electrodes, the resistance must be reduced. Therefore, the resistance of the W film is desirably not more than 20 μΩ cm. The resistance of the W film can be reduced by increasing the grain size. However, when the W film contains many impurity elements such as oxygen, the crystallization is disturbed. Then, the resistance is increased. Therefore, in this example, the W film is formed by using Sputtering method using high purity W (purity of 99.9999%) as a target and by preventing impurities from the vapor phase from intruding into the W film. As a result, the resistance of 9 to 20 μΩ cm can be achieved.

In this example, the first conductive film 608 and the second conductive film 609 are TaN and W, respectively, but are not limited thereto. Each of them may be formed by an element selected from Ta, W, Ti, Mo, Al, Cu, Cr and Nd, or an alloy or compound material mainly containing the element. Alternatively, a semiconductor such as a polycrystalline silicon film to which an impurity element such as phosphorus is doped may be used. An AgPdCu alloy may be used. Combinations of a tantalum (Ta) film as the first conductive film and a W film as the second conductive film, a titan nitride (TiN) film as the first conductive film and a W film as the second conductive film, and the first conductive film of tantalum nitride (TaN) and the second conductive film of W are possible. Alternatively, combinations of a tantalum nitride (TaN) as the first conductive film and an Al film as the second conductive film, and a tantalum nitride (TaN) film as the first conductive film and a Cu film as the second conductive film are possible.

This example is not limited to the two-layered structure but may be a three-layered structure sequentially stacking a tungsten film, an aluminum-silicon (Al—Si) alloy film and a titan nitride film, for example. In the three-layered structure, tungsten nitride may be used instead of tungsten. Aluminum-titan (Al—Ti) alloy film may be used instead of the aluminum-silicon (Al—Si) alloy film. A titan film may be used instead of the titan nitride film.

Importantly, the best-suitable etching method and etchant type are selected properly in accordance with the materials of the conductive films.

Next, masks 610 to 615 of resist are formed by using photolithography method. Then, first etching processing is performed for forming electrodes and wires. The first etching processing is performed under the first and second etching conditions (FIG. 14B). In this example, as the first etching condition, Inductively Coupled Plasma (ICP) etching method is used. $CF_4$, $Cl_2$ and $O_2$ are used as etching gas. The gas flow rate is 25:25:10 (sccm), respectively. Plasma is generated by supplying RF (13.56 MHz) power of 500 W to a coil type electrode at a pressure of 1 Pa. Then, etching is performed. RF (13.56 MHz) power of 150 W is also supplied to the substrate side (sample stage). Essentially negative self-bias voltage is applied. Under the first etching condition, the W film is etched, and the end of the first conductive layer is tapered.

Then, the first etching condition is replaced by the second etching condition without removing the masks 610 to 615 of resist. $CF_4$ and $Cl_2$ are used as etching gas. The gas flow rate is 30:30 (sccm), respectively. Plasma is generated by supplying RF (13.56 MHz) power of 500 W to a coil type electrode at a pressure of 1 Pa. Then, etching is performed for about 30 seconds. RF (13.56 MHz) power of 20 W is also supplied to the substrate side (sample stage). Essentially negative self-bias voltage is applied. Under the second etching condition mixing $CF_4$ and $C_{12}$, the W film and the TaN film are etched to the same extent. In order to perform etching without leaving residues, the etching time may be increased by 10% to 20%.

The masks of resist in the suitable form are used for the first etching processing. Thus, the ends of the first conductive layer and second conductive layer can be tapered because of the effect of the bias voltage applied to the substrate side. The angle of the tapered part is 15° to 45°. In this way, by performing the first etching processing, conductive layers 617 to 622 (first conductive layers 617a to 622a and second conductive layers 617b to 622b) can be formed in the first form including the first conductive layer and the second conductive layer. FIG. 14B includes a gate insulating film 616. Areas not covered by the conductive layers 617 to 622 in the first form are. etched and become thin.

Next, second etching processing is performed without removing masks of resist (FIG. 14C). Here, $CF_4$, $Cl_2$ and $O_2$ are used as etching gas, and the W film is etched selectively. In this case, the second conductive layers 628b to 633b are formed by the second etching processing. On the other hand, the first conductive layers 617a to 622a are not etched very much. Then, conductive layers 628 to 633 in a second form are formed.

Then, first doping processing is performed without removing the masks of resist, and an impurity element giving the n-type is added to the island in low density. The doping processing may be performed according to ion-doping method or ion-implantation method. The ion-doping method is performed under a condition having the dose amount of $1\times10^{13}$ to $5\times10^{14}$ atoms/cm$^2$ and the accelerating voltage of 40 to 80 kV. In this example, the dose amount is $5\times10^{13}$ atoms/cm$^2$, and the accelerating voltage is 60 kV The impurity element giving n-type is an element belonging to group 15 element and typically may be phosphorous (P) or arsenic (As). In this example, phosphorus (P) is used. Here, the conductive layers 628 to 633 are masks against the impurity element giving n-type. Impurity areas 623 to 627 are formed in a self-alignment manner. The impurity element giving n-type is added to the impurity areas 623 to 627 in the density range of $1\times10^{18}$ to $1\times10^{20}$/cm$^3$.

After removing the masks of resist, masks 634a to 634c of resist are formed thereon newly. Then, the second doping processing is performed with a higher accelerating voltage than that used for the first doping processing. The ion-doping method is performed under a condition having the dose amount of $1\times10^{13}$ to $1\times10^{15}$ atoms/cm$^2$ and the accelerating voltage of 60 to 120 kV. In this doping processing, the second conductive layers 628b to 632b are used as masks against an impurity element. Then, doping is performed such that the impurity element is added to the lower island of the tapered part of the first conductive layer. Then, third doping processing is performed with a lower accelerating voltage than that of the second doping processing. As a result, a state shown in FIG. 15A is obtained. The ion-doping method is performed under a condition having the dose amount of $1\times10^{15}$ to $1\times10^{17}$ atoms/cm$^2$ and the accelerating voltage of 50 to 100 kV. By performing the second doping processing and the third doping processing, the impurity element giving n-type is added in a density range of $1\times10^{18}$ to $5\times10^{19}$/cm$^3$ to low-density impurity areas 636, 642 and 648 overlapping with the first conductive layer. The impurity element giving n-type is added in a density range of $1\times10^{19}$ to $5\times10^{21}$/cm$^3$ to high-density impurity areas 635, 638, 641, 644 and 647.

By using a proper accelerating voltage, the second doping processing and the third doping processing can form the low-density impurity area and the high-density impurity area one time.

Next, after the masks of resist are removed, masks 650a to 650c of resist are formed newly, and fourth doping processing is performed. By performing the fourth doping processing, impurity areas 653, 654, 659 and 660 are formed on islands, which is active layers of p-channel-type TFTs. The impurity areas 653, 654, 659 and 660 contains an impurity element giving the other conductive type opposite against the one conductive type. The second conductive layers 628a to 632a are used as masks against the impurity element. Then, by adding the impurity element giving p-type, the impurity areas are formed in a self-alignment manner. In this example, the impurity areas 653, 654, 659 and 660 are formed by ion-doping method using diborane ($B_2H_6$) (FIG. 15B). During the fourth doping processing, the islands on which n-channel-type TFFs are formed are covered by the masks 650a to 650c of resist. Through the first to third doping processing, phosphorous of different densities is added to the impurity areas 653 and 654 and 659 and 660. However, doping processing is performed on all of the areas such that the density of the impurity element giving p-type can be $1 \times 10^{19}$ to $5 \times 10^2$ atoms/cm$^3$. Thus, no problems occur when these areas function as source regions and drain regions of p-channel-type TFTs.

Through these steps, impurity areas are formed on the islands.

Next, the masks 650a to 650c of resist are removed, and a first interlayer insulating film 661 is formed. As the first interlayer insulating film 661, an insulating film containing silicon of 100 to 200 nm in thickness is formed by using Plasma CVD method or Sputtering method. In this example, a silicon oxide nitride film of 150 nm in thickness is formed by Plasma CVD method. However, the first interlayer insulating film 661 is not limited to the silicon oxide nitride film but may be the other insulating layer containing silicon in a single-layer or laminated structure.

Next, as shown in FIG. 15C, a laser irradiating method is used as activation processing. If laser-annealing method is used, laser having used for crystallization may be used. The activation requires laser at the same moving speed as that for the crystallization with an energy density of about 0.01 to 100 MW/cm$^2$ (preferably, 0.01 to 10 MW/cm$^2$). Continuous wave laser may be used for the crystallization while pulse laser may be used for the activation.

The activation processing may be performed before the first interlayer insulating film is formed.

With heating processing (thermal processing at 300° C. to 550° C. for one to 12 hours), hydrogenation can be performed. This processing terminates dangling bonds of the islands by using hydrogen contained in the first interlayer insulating film 661. As the other methods for the hydrogenation, plasma hydrogenation (using hydrogen excited by plasma) or heating processing at 300° C. to 650° C. for one to 12 hours in an atmosphere containing 3% to 100% of hydrogen may be performed. In this case, the semiconductor layer can be hydrogenated independently of the existence of the first interlayer insulating film.

Next, a second interlayer insulating film 662 is formed on the first interlayer insulating film 661 by using an inorganic insulating film material or an organic insulator material. In this example, an acryl resin film of 1.6 μm in thickness is formed. Next, after the second interlayer insulating film 662 is formed, a third interlayer insulating film 672 is formed in contact with the second interlayer insulating film 662. In this example, a silicon nitride film is used as the third insulating film 672.

Figure 16:
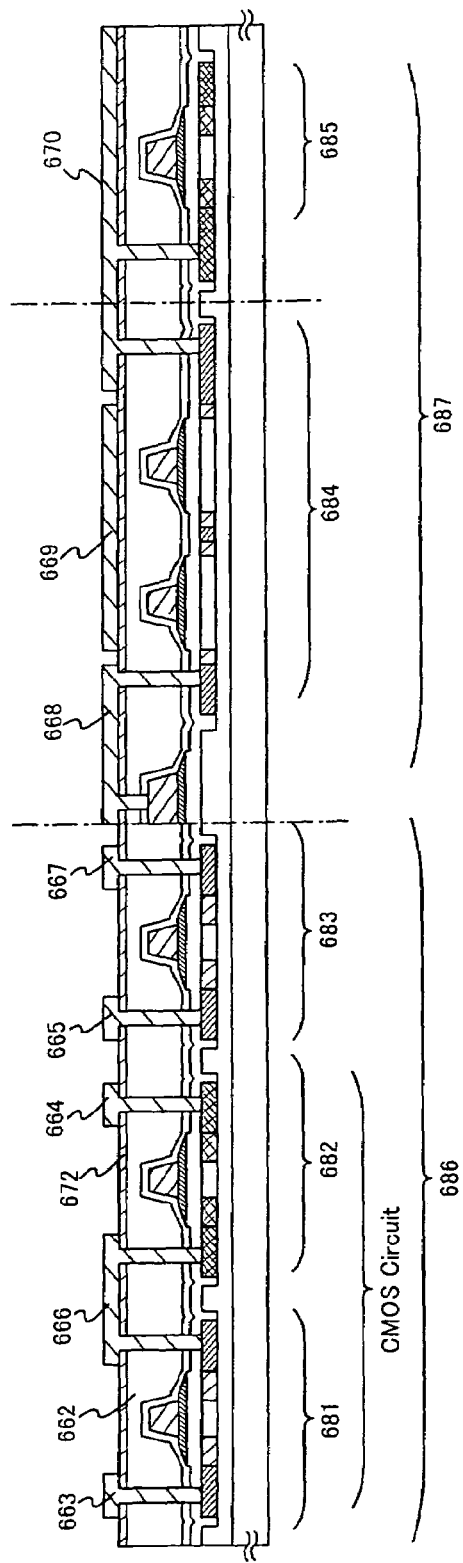
FIG. 16 shows a method of producing a semiconductor device according to the present invention.

Then, wires 664 to 668 are formed in a driving circuit 686 for connecting to the impurity areas electrically. These wires are formed by patterning a laminated film containing a Ti film of 50 nm in thickness and an alloy film (of Al and Ti) of 500 nm in thickness. The structure of each of the wires is not limited to the two-layered structure but may be a single layer structure or a laminate structure having three or more layers. The materials for the wires are not limited to Al and Ti. For example, Al and Cu may be formed on a TaN film, and then a Ti film may be formed thereon in order to obtain a laminated film. The laminated film may be patterned to form wires (FIG. 16).

In a pixel portion 687, a pixel electrode 670, a gate wire 669 and a connecting electrode 668 are formed. The connecting electrode 668 electrically connects a source wire (a laminated layer of 643a and 643b) to a pixel TFT. The gate wire 669 electrically connects to a gate electrode of the pixel TFT. The pixel electrode 670 electrically connects to a drain region 690 of the pixel TFT. Furthermore, the pixel electrode 670 electrically connects to an island 685 functioning as one electrode forming a latching capacity. The pixel electrode and the connecting electrode are formed by using the same material herein. However, for the pixel electrode 670, a material having good reflectivity against a film mainly containing Al or Ag or a laminated film thereof is desirably used.

In this way, the CMOS circuit having the n-channel type TFT 681 and the p-channel type TFT 682, the driving circuit 686 having the n-channel type TFT 683, the pixel TFT 684, and the pixel portion 687 having the latching capacity 685 can be formed on the same substrate. As a result, the active matrix substrate is completed.

The n-channel type TFT 681 of the driving circuit 686 has a channel forming region 637, a low-density impurity region 636 overlapping with the first conductive layer 628a forming a part of the gate electrode (Gate Overlapped LDD (GOLD) region) and high-density impurity region 652 functioning as a source region or a drain region. The p-channel type TFT 682 forming the CMOS circuit by connecting the n-channel type TFT 681 and an electrode 666 has a channel forming region 640, a high-density impurity region 653 functioning as a source region or a drain region, and an impurity region 654 containing an impurity element giving p-type. The n-channel type Fi 683 has a channel forming region 643, a low-density impurity region 642 (GOLD region) overlapping with the first conductive layer 630a forming a part of a gate electrode, and a high-density impurity region 656 functioning as a source region or a drain region.

The pixel TFT 684 of the pixel portion has a channel forming region 646, a low-density impurity region 645 formed outside of a gate electrode (LDD region), and a high-density impurity region 658 functioning as a source region or a drain region. The island functioning as one electrode of the latching capacity 685 contains an impurity element giving n-type and an impurity element giving p-type. The latching capacity 685 includes an electrode (a laminate layer of 632a and 632b) and an island by using the insulating film 616 as a dielectric.

In the pixel construction according to this example, the end of the pixel electrode and the source wire are arranged to overlap so as to block light in a gap between pixel electrodes without using a black matrix.

In this example, the construction of the active matrix substrate to be used for a liquid crystal display apparatus is described. However, a light-emitting apparatus can be used by using the production steps according to this example. A light-emitting apparatus is generally a display panel in which light-emitting elements over a substrate are enclosed between the substrate and a cover or a display module implementing TFTs in the display panel. Each of the light-emitting elements has a layer (light-emitting layer) including an organic compound, which can obtain electro luminescence generated in an electric field, an anode layer and a cathode layer.

In the light-emitting element used in this example, a positive-hole implanting layer, electron implanting layer, positive-hole transport layer or an electron transport layer can be formed by using an inorganic compound only or a material containing an inorganic compound mixed with an organic compound. These layers may be mixed partially with each other.

This example can be implemented in combination with the first to ninth examples.

Eleventh Example

In this example, in order to crystallize a semiconductor film, a process for irradiating laser light and a process for crystallizing a semiconductor film by using a medium are combined. When a medium element is used, the technology disclosed in JP Laid-Open 7-130652 and JP Laid-Open 8-78329 are desirably used.

Figure 17A:
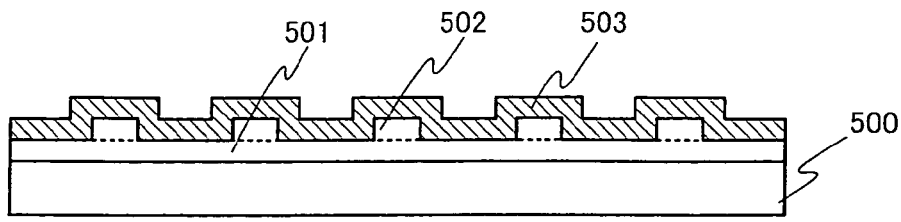
FIG. 17A to 17E show a method of crystallizing a semiconductor film.

First of all, as shown in FIG. 17A, an insulating film having projections 502 is formed on a substrate 500. Then, a semiconductor film 503 is formed on the insulating film 501.

Figure 17B:
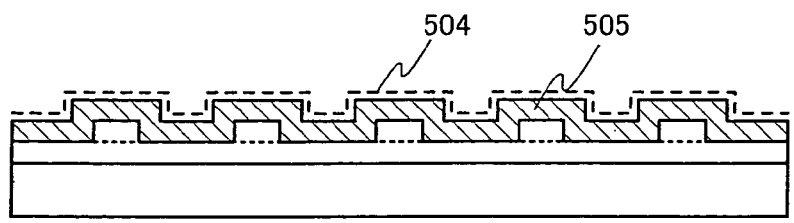
Figure 17C:
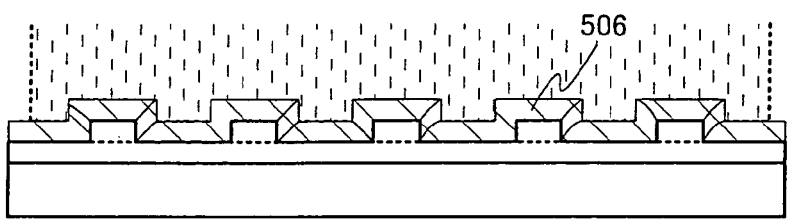

Next, the semiconductor film 503 is crystallized by using a medium element (FIG. 17B). For example, when the technology disclosed in the JP Laid-Open 7-130652 is used, a solution containing 10 ppm (in weight) nickel salt acetate is coated to the semiconductor film 503 to form a nickel containing layer 504. Then, the nickel containing layer 504 undergoes dehydrogenation processing at 500° C. for one hour and then undergoes thermal processing at 500° C. to 650° C. for 4 to 12 hours, in this example, at 550° C. for 8 hours. As a result, a semiconductor film 505 having improved crystallinity is formed. In addition to nickel (Ni), elements such as germanium (Ge), iron (Fe), palladium (Pd), tin (Sn), lead (Pb), cobalt (Co), platinum (Pt), copper (Cu),. and gold (Au) may be used as the medium element.

Then, a semiconductor film 506 having further improved crystallinity is formed from the semiconductor film 505 crystallized by NiSPC through laser light irradiation. The semiconductor film 506 obtained through the laser light irradiation includes the medium element. Therefore, processing (gettering) is performed for removing the medium element from the semiconductor film 506. The gettering is performed by using the technology disclosed in JP Laid-Open 10-135468 or JP Laid-Open 10-135469.

Figure 17D:
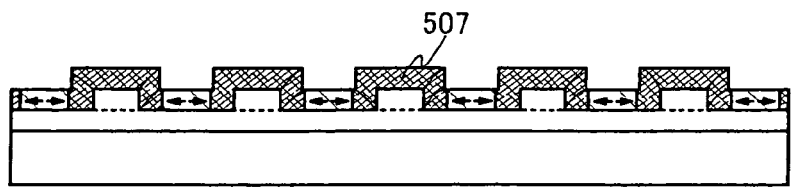

More specifically, an area 507 containing phosphorus partially is formed in the semiconductor film 506 obtained after the laser irradiation. Then, the area 507 undergoes thermal processing in an atmosphere of nitrogen at 550 to 800° C. for 5 to 24 hours, in this case, at 600° C. for 12 hours. Then, the area 507 containing phosphorus of the semiconductor film 506 works as a gettering site. Then, the medium element in the semiconductor film 506 can be segregated to the area 507 containing phosphorus (FIG. 17D).

Figure 17E:
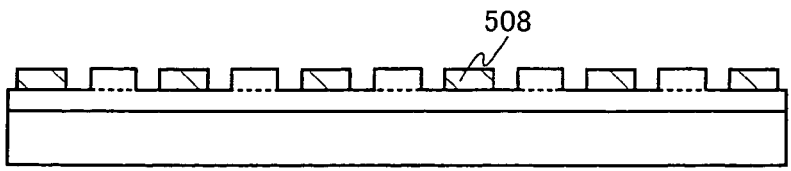

After that, the area 507 containing phosphorus of the semiconductor film 506 is patterned to remove. Then, an island 508 can be obtained in which the density of the medium element is reduced to not more than $1 \times 10^{17}$ atoms/cm$^3$, preferably to about $1 \times 10^{16}$ atoms/cm$^3$ (FIG. 17E).

After coating a solution containing a medium element to a semiconductor film before crystallization, the crystal may be raised by laser light irradiation instead of SPC.

This example may be implemented in combination with examples 1 to 11.

Twelfth Example

In this example, a form of a laser beam combined by overlapping multiple laser beams will be described.

Figure 18A:
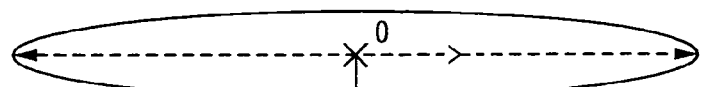
FIGS. 18A to 18D show distributions of energy densities of laser beams.

FIG. 18A shows an example of a laser beam form of laser light oscillated, without a slit, from multiple laser oscillating devices on an object. A laser beam shown in FIG. 18A has an oval form. According to the present invention, a form of a laser beam of laser light oscillated from the laser oscillating device is not limited to the oval form. The form of the laser beam depends on the type of laser and can be formed by an optical system. For example, a form of laser light emitted from XeCl excimer laser L3308 (with wavelength of 308 mn and pulse width of 30 mn) of Lambda is rectangular of 10 mm×30 mm (half width in beam profile). A form of laser light emitted from YAG laser is cylindrical or circle in rod form. A form of laser light emitted from slab type laser is rectangular. By forming laser light by using an optical system, laser light in desired size can be generated.

Figure 18B:
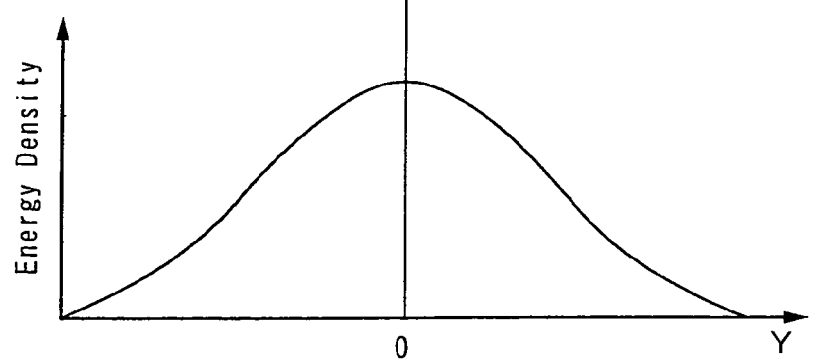

FIG. 18B shows a distribution of energy densities of laser light in a major-axis L direction of the laser beam shown in FIG. 18A. The laser beam shown in FIG. 18A corresponds to an area satisfying an energy density of equal to $1/e^2$ of a peak value of the energy density in FIG. 18B. In the distribution, the energy densities of laser light having an oval laser beam becomes higher toward the center O of the oval. The laser beam shown in FIG. 18A has an energy density in the center axis direction following the Gaussian distribution. An area possibly having a uniform energy density is small.

Figure 18C:
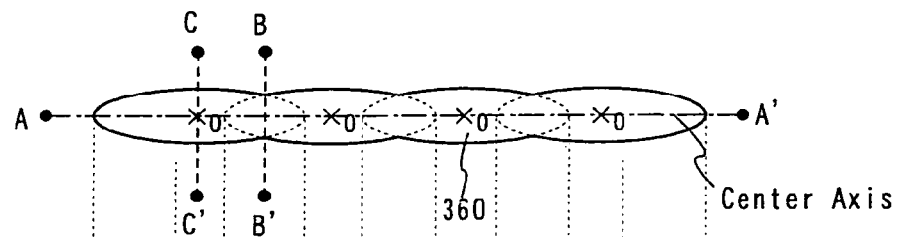

Next, FIG. 18C shows a laser beam form resulting from combining laser light having the laser beam shown in FIG. 18A. FIG. 18C shows a case where four laser light laser beams are overlapped to form one linear laser beam. The number of laser beams to be overlapped is not limited thereto.

As shown in FIG. 18C, all laser light laser beams have the same major axis of the ovals. The laser beams are overlapped and are combined partially with each other. As a result, one laser beam 360 is formed. A straight line obtained by connecting the centers O of all of the ovals is a center axis of the laser beam 360.

Figure 18D:
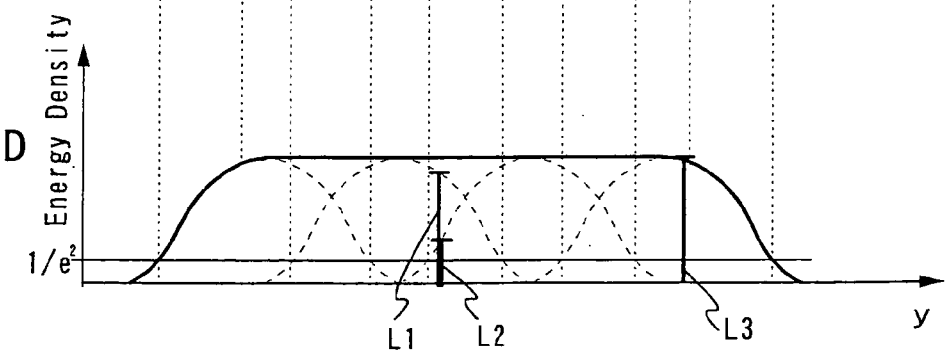

FIG. 18D shows a distribution of energy densities of the combined laser beam of laser light shown in FIG. 18C in a center axis y direction. The laser beam shown in FIG. 18C corresponds to an area satisfying an energy density equal to $1/e^2$ of a peak value of the energy density in FIG. 18B. In a part all of the laser beams before combined, energy densities are added. For example, when energy densities L1 and L2 of the overlapped beams as shown are added, the result is substantially equal to a peak value L3 of the beam energy density. Then, energy densities are leveled among the centers of the ovals.

Ideally, the result of the addition of L1 and L2 is equal to L3. However, in reality, they are not always equal. An acceptable range of a difference between a value. obtained by adding L1 and L2 and L3 can be set by a designer properly.

When a laser beam is used independently; the energy density distribution follows the Gaussian distribution. Therefore, laser light having uniform energy densities is difficult to irradiate to an entire part, which is a semiconductor film or an island in contact with a flat part of an insulating film. However, as shown in FIG. 18D, multiple laser light beams are overlapped so as to compensate each other for parts having lower energy densities. Thus, the area having uniform energy density becomes larger than the area obtained by using laser light beams independently. Therefore, the crystallinity of the semiconductor film can be improved efficiently.

Figure 19A:
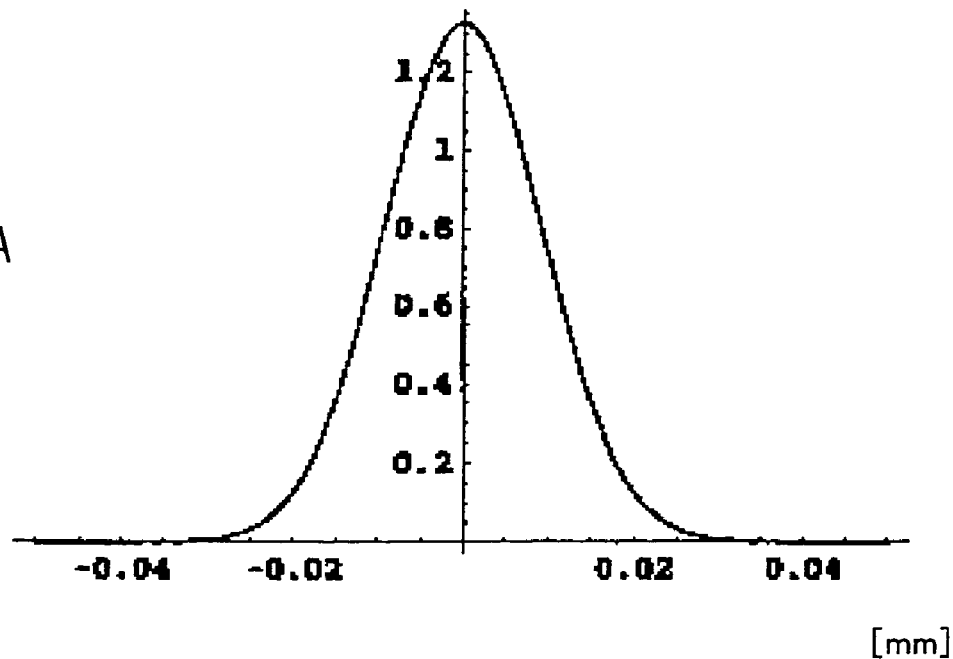
FIGS. 19A and 19B show distributions of energy densities of laser beams.
Figure 19B:
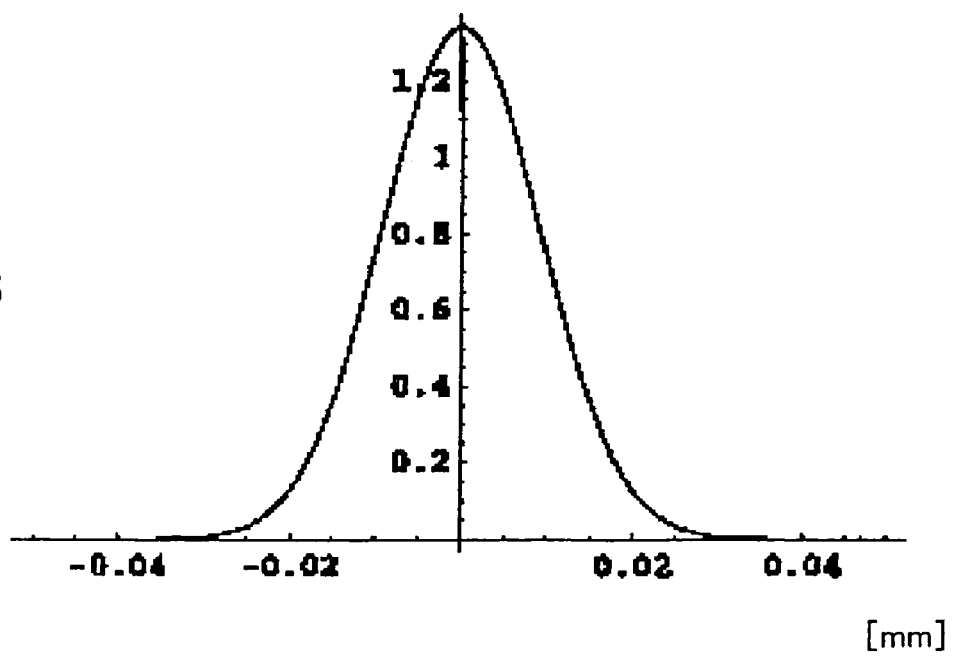

FIGS. 19A and 19B show calculated distributions of energy densities taken at dotted lines B-B' and C-C' in FIG. 18C. In FIGS. 19A and 19B, the reference is an area satisfying an energy density of a laser beam before combined at $1/e^2$ of the peak value. In the laser beam before combined, a length in the minor axis direction is 37 μm and a length in the major axis direction is 410 μm. A distance between centers is 192 μM. In this case, the energy densities at B-B' and C-C' have distributions as shown in FIGS. 19A and 19B, respectively. Though the distribution at B-B' is slightly smaller than the distribution at C-C', they can be regarded as the same size. Therefore, the form of the combined laser beam can be regarded as being linear in an area satisfying the energy density equal to $1/e^2$ of the peak value of the laser beam before combined.

Figure 20:
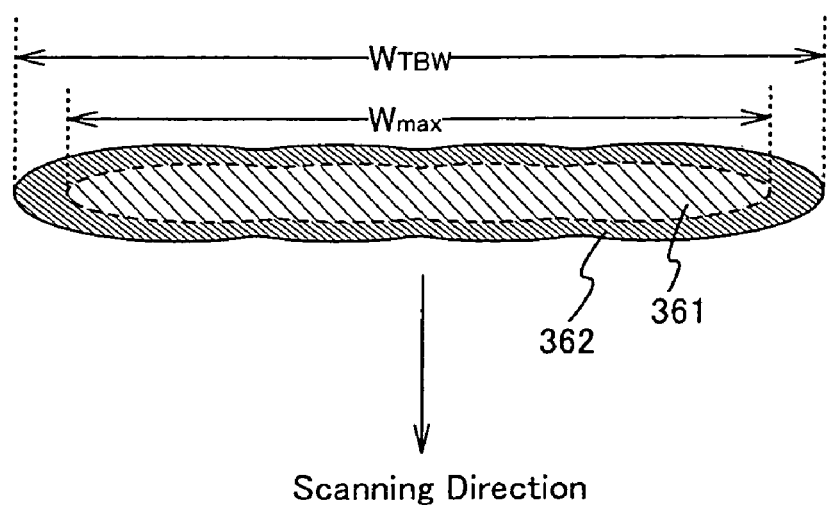
FIG. 20 shows a distribution of energy densities of a laser beam.

FIG. 20 is a diagram showing an energy distribution of a combined laser beam. An area 361 has a uniform energy density. An area 362 has a lower energy density. In FIG. 20, a length in a center axis direction of a laser beam is $W_{TBW}$ while a length in the center axis direction in the area 361 having the uniform energy density is $W_{max}$. As the length $W_{TBW}$ is longer than the length $W_{max}$, the percentage of the area 362 having the energy density which is not uniform and cannot be used for semiconductor crystallization, becomes larger to the area 361 having uniform energy density, which can be used for the crystallization. When only the area 362 whose energy density is not uniform is irradiated, micro crystal is generated. Then, the crystallinity of the semiconductor film is not high. Accordingly, scanning paths and depressions and projections of the insulating film must be arranged so as to prevent the island area of the semiconductor film and only the area 362 from overlapping. Then, as the percentage of the area 362 to the area 361 is larger, the limitation becomes larger. Using a slit can prevent only the area 362 whose energy density is not uniform from being irradiated to a semiconductor film formed on a depression of the insulating film. Then, the limitations on arrangement of scanning paths and depressions and projections of the insulating film can be effectively reduced.

This example can be implemented in combination with the first to eleventh examples.

Thirteenth Example

In this example, an optical system of a laser irradiation apparatus used in the present invention and a positional relationship between each optical system and a slit will be described.

Figure 21:
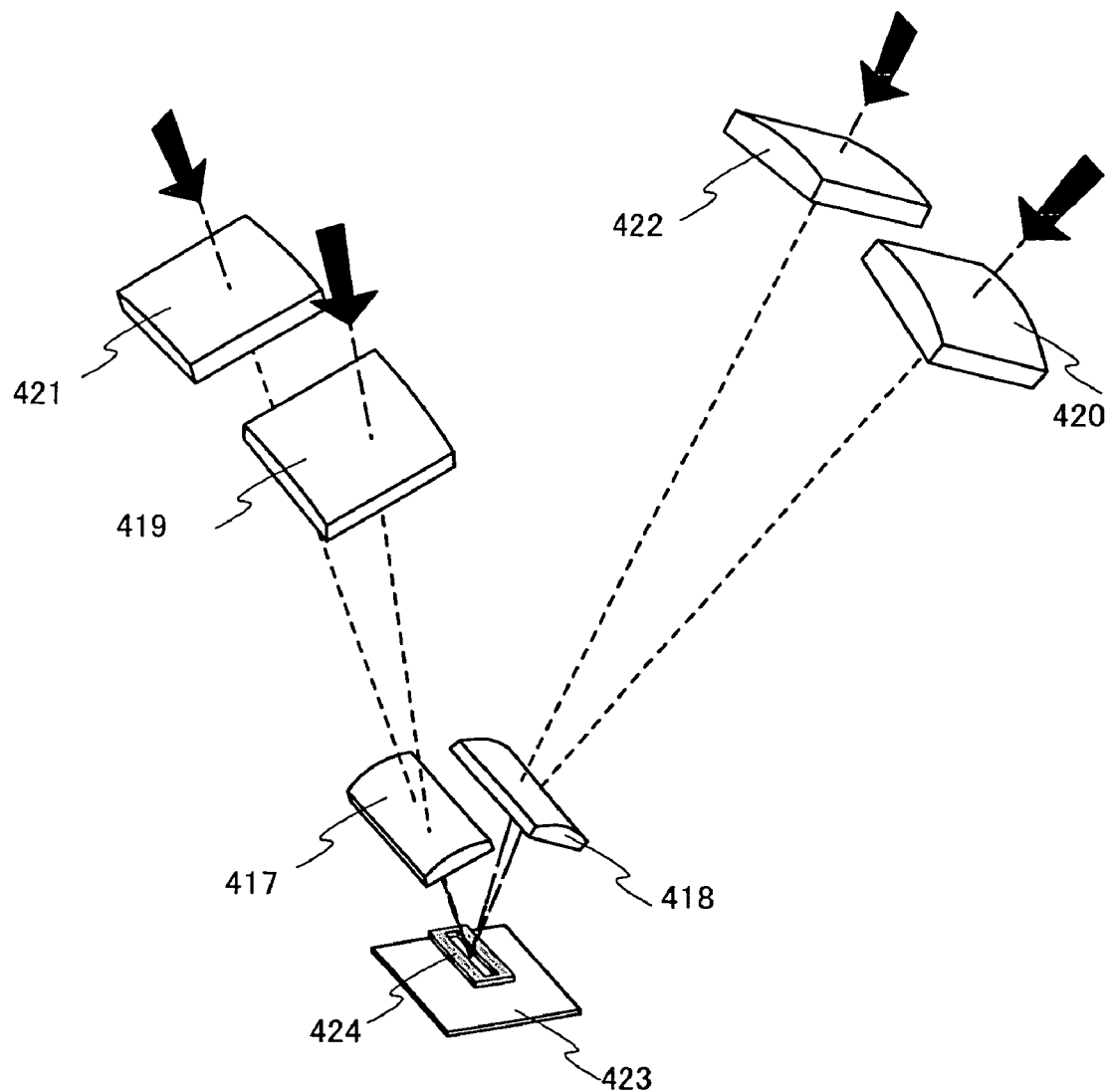
FIG. 21 shows an optical system.

FIG. 21 shows an optical system used when four laser beams are combined to one laser beam. The optical system shown in FIG. 21 has six cylindrical lenses 417 to 422. Four laser light beams emitted from directions indicated by arrows enter to four cylindrical lenses 419 to 422. Forms of two laser light beams formed by the cylindrical lenses 419 and 421 are shaped by the cylindrical lens 417 again. Then, the laser light beams are irradiated to an object 423 through a slit 424. On the other hand, the two laser light beams shaped by the cylindrical lenses 420 and 422 are shaped by the cylindrical lens 418 again. Then, the laser light beams are irradiated to the object 423 through the slit 424.

The laser light laser beams on the object 423 are overlapped and are combined partially with each other to form one laser beam.

The focus distance and incident angle of each lens can be set by a designer properly. The focus distance of the cylindrical lenses 417 and 418 closest to the object 423 is designed to be smaller than the focus distance of the cylindrical lenses 419 to 422. For example, the focus distance of the cylindrical lenses 417 and 418 closest to the object 423 is 20 mm. The focus distance of he cylindrical lenses 419 to 422 is 150 mm. In this example, each of the lenses are set such that the incident angle of laser light from the cylindrical lenses 417 and 418 to the object 400 can be 25° and the incident angle of laser light from the cylindrical lenses 419 to 422 to the cylindrical lenses 417 and 418 can be 10°. In order to prevent return light and to perform uniform irradiation, the incident angle of the laser light to the substrate is maintained larger than 0° and desirably 5 to 30°.

FIG. 21 shows an example for combining four laser beams. In this case, four cylindrical lenses corresponding to four laser oscillating devices, respectively, and two cylindrical lenses corresponding to the four cylindrical lenses are provided. However, the number of laser beams to be combined is not limited thereto. Two to eight laser beams may be combined. If n laser beams are combined (where n=2, 4, 6 or 8), n cylindrical lenses corresponding to n laser oscillating devices, respectively, and n/2 cylindrical lenses corresponding to the n cylindrical lenses are provided. If n laser beams are combined (where n=3, 5 or 7), n cylindrical lenses corresponding to n laser oscillating devices, respectively, and (n+1)/2 cylindrical lenses corresponding to the n cylindrical lenses are provided.

If five or more laser beams are overlapped, the fifth and subsequent laser light beam are desirably irradiated from the opposite side of the substrate in view of a place where the optical system is placed, the interference and so on. In this case, the slit must be provided also in the opposite side of the substrate. The substrate must have transmittance.

In order to prevent return light from returning by tracing the original light path, the incident angle to the substrate is desirably maintained larger than 0° and smaller than 90°.

In order to irradiate uniform laser light, the incident plane must be perpendicular to the irradiated surface and include a short side or a long side of a rectangular, which is formed by each beam before combined. Then, an incident angle θ of the laser light desirably satisfies $\theta \geq \arctan(W/2d)$ where W is a length of the short side or the long side included in the incident plane and d is a thickness of a substrate which is placed on the irradiated surface and is translucent to the light laser light. The equation must be satisfied for each laser light before combined. When the laser light path is not on the incident plane, the incident angle of path projected onto the incident plane is the incident angle θ. If laser light is entered at the incident angle θ, the light reflected by the substrate surface and the light reflected from the back surface of the substrate do not interfere. Therefore, uniform laser light can be irradiated. In this discussion, the refractive index of the substrate is 1. In reality, most substrates have the refractive index of around 1.5. In consideration of the value, a larger calculated value can be obtained than an angle calculated according to this discussion. However, energy at both longitudinal ends of a beam spot is attenuated. Therefore, the interference does not affect on this part very much, and the sufficient effect of interference attenuation can be obtained with the calculated value.

The optical system having the laser irradiating apparatus used in the present invention is not limited to the construction described in this example.

This example can be implemented in combination with first to twelfth examples.

Fourteenth Example

Laser light having an oval-shaped laser beam has an energy density distribution following the Gaussian distribution in a direction perpendicular to the scanning direction. Therefore, the percentage of the low energy density area in the total area is higher than that of the laser light having a rectangular or linear laser beam. Thus, in the present invention, the rectangular or linear laser beam of the laser light is desirable which has a more uniform energy density distribution.

Excimer laser and slab laser are typical gas laser and solid laser, respectively, which can obtain a rectangular or linear laser beam. In this example, the slab laser will be described.

Figure 22A:
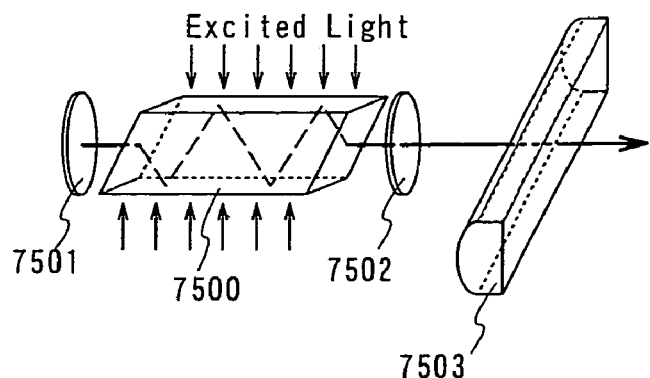
FIGS. 22A to 22C show optical systems.

FIG. 22A shows an example of a construction of a slab type laser oscillating device. The slab type laser oscillating device shown in FIG. 22A has a rod 7500, a reflection mirror 7501, an output mirror 7502, and a cylindrical lens 7503.

When excited light is irradiated to the rod 7500, the excited light traces a zigzag optical path within the rod 7500. Then, laser light is emitted to the reflection mirror 7501 or output mirror 7502 side. The laser light emitted to the reflection mirror 7501 side is reflected and enters into the rod 7500 again. Then, the laser light is emitted to the output mirror 7502 side. The rod 7500 is of slab type using a plate-shaped slab medium. By using the slab type rod 7500, a longer or linear laser beam can be formed when emitted. The emitted laser light is processed in the cylindrical lens 7503 such that the form of the laser beam can be narrower Then, the laser beam is emitted from the laser oscillating device.

Figure 22B:
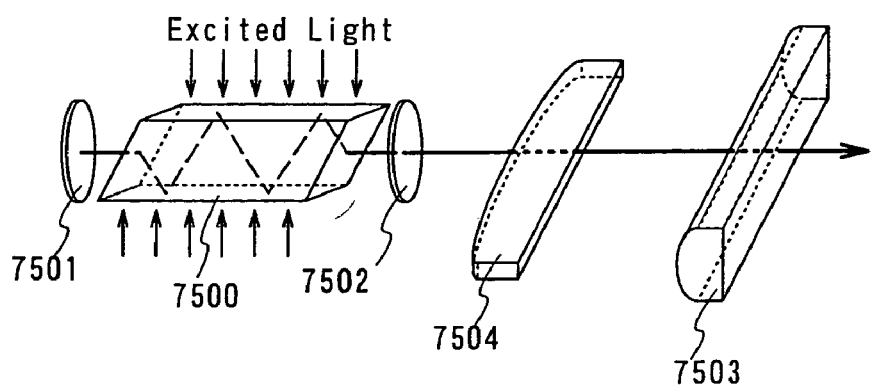

FIG. 22B shows another construction of the slab type laser oscillating device, which is different from the one shown in FIG. 22A. The construction in FIG. 22B is different from the one in FIG. 22A in that a cylindrical lens 7504 is added to the laser oscillating device. A length of laser beams can be controlled by using the cylindrical lens 7504.

The laser beam can become narrower when a coherent length is 10 cm or more and preferably 1 m or more.

In order to prevent an excessive -increase in temperature of the rod 7500, a device for controlling a temperature may be provided for circulating cooling water, for example.

Figure 22C:
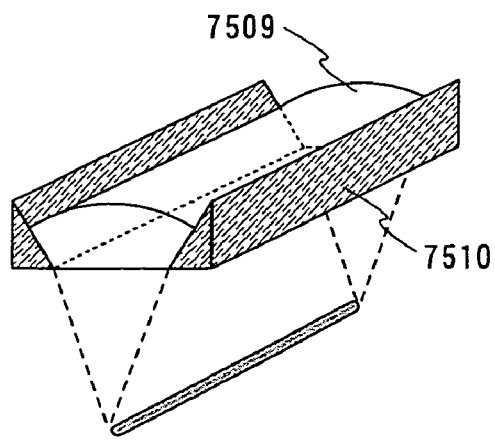

FIG. 22C shows an example of a form of a cylindrical lens. A cylindrical lens 7509 in this example is fixed by a holder 7510. The cylindrical lens 7509 has a cylinder surface and a rectangle plane, which are facing against each other. Two buses of the cylinder surface and two sides of the facing rectangle are all parallel with each other. Two planes formed by the two buses of the cylinder surface and the parallel two sides, respectively, cross with the plane of the rectangle at an angle larger than 0° and smaller than 90°. When the two planes formed by the two parallel sides, respectively, cross with the plane of the rectangle at an angle smaller than 90°, a shorter focus distance can be obtained than that obtained by crossing at an angle of 90° or more. Then, the form of laser beams becomes narrower and can be closer to linear laser beams.

This example can be implemented in combination with the first to thirteenth examples.

Fifteenth Example

In this example, a relationship between a distance between centers of laser beams and an energy density when laser beams are overlapped.

Figure 23:
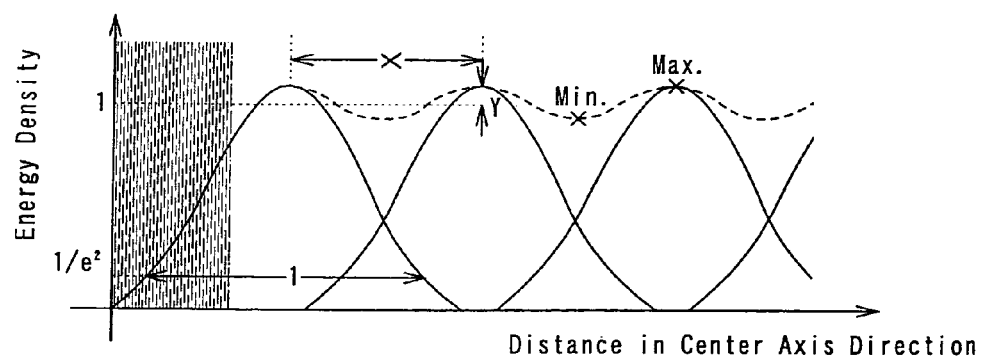
FIG. 23 shows a distribution of energy densities in a direction of a center axis of superimposed laser beams.

In FIG. 23, distributions of energy densities in the center axis direction of laser beams and distributions of energy densities of combined laser beams are indicated by solid lines and dotted lines, respectively. Values of energy densities in the center axis direction of laser beams generally follow the Gaussian distribution.

Figure 24:
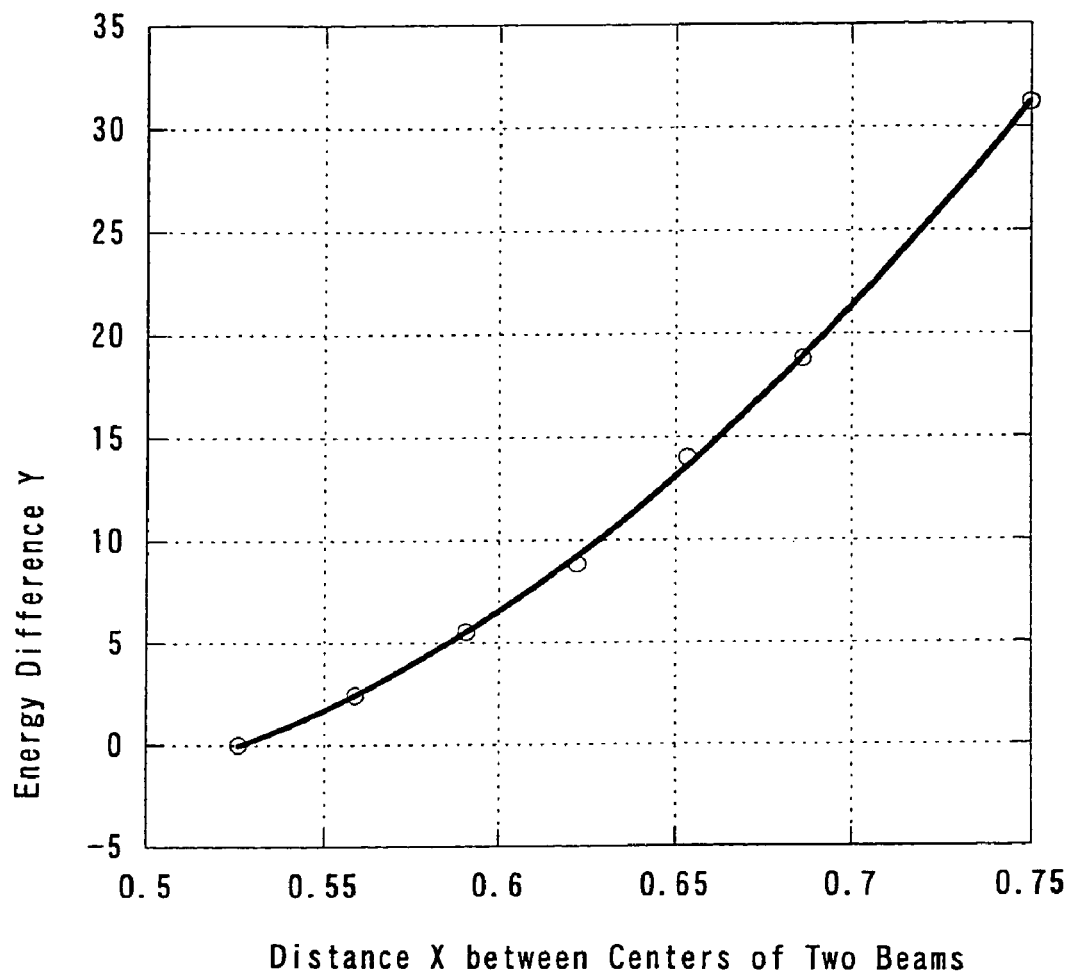
FIG. 24 shows a relationship between a distance and energy differences between centers of laser beams.

When a distance in the center axis direction satisfying an energy density equal to or more than $1/e^2$ of a peak value in a laser beam before combined is 1, a distance between peaks is X. In a combined laser beam, an increased amount between a peak value after combined and an average of valley values is Y. A relationship between X and Y obtained by simulation is shown in FIG. 24. Y is expressed in percentage in FIG. 24.

In FIG. 24, the energy difference Y is expressed in an approximate expression of the following Equation 1:

$$Y=60-293X+340X^2 \quad [\text{Eq. 1}]$$

(where X is a larger one of two solutions)

According to Equation 1, when an energy difference needs to be about 5%, for example, X is about 0.584. Ideally, Y=0, which is difficult to achieve in reality. Thus, a designer must set an acceptable range of the energy difference Y appropriately. Though Y=0 is ideal, the length of a beam spot becomes shorter. Therefore, X may be determined in view of the balance with the throughput.

Figure 25:
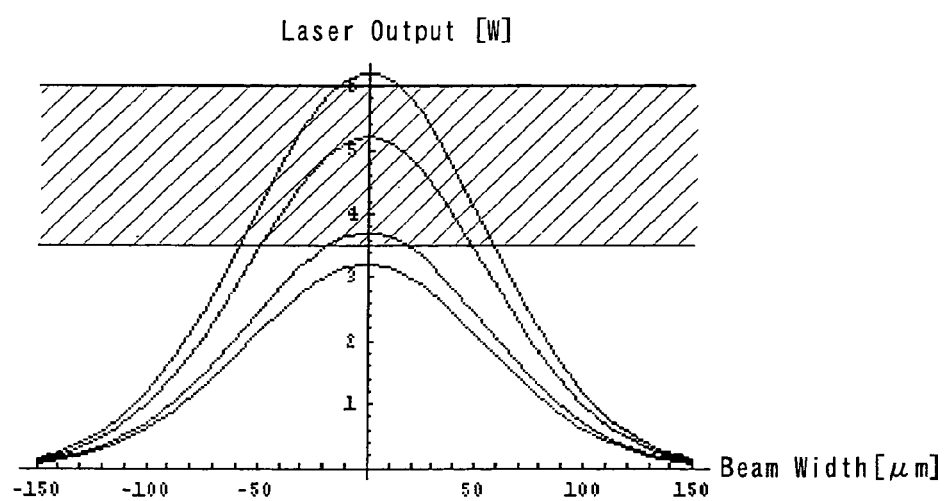
FIG. 25 shows distributions of output energy in a direction of center axes of laser beams.

Next, the acceptable range of Y will be described. FIG. 25 shows distributions of outputs (W) of $YVO_4$ laser to beam width in the center axis direction when the laser beam is oval. A shaded area is a range of output energy required for obtaining good crystallinity. The combined laser light output energy only needs to be in the range of 3.5 to 6 W.

When a maximum value and a minimum value of output energy of a combined beam spot barely falls in the output energy range required for obtaining good crystallinity, the energy difference Y for obtaining good crystallinity is maximum. Therefore, in FIG. 25, the energy difference Y is ±26.3%. The energy difference Y only needs to fall in the range for obtaining good crystallinity.

The range of output energy for obtaining good crystallinity depends on the acceptable good crystallinity range. The distribution of output energy also depends on laser beam form. Thus, the acceptable range of the energy difference Y is not always limited to the values. The designer must define a range of output energy required for good crystallinity appropriately. Then, the acceptable range of the energy difference Y must be defined based on the distribution of output energy of used laser.

This example can be implemented in combination with the first to fourteenth examples.

Sixteenth Example

A multi-channel TFT of the semiconductor device according to the present invention can have smaller variations in S-value, mobility, threshold value and so on than those of a single-channel TFT and a multi-channel TFT formed by using crystallized semiconductor film.

Figure 45A:
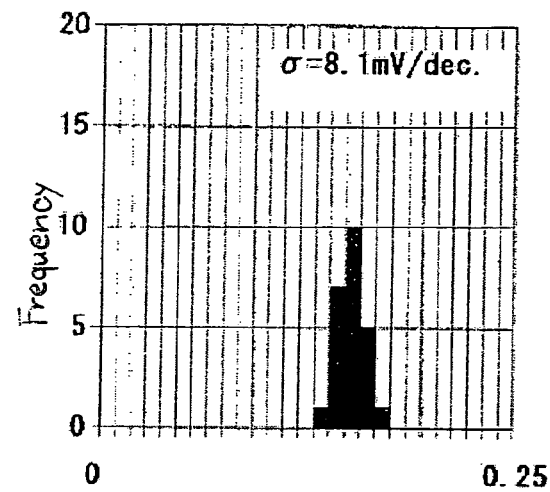
FIGS. 45A to 45C show S-value frequency distributions.

FIG. 45A shows a frequency distribution of S-values of the n-type multi-channel TFT according to the present invention. The multi-channel TFT according to the present invention has a semiconductor film crystallized by laser light irradiation on an insulating film having depressions and projections. Widths of each of the projections and depressions of the insulating film are 1.25 μM and 1.50 μm, respectively. A channel length of the TFT is 8 μm, and the total channel width is 12 μm.

Figure 45B:
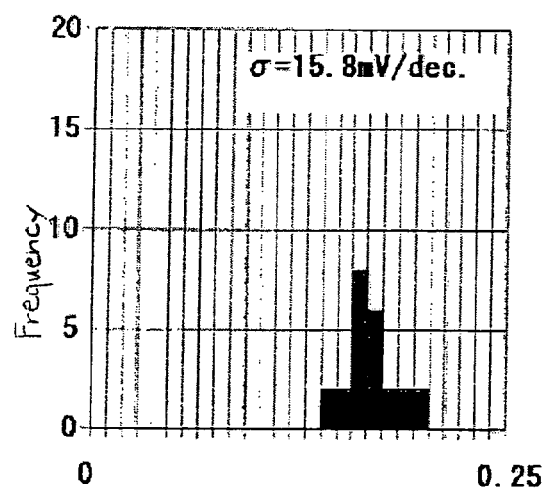
Figure 45C:
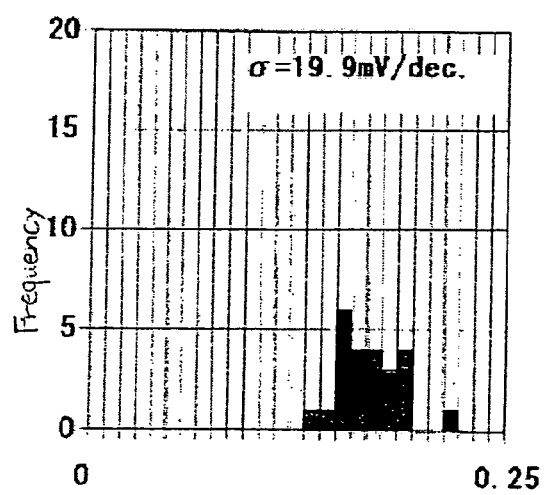

For comparison, FIG. 45B shows a frequency distribution of S-values of an n-type single channel TFT crystallized on a flat insulating film. Both channel length and channel width of the TFT are 8 μm. FIG. 45C shows a frequency distribution of S-values of an n-type multi-channel TFT crystallized on a flat insulating film. In the TFT, a channel length is 8 μm. The total channel width is 12 μm. A width of each channel is 2 μm. A space between channels is 2 μm.

The standard deviation is σ=15.8 mV/dec. in FIG. 45B, and the standard deviation is σ=19.9 mV/dec. in FIG. 45C. On the other hand, the standard deviation in FIG. 45A is σ=8.1 mV/dec., which is smaller than the other two values. Therefore, the n-type multi-channel TFT according to the present invention shown in FIG. 45A has the smaller variation in S-values.

The channel width of the TFT in FIG. 45B is shorter than the total channel width of the TFT in FIG. 45A. In the TFT in FIG. 45C, the width of each channel and the space between channels are longer than those in the TFT in FIG. 45A. However, even in consideration of these conditions, the standard deviation in FIG. 45A may be significantly smaller than those in FIGS. 45B and 45C. Therefore, the n-channel type TFT according to the present invention can have smaller S-values.

Figure 46A:
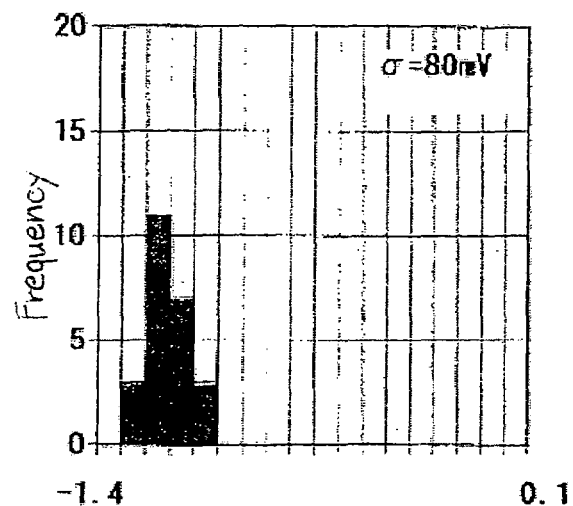
FIGS. 46A to 46C show threshold value frequency distributions.
Figure 46B:
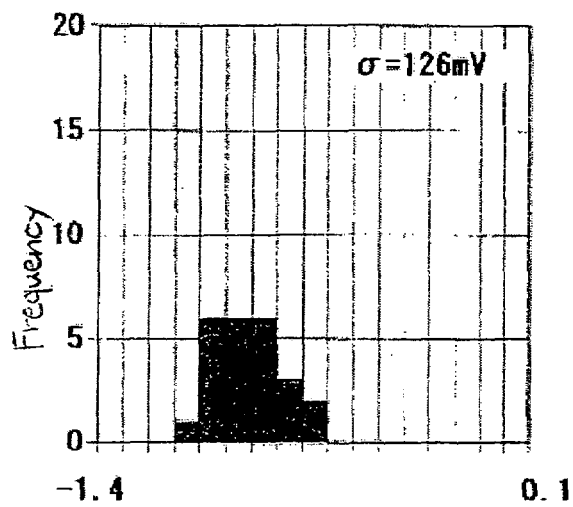
Figure 46C:
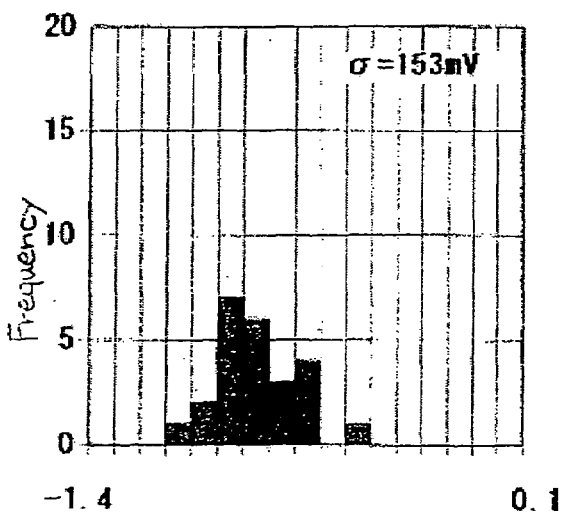

Next, FIG. 46A shows a frequency distribution of threshold values of the n-type multi-channel TFT according to the present invention. The construction of the "TFT" in FIG. 46A is the same as that in FIG. 45A. For comparison, FIG. 46B shows a frequency distribution of threshold values of an n-type single channel TFT crystallized on a flat insulating film. The construction of the "TFT" in FIG. 46B is the same as that in FIG. 45B. FIG. 46C shows a frequency distribution of threshold values of an n-type multi-channel IFT crystallized on a flat insulating film. The construction of the TFT in FIG. 46C is the same as that in FIG. 45B.

The standard deviation is $\sigma=126$ mV/dec. in FIG. 46B, and the standard deviation is $\sigma=153$ mV/dec. in FIG. 46C. On the other hand, the standard deviation in FIG. 46A is $\sigma=80$ mV/dec., which is smaller than the other two values. Therefore, the n-type multi-channel TFT according to the present invention shown in FIG. 46A has the smaller variation in threshold values.

The channel width of the TFT in FIG. 46B is shorter than the total channel width of the TFT in FIG. 46A. In the TFT in FIG. 46C, the width of each channel and the space between channels are longer than those in the TFT in FIG. 46A. However, even in consideration of these conditions, the standard deviation in FIG. 46A may be significantly smaller than those in FIGS. 46B and 46C. Therefore, the n-channel type TFT according to the present invention can have smaller threshold values.

Figure 47A:
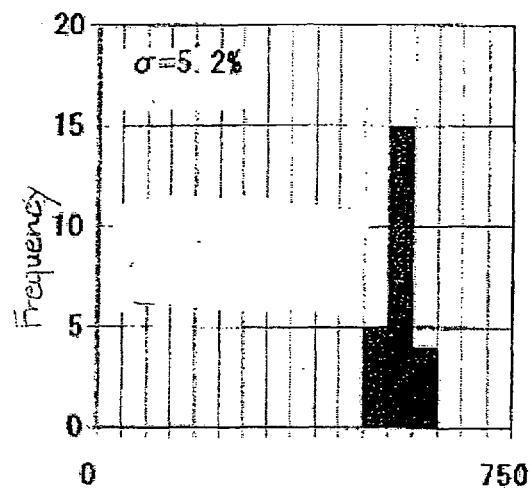
FIGS. 47A to 47C show mobility frequency distributions.
Figure 47B:
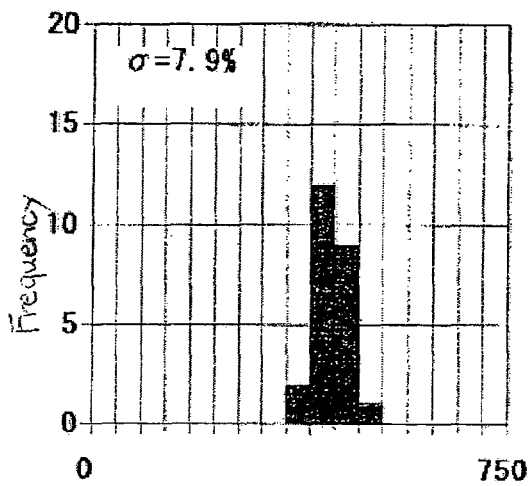
Figure 47C:
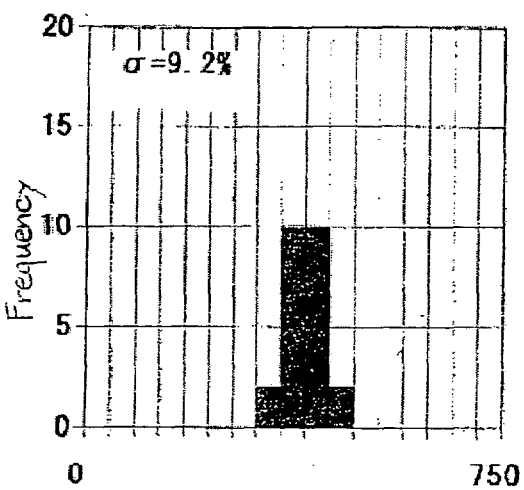

Next, FIG. 47A shows a frequency distribution of mobility of the n-type multi-channel TFT according to the present invention. The construction of the TFT in FIG. 47A is the same as that in FIG. 45A. For comparison, FIG. 47B shows a frequency distribution of mobility of an n-type single channel TFT crystallized on a flat insulating film. The construction of the TFT in FIG. 47B is the same as that in FIG. 45B. FIG. 47C shows a frequency distribution of mobility of an n-type multi-channel TFT crystallized on a flat insulating film. The construction of the TFT in FIG. 47C is the same as that in FIG. 45B.

The standard deviation is $\sigma=7.9\%$ in FIG. 47B, and the standard deviation is $\sigma=9.2\%$ in FIG. 47C. On the other hand, the standard deviation in FIG. 47A is $\sigma=5.2\%$, which is smaller than the other two values. Therefore, the n-type multi-channel TFT according to the present invention shown in FIG. 47A has the smaller variation in mobility. In FIG. 47A, the mobility is calculated by using a design value of the channel width. Therefore, the actual mobility may be lower by about 20%.

The channel width of the TFT in FIG. 47B is shorter than the total channel width of the TFT in FIG. 47A. In the TFT in FIG. 47C, the width of each channel and the space between channels are longer than those in the TFT in FIG. 47A. However, even in consideration of these conditions, the standard deviation in FIG. 47A may be significantly smaller than those in FIGS. 47B and 47C. Therefore, the n-channel type TFT according to the present invention can have smaller mobility.

Figure 48A:
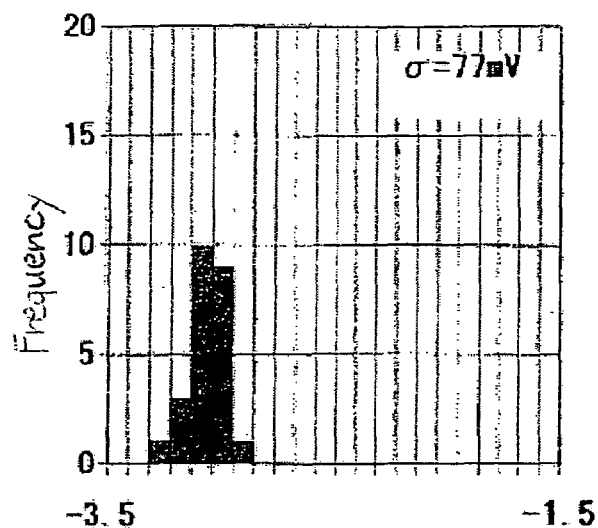
FIGS. 48A to 48C show threshold values frequency distributions.
Figure 48B:
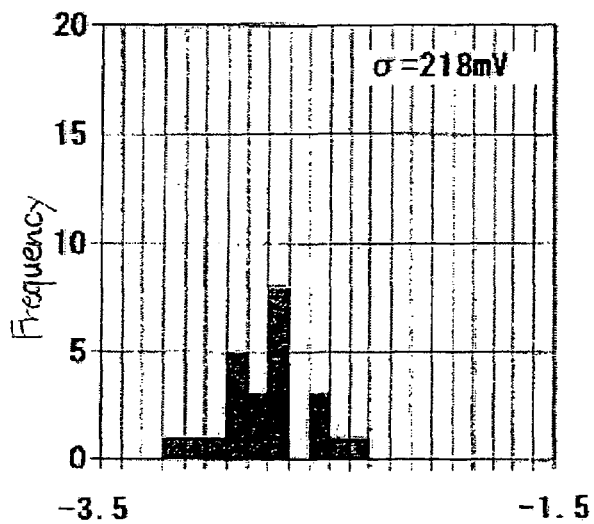
Figure 48C:
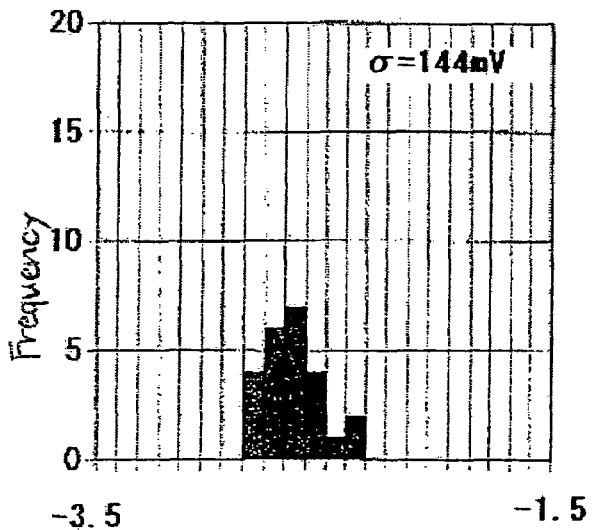

Next, FIG. 48A shows a frequency distribution of threshold values of the p-type multi-channel TFT according to the present invention. The construction of the TFT in FIG. 48A is the same as that in FIG. 45A. For comparison, FIG. 48B shows a frequency distribution of threshold values of a p-type single channel TFT crystallized. on a flat insulating film. The construction of the TFT in FIG. 48B is the same as that in FIG. 45B except that the polarities are different. FIG. 48C shows a frequency distribution of threshold values of a p-type multi-channel TFT crystallized on a flat insulating film. The construction of the TFT in FIG. 48C is the same as that in FIG. 45B except that the polarities are different.

The standard deviation is $\sigma=218$ mV in FIG. 48B, and the standard deviation is $\sigma=144$ mV in FIG. 48C. On the other hand, the standard deviation in FIG. 48A is $\sigma=77$ mV, which is smaller than the other two values. Therefore, the p-type multi-channel TFT according to the present invention shown in FIG. 48A has the smaller variation in threshold values.

The channel width of the TFT in FIG. 48B is shorter than the total channel width of the TFT in FIG. 48A. In the TFT in FIG. 48C, the width of each channel and the space between channels are longer than those in the TFT in FIG. 48A. However, even in consideration of these conditions, the standard deviation in FIG. 48A may be significantly smaller than those in FIGS. 48B and 48C. Therefore, the p-channel type TFT according to the present invention can have smaller threshold values.

Figure 49A:
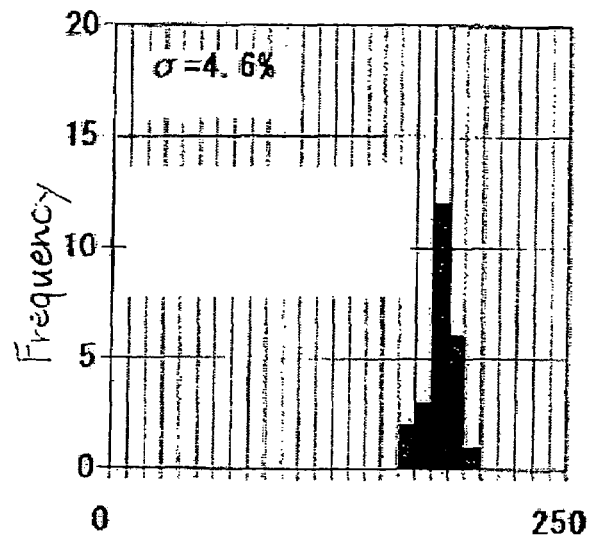
FIGS. 49A to 49C show mobility frequency distributions.
Figure 49B:
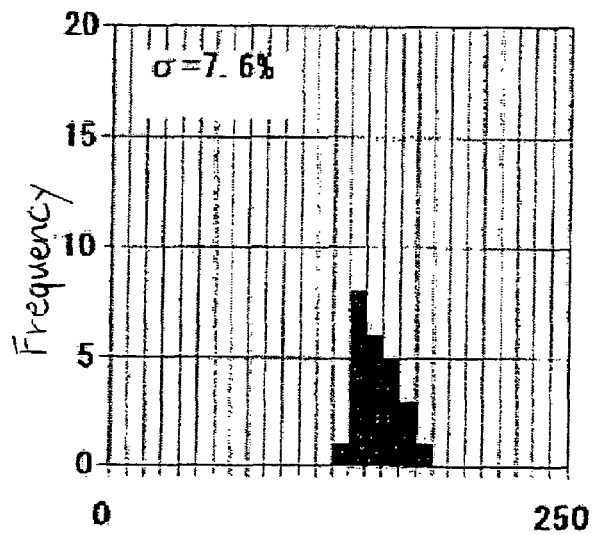
Figure 49C:
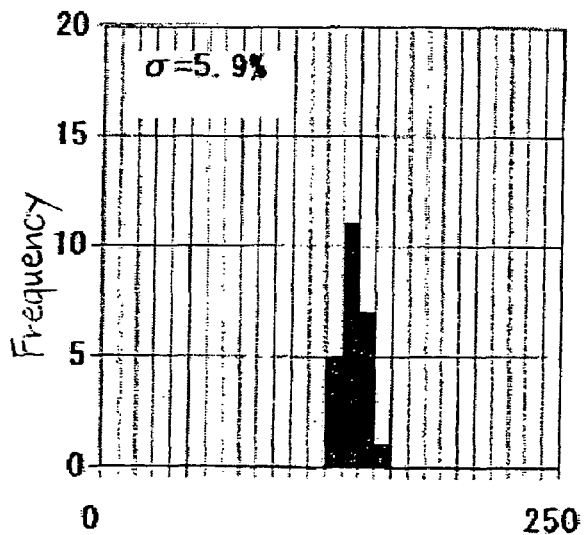

Next, FIG. 49A shows a frequency distribution of mobility of the p-type multi-channel TFT according to the present invention. The construction of the TFT in FIG. 49A is the same as that in FIG. 45A except that the polarities are different. For comparison, FIG. 49B shows a frequency distribution of mobility of a p-type single channel TFT crystallized on a flat insulating film. The construction of the TFT in FIG. 49B is the same as that in FIG. 45B except that the polarities are different. FIG. 49C shows a frequency distribution of mobility of a p-type multi-channel TFT crystallized on a flat insulating film. The construction of the TFT in FIG. 49C is the same as that in FIG. 45B except that the polarities are different.

The standard deviation is $\sigma=7.6\%$ in FIG. 49B, and the standard deviation is $\sigma=5.9\%$ in FIG. 49C. On the other hand, the standard deviation in FIG. 49A is $\sigma=4.6\%$, which is smaller than the other two values. Therefore, the p-type multi-channel TFT according to the present invention shown in FIG. 49A has the smaller variation in. mobility. In FIG. 49A, the mobility is calculated by using a design value of the channel width. Therefore, the actual mobility may be lower by about 20%.

The channel width of the TFT in FIG. 49B is shorter than the total channel width of the TFT in FIG. 49A. In the TFT in FIG. 49C, the width of each channel and the space between channels are longer than those in the TFT in FIG. 49A. However, even in consideration of these conditions, the standard deviation in FIG. 49A may be significantly smaller than those in FIGS. 49B and 49C. Therefore, the p-channel type TFT according to the present invention can have smaller mobility.

As shown in FIG. 45A to 49C, the multi-channel TFT according to the present invention can suppress the variations in characteristics. The crystal orientation of each channel can rotate more easily than those in a single-channel TFT and a multi-channel TFT crystallized on a flat insulating film. Therefore, various crystal orientations are included. Thus, the variations in characteristics due to the crystal orientations may be easily leveled off.

Seventeenth Example

In this example, a construction of the present invention will be described for forming an insulating film on a rectangular or strip-shaped gate electrode so as to provide depressions and projections on the surface of the insulating film.

Figure 50A:
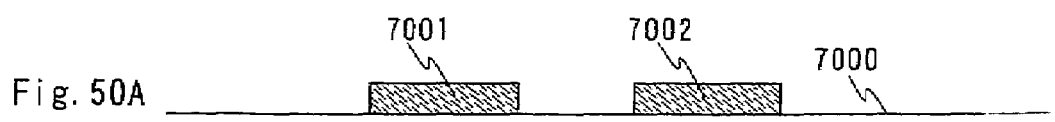
FIGS. 50A to 50G show steps of producing a semiconductor device according to the present invention.

First of all, as shown in FIG. 50A, a conductive film is formed and then is patterned on a substrate 7000. Thus, first rectangular gate electrodes 7001 and 7002 are formed. The thickness of the first gate electrodes 7001 and 7002 is desirably about 40 to 150 nm. The first gate electrodes 7001 and 7002 have a stripe form.

Next, a first gate insulating film 7003 is formed on the substrate 7000 so as to cover the first gate electrodes 7001 and 7002. The thickness of the first gate insulating film 7003 is desirably about 40 to 150 nm. The surface of the first gate insulating film 7003 has depressions and projections due to the existence of the rectangular first gate electrodes 7001 and 7002. The width of each of the projections is desirably 1 to 10 μm, and the width of each of the depressions is desirably 0.5 to 10 μm. The first gate electrodes 7001 and 7002 are placed such that they can fall in the ranges.

Figure 50B:
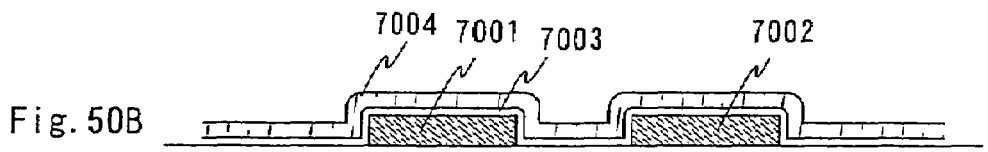

Next, a semiconductor film 7004 is formed on the first gate insulating film 7003 (FIG. 50B). The thickness of the semiconductor film 7004 is desirably about 60 to 200 nm.

Figure 50C:
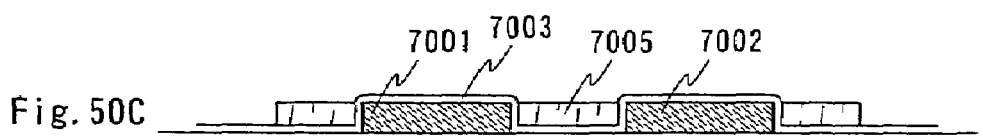

Next, by irradiating laser light to the semiconductor film 7004, a polycrystalline semiconductor film having improved crystallinity is formed as shown in FIG. 50C. The polycrystalline semiconductor film is melted by the irradiation of laser light and volume-moves into the depression of the first gate insulating film 7003. Then, the projection of the first gate insulating film 7003 is exposed. The polycrystalline semiconductor film is patterned to form an island-shape semiconductor film 7005 (FIG. 50C).

Figure 50D:
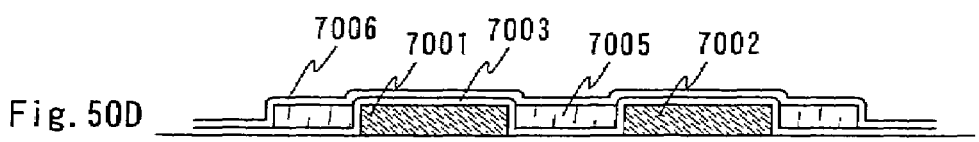

Next, a second gate insulating film 7006 is formed such that it can cover the island-shaped semiconductor film 7005 (FIG. 50D). The first gate insulating film 7003 and the second gate insulating film 7006 are etched partially to form a contact hole. Then, the first gate electrodes 7001 and 7002 are exposed partially.

Next, a conductive film is formed and is patterned such that the conductive form can cover the exposed parts of the first gate electrodes 7001 and 7002 and the second gate insulating film 7006. As a result, a second gate electrode 7007 is formed which is connected to the first gate electrodes 7001 and 7002 in the contact hole.

Then, an impurity giving conductivity is doped to the island-shaped semiconductor film 7005 such that a channel forming region can be formed at a part where the semiconductor film 7005 and the second gate electrode 7007 overlap with each other through the second gate insulating film 7006. In this example, a mask of resist is formed thereon for doping several times. Thus, a first impurity region 7008 functioning as a source/drain region and a second impurity region 7009 functioning as an LDD region are formed (FIG. 50E).

Figure 50E:
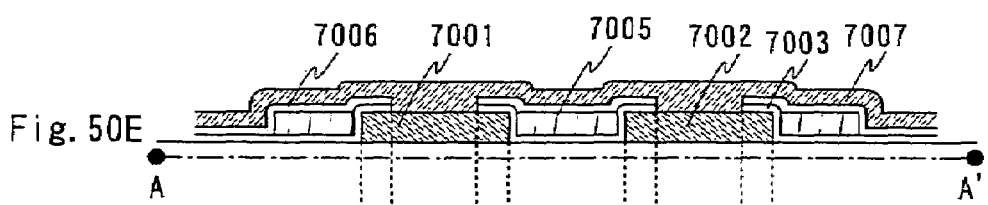
Figure 50F:
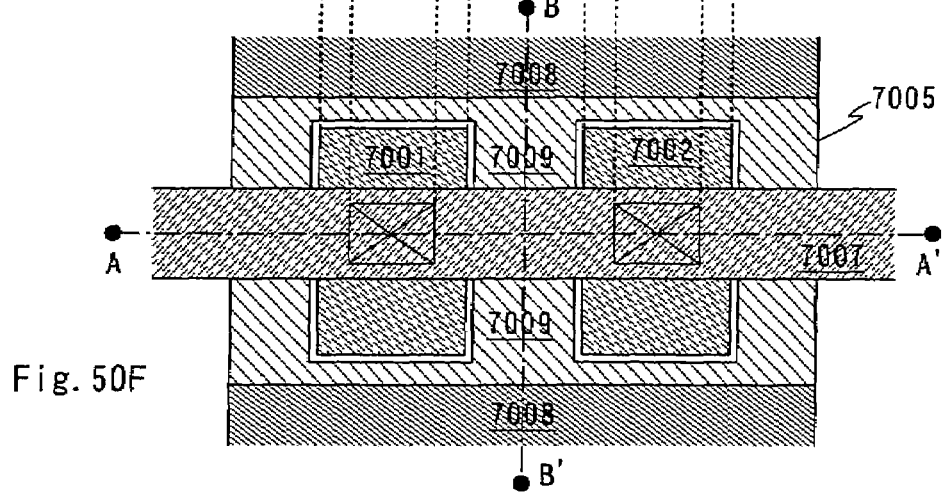
Figure 50G:
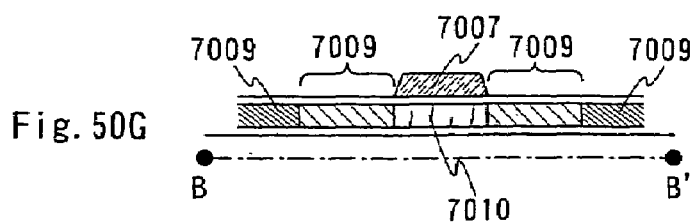

FIG. 50F is a top view of the TFT in the state shown in FIG. 50E. FIG. 50E is a section diagram taken at a line A-A' in FIG. 50F. FIG. 50G is a section diagram taken at a line B-B' in FIG. 50E A region 7010 shown in FIG. 50G corresponds to a channel forming region. The channel forming region 7010 overlaps with the first gate electrodes 7001 and 7002 through the first gate insulating film 7003. The channel forming region 7010 overlaps with the second gate electrode 7007 through the second gate insulating film 7006.

The TFT having the construction described in this example has channels not only near the top surface of the channel forming region 7010 but also near both side surfaces. Therefore, ON-current can be increased.

In FIG. 50C, the projection of the first gate insulating film 7003 is exposed. However, depending on the thickness of the formed semiconductor film 7004, the island-shaped semiconductor film 7005 may cover the projection of the first gate insulating film 7003. In this case, additionally, the surface of the island-shaped semiconductor film 7005 is etched. Then, the projection of the first gate insulating film 7003 is exposed.

What is claimed is:

1. A semiconductor device comprising:
    a primary insulating film having a depression formed over a substrate; and
    a crystalline semiconductor film having source and drain regions and a channel forming region between the source and drain regions,
    wherein the channel forming region is formed on a bottom of the depression of the primary insulating film, and
    wherein a direction from the source region to the drain region extends along opposed edges of the depression.

2. A semiconductor device according to claim 1, wherein the semiconductor device is incorporated into an electronic apparatus selected from the group consisting of a mobile information terminal, a video camera, a digital camera, a personal computer, a television receiver, a mobile telephone and a projecting type display apparatus.

3. A semiconductor device comprising:
    an insulating film comprising at least one of silicon nitride, silicon nitride oxide, silicon oxide and silicon oxide nitride and having a depression; and
    a crystalline semiconductor film having source and drain regions and a channel forming region between the source and drain regions,
    wherein the channel forming region is formed on a bottom of the depression of the insulating film, and
    wherein a direction from the source region to the drain region extends along opposed edges of the depression.

4. A semiconductor device according to claim 3, wherein the semiconductor device is incorporated into an electronic apparatus selected from the group consisting of a mobile information terminal, a video camera, a digital camera, a personal computer, a television receiver, a mobile telephone and a projecting type display apparatus.

5. A semiconductor device comprising:
    a thin film transistor in which a plurality of channel forming regions are provided in parallel between source and drain regions in a crystalline semiconductor film,
    wherein the plurality of channel forming regions are formed on a bottom of each of a plurality of depressions of a primary insulating film, respectively,
    wherein a direction from the source region to the drain region extends along opposed edges of the depressions, and
    wherein the source and drain regions are formed in a crystalline semiconductor film formed continuously with the crystalline semiconductor film.

6. A semiconductor device according to claim 1, wherein the primary insulating film has a grade change having a first insulating film of silicon oxide or silicon oxide nitride and a second insulating film of silicon nitride or silicon nitride oxide formed on the first insulating film.

7. A semiconductor device according to claim 5, wherein the primary insulating film has a grade change having a first insulating film of silicon oxide or silicon oxide nitride and a second insulating film of silicon nitride or silicon nitride oxide formed on the first insulating film.

8. A semiconductor device according to claim 5, wherein the semiconductor device is incorporated into an electronic apparatus selected from the group consisting of a mobile information terminal, a video camera, a digital camera, a personal computer, a television receiver, a mobile telephone and a projecting type display apparatus.

9. A semiconductor device comprising:
a thin film transistor in which a plurality of channel forming regions are provided in parallel between source and drain regions in a crystalline semiconductor film,
wherein the plurality of channel forming regions are formed on a bottom of each of a plurality of depressions of a primary insulating film, respectively,
wherein a direction from the source region to the drain region extends along opposed edges of the depressions, and
wherein the source and drain regions are formed in a crystalline semiconductor film formed continuously with the crystalline semiconductor film and extending from the bottom of the depression to a top of a projection.

10. A semiconductor device according to claim 3, wherein the insulating film has a grade change having a first insulating film of silicon oxide or silicon oxide nitride and a second insulating film of silicon nitride or silicon nitride oxide formed on the first insulating film.

11. A semiconductor device according to claim 9, wherein the primary insulating film has a grade change having a first insulating film of silicon oxide or silicon oxide nitride and a second insulating film of silicon nitride or silicon nitride oxide formed on the first insulating film.

12. A semiconductor device according to claim 9, wherein the semiconductor device is incorporated into an electronic apparatus selected from the group consisting of a mobile information terminal, a video camera, a digital camera, a personal computer, a television receiver, a mobile telephone and a projecting type display apparatus.

13. A semiconductor device comprising:
a thin film transistor in which a plurality of channel forming regions are provided in parallel between source and drain regions in a crystalline semiconductor film,
wherein the plurality of channel forming regions are formed on a bottom of each of a plurality of noncyclic depressions of a primary insulating film, respectively,
wherein a direction from the source region to the drain region extends along opposed edges of the depression, and
wherein the source and drain regions are formed in a crystalline semiconductor film formed continuously with the crystalline semiconductor film and extending from the bottom of the depression to a top of a projection.

14. A semiconductor device according to claim 13, wherein the primary insulating film has a grade change having a first insulating film of silicon oxide or silicon oxide nitride and a second insulating film of silicon nitride or silicon nitride oxide formed on the first insulating film.

15. A semiconductor device according to claim 13, wherein the primary insulating film has a grade change having a first insulating film of silicon oxide or silicon oxide nitride and a second insulating film of silicon nitride or silicon nitride oxide formed on the first insulating film.

16. A semiconductor device according to claim 13, wherein the semiconductor device is incorporated into an electronic apparatus selected from the group consisting of a mobile information terminal, a video camera, a digital camera, a personal computer, a television receiver, a mobile telephone and a projecting type display apparatus.

17. A semiconductor device comprising:
a plurality of first gate electrodes;
a first gate insulating film covering the plurality of first gate electrodes and having depressions and projections on the surface
a crystalline semiconductor film having a channel forming region of each of the depressions of the first gate insulating film;
a second gate insulating film formed on the crystalline semiconductor film and being in contact with the projections of the first gate insulating film; and
a second gate electrode formed on the second gate insulating film and being in contact with the plurality of first gate electrodes through contact holes in the first and second gate insulating films,
wherein the channel forming region is provided adjacent to any two of the plurality of first gate electrodes with the first gate insulating film interposed therebetween and overlaps with the second gate electrode through the second gate insulating film.

18. A semiconductor device according to claim 17, wherein the semiconductor device is incorporated into an electronic apparatus selected from the group consisting of a mobile information terminal, a video camera, a digital camera, a personal computer, a television receiver, a mobile telephone and a projecting type display apparatus.

19. A semiconductor device comprising:
a primary insulating film over a substrate; and
a thin film transistor having a crystalline semiconductor film over the primary insulating film,
wherein a channel forming region between source and drain regions in the crystalline semiconductor film is formed on a bottom of a depression of the primary insulating film, and
wherein a direction from the source region to the drain region extends along opposed edges of the depression.

20. A semiconductor device according to claim 19, wherein the semiconductor device is incorporated into an electronic apparatus selected from the group consisting of a mobile information terminal, a video camera, a digital camera, a personal computer, a television receiver, a mobile telephone and a projecting type display apparatus.

21. A semiconductor device comprising;
a primary insulating film over a substrate;
two second insulating films over the primary insulating film to form a depression; and,
a crystalline semiconductor film comprising source and drain regions and a channel forming region between the source and drain regions;
wherein the channel forming region is formed on the primary insulating film, and exists between the two second insulating films so that a direction from the source region to the drain region extends along opposed edges of the depression.

22. A semiconductor device comprising:
a primary insulating film having a depression formed over a substrate; and
a crystalline semiconductor film having source and drain regions and a channel forming region between the source and drain regions,
wherein the channel forming region is formed on a bottom of the depression of the primary insulating film,
wherein the channel forming region has a channel width direction and a channel length direction,
wherein the depression has a depression width direction and a depression length direction, and
wherein the channel length direction is generally perpendicular to the depression length direction.

23. A semiconductor device according to claim 22, wherein the semiconductor device is incorporated into an electronic apparatus selected from the group consisting of a mobile information terminal, a video camera, a digital camera, a personal computer, a television receiver, a mobile telephone and a projecting type display apparatus.

* * * * *